(12) United States Patent
Burchard et al.

(10) Patent No.: US 12,232,428 B2
(45) Date of Patent: Feb. 18, 2025

(54) GRAPHITE SUPERCONDUCTOR AND USE THEREOF

(71) Applicant: Bernd Burchard, Essen (DE)

(72) Inventors: Bernd Burchard, Essen (DE); Pablo D. Esquinazi, Leipzig (DE); Jan Meijer, Bochum (DE)

(73) Assignee: Bernd Burchard, Essen (DE)

( * ) Notice: Subject to any disclaimer, the term of this patent is extended or adjusted under 35 U.S.C. 154(b) by 885 days.

(21) Appl. No.: 16/500,815

(22) PCT Filed: Apr. 6, 2018

(86) PCT No.: PCT/EP2018/058899
§ 371 (c)(1),
(2) Date: Oct. 4, 2019

(87) PCT Pub. No.: WO2018/185306
PCT Pub. Date: Oct. 11, 2018

(65) Prior Publication Data
US 2020/0075832 A1 Mar. 5, 2020

(30) Foreign Application Priority Data

Apr. 7, 2017 (DE) .................... 10 2017 004 103.2
Apr. 7, 2017 (DE) .................... 10 2017 107 597.6
(Continued)

(51) Int. Cl.
*H10N 60/00* (2023.01)
*C01B 32/205* (2017.01)
(Continued)

(52) U.S. Cl.
CPC .......... *H10N 60/99* (2023.02); *C01B 32/205* (2017.08); *H10N 60/01* (2023.02); *H10N 60/10* (2023.02);
(Continued)

(58) Field of Classification Search
None
See application file for complete search history.

(56) References Cited

U.S. PATENT DOCUMENTS 4,966,817 A * 10/1990 Labes .................... D01F 11/12
257/E39.007
5,554,462 A * 9/1996 Flandrois ............... C01B 32/21
429/223
(Continued)

OTHER PUBLICATIONS

Precker et al., "Identification of a possible superconducting transition above room temperature in natural graphite crystals", Leibniz Institute of Surface Modification, Physical Department, 2016, 14 pages. (Year: 2016).*

(Continued)

*Primary Examiner* — Scott B Geyer
(74) *Attorney, Agent, or Firm* — Michael J. McCandlish; Mindful IP PLLC

(57) ABSTRACT

A device includes a substrate including a first layer and a second layer. The first and second layers are positioned adjacent to each other and comprise a common boundary region extending from the first layer to the second layer. The first layer comprises graphite with a Bernal-crystal structure. The second layer comprises graphite with a rhombohedral crystal structure. The boundary region includes a border region having superconducting properties, namely; at a current density of 0 Ampere/m² and a magnetic flux density of 0 Tesla exhibiting a critical temperature ($T_c$) which is higher than −195° C., and/or at a temperature below the critical temperature ($T_c$) and a current density of 0 Ampere/m², exhibiting a critical magnetic flux density ($B_k$) that is higher than 1 Tesla. The border region is coupled to an electric and/or a magnetic and/or an electromagnetic signal with a frequency greater than or equal to 0 Hertz.

17 Claims, 41 Drawing Sheets

(30) Foreign Application Priority Data

| | | |
|---|---|---|
| Apr. 24, 2017 | (DE) | 10 2017 004 141.5 |
| May 7, 2017 | (DE) | 10 2017 109 759.7 |
| May 28, 2017 | (DE) | 10 2017 111 577.3 |
| Dec. 10, 2017 | (DE) | 10 2017 129 364.7 |
| Dec. 10, 2017 | (DE) | 10 2017 129 365.5 |

(51) Int. Cl.
  *H10N 60/01* (2023.01)
  *H10N 60/10* (2023.01)
  *H10N 60/83* (2023.01)
  *H10N 60/85* (2023.01)
  *C01B 32/20* (2017.01)

(52) U.S. Cl.
  CPC .............. *H10N 60/83* (2023.02); *H10N 60/85* (2023.02); *C01B 32/20* (2017.08); *C01P 2002/30* (2013.01)

(56) References Cited

U.S. PATENT DOCUMENTS

| | | | | |
|---|---|---|---|---|
| 2012/0035057 | A1* | 2/2012 | Bratkovski | H10N 60/99 505/235 |
| 2015/0080223 | A1* | 3/2015 | Miyazaki | H01L 29/7781 257/29 |
| 2018/0308780 | A1* | 10/2018 | Tong | H01L 23/3733 |

OTHER PUBLICATIONS

Kopnin et al., "High-temperature surface superconductivity in rhombohedral graphite", Physical Review B 87, 140503(R), 2013, 4 pages. (Year: 2013).*

Esquinazi et al., "On the Superconductivity of Graphite Interfaces", JETP Letters, 2014, vol. 100, No. 5, pp. 336-339. (Year: 2014).*

Esquinazi et al., "Evidence for room temperature superconductivity at graphite interfaces—Room temperature superconductivity", Quantum Stud., Math. Found. (2018) 5: pp. 41-53. (Year: 2018).*

Precker et al., "Identification of a possible superconducting transition above room temperature in natural graphite crystals", New J. Phys. 18 113041, 2016, 19 pages. (Year: 2016).*

Scheike et al., "Granular superconductivity at room temperature in bulk highly oriented pyrolytic graphite samples", Carbon 59, 2013, pp. 140-149. (Year: 2013).*

Scheike et al., "Can Doping Graphite Trigger Room Temperature Superconductivity? Evidence for Granular High-Temperature Superconductivity in Water-Treated Graphite Powder", Adv. Mater. 2012, 24, pp. 5826-5831. (Year: 2012).*

Koshino et al. "Multilayer graphenes with mixed stacking structure: Interplay of Bernal and rhombohedral stacking", Physical Review B 87, 045420 (2013), 12 pages. (Year: 2013).*

Zhang et al. "Molecular adsorption induces the transformation of rhombohedral- to Bernal-stacking order in trilayer graphene", Nature Communications 4:2074 (2013), 8 pages. (Year: 2013).*

Xu et al. "A pathway between Bernal and rhombohedral stacked graphene layers with scanning tunneling microscopy", Applied Physics Letters 100, 201601 (2012), 5 pages. (Year: 2012).*

Aoki et al. "Dependence of band structures on stacking and field in layered graphene", Solid State Communications 142 (2007), 7 pages. (Year: 2007).*

Taut et al. "Electronic structure of stacking faults in rhombohedral graphite", Physical Review B 90, 085312 (2014), 8 pages. (Year: 2014).*

Pierucci et al. "Evidence for Flat Bands near the Fermi Level in Epitaxial Rhombohedral Multilayer Graphene", ACS Nano, vol. 9 No. 5 (2015), 8 pages. (Year: 2015).*

Garcia et al. "Evidence for semiconducting behavior with a narrow band gap of Bernal graphite", New Journal of Physics 14 (2012), 15 pages. (Year: 2012).*

* cited by examiner

GRAPHITE SUPERCONDUCTOR AND USE THEREOF

The present patent application claims the priorities of German patent applications DE 10 2017 004 103.2 of 7 of Apr. 2017, DE 10 2017 107 597.6 of 7 of Apr. 2017, DE 10 2017 004 141.5 of 24 of Apr. 2017, DE 10 2017 109 759.7 of 7 of May 2017, DE 10 2017 111 577.3 of 28 of May 2017, DE 10 2017 129 365.5 of 10 of Dec. 2017 and DE 10 2017 129 364.7 of 10 of Dec. 2017 to complete, their contents by reference into the present patent application.

STATE OF THE ART

Methods for graphite production have long been known from the patent literature. Let us mention here, for example, US-A-836 355, CA-A-764 889, CA-A-702 962 CA-A-238 795, CA-A-717 458, CA-A-632 113. From the DE-A-3602330 and CN-B-102 800 382 the production of graphite fibers is known. The use of graphite for electrical components has been known for a long time. It should be reminded here of Edison's light bulb.

From U.S. Pat. No. 8,964,491 a graphene-based memory cell is known. In this case, a graphene layer stack is exposed to different electrical conditions. From this document it is also known that different graphene stacks (see FIG. 3 of U.S. Pat. No. 8,964,491 and corresponding description in the U.S. Pat. No. 8,964,491) can have substantially different band gaps.

From the prior art graphene is known as a two-dimensional planar array of carbon atoms. A graphene layer is therefore a two-dimensional crystal of carbon atoms. In state of the art graphene is the term for a form of carbon with a two-dimensional structure in which each carbon atom is surrounded by three other atoms at an angle of 120°, so that a honeycomb-shaped pattern is formed. Since carbon is tetravalent, two double bonds per "honeycomb" must occur, but they are not localized. It is a concatenation of benzene rings, as often occurs in aromatic compounds. Graphene can be described as a polycyclic aromatic hydrocarbon. At the "edge" of the honeycomb lattice other atomic groups must be docked, that depending on their sizes barely change the properties of graphene. However, infinitely extended and everywhere flat strictly two-dimensional structures are based on a rigorous mathematical theorem, the Mermin-Wagner theorem and its variants, not possible as they are proven to be thermodynamically unstable.

From document U.S. Pat. No. 8,247,060, a non-superconducting graphite-based structure for shieling purposes is known. The technical teaching disclosed in U.S. Pat. No. 8,247,060 uses the diamagnetism of graphene planes to shield applied magnetic fields.

From the prior art it is known that diamagnetism is one of the manifestations of magnetism in matter. In an external magnetic field diamagnetic materials develop an induced magnetic field in a direction which is opposite to the external magnetic field. Diamagnetic materials have a tendency to migrate out of an inhomogeneous magnetic field. Without an external magnetic field diamagnetic materials do not have a magnetic field, they are not magnetic. The proportionality factor of the field attenuation is determined by the relative permeability $\mu_r$ (or the magnetic susceptibility $\chi=\mu_r-1$) and for diamagnets the proportionality factor of the field attenuation is less than 1.

In physics, all materials with negative magnetic susceptibility and without magnetic order are classified to be diamagnetic. The most diamagnetic elements under normal conditions are bismuth and carbon.

According to the U.S. Pat. No. 8,247,060 B2 by structuring into small partial surfaces a superconductor-similar behavior can be obtained at higher temperatures than at the time of application was known for superconductors from U.S. Pat. No. 8,247,060. It is said, for example, in column 1, line 65 to column 2 line 1 of U.S. Pat. No. 8,247,060: "The metamaterial structures disclosed herein are capable of operating at higher T than a metamaterial based on a superconductor" This translates as: "disclosed herein metamaterial structures are able to operate at higher T than a metamaterial based on a superconductor." In column 3, line 32 to 34 of U.S. Pat. No. 8,247,060 it is said: "The approximation, $X(\theta)\sim\cos 2\theta$, also can be used for the fit (similarly to superconductor-based metamaterials)." This means: "The approximation, $x(\theta) \cos 2\theta$, can also be used for the approximation (similar superconductor based metamaterials)." The effect used for the shielding effect in document U.S. Pat. No. 8,247,060 is thus the Landau diamagnetism of graphite (See also: Y. Kopelevich et al, J.; Ferromagnetic- and Superconducting-Like Behavior of Graphite; Low Temp Phys. 119, 691 (2000), P. et al Esquinazi, Ferromagnetism in oriented graphite samples. Phys Rev. B 66, 024429 (2002), MP Sharma et al, diamagnetism of Graphite Phys Rev. B 9., 2467 (1974), M. Koshino et al and Magnetic field screening and mirroring in graphene; Phys. Rev. Lett 102 177203 (2009)). The U.S. Pat. No. 8,247,060, discloses in column 3, lines 63 to 66 of U.S. Pat. No. 8,247,060 B2 for example, that the effect based on graphite diamagnetism described in the U.S. Pat. No. 8,247, 060 occurs in a Bernal crystal structure of the graphite.

From various publications components with cryogenic superconducting structures are known. As one of countless examples US-A-2015/0 080 223 may be mentioned here. As superconductivity at low temperature a critical temperature $T_c$ of less than 0° C. shall be understood. Therefore, these devices need to be cooled at room-temperature (20° C. typ.).

For example, from T A Coombs, et al., "Superconducting Micro-Bearings" IEEE Transactions on Applied Superconductivity, Vol. 15, No. 2, June 2005 it is known, that the stator of a micromotor may be made of superconducting material. It is obvious to a skilled person that the rotor can be made of superconducting material. The application to the positioning of satellites is known from N. Shams, "Motion Equations and Model of high Temperature Superconductor (HTS) Momentum Wheel proposed for altitude control of Micro/Nano Satellites", 3rd International Conference on Recent Advances in Space Technologies, 2007. RAST '07., 14-16 Jun. 2007 for example. A superconducting actuator is disclosed in Y. K. Kim et al., "Fabrication and Testing of A Micro Superconducting Actuator using the Meissner Effect" IEEE Proceedings on Micro Electro Mechanical Systems, An Investigation of Microstructures, Sensors, Actuators, Machines and Robots. 11-14 Feb. 1990, Napa Valley, CA, United States for example.

An electric motor with superconducting component parts is known from A. Gonzalez-Parada et al., "Application of HTS BSCCO tapes in at Ironless Axial Flux motor Superconductor" IEEE Transactions on Applied Superconductivity, Vol. 22, No. 3, June 2012.

All these documents of the prior art have in common that they do not specify a method for producing a component with a superconducting part device having a critical temperature above room temperature (typically 293 K). They do not specify such a method for device portions with a critical temperature above 200 K as well. Likewise, they do not disclose any devices with subcomponents, having a critical temperature above 200 K and 293 K. Thus, in prior art an occasionally strong cooling of the material or of the components is needed to be able to operate these devices in the superconducting region. This is not suitable for everyday use, nor economically practical.

Problem

The invention has the objective to provide a device having at least one, preferably at room temperature superconducting partial structure ($G_G$). In particular, a method for producing such a component and a suitable material for manufacturing the superconducting partial structure ($G_G$) shall be specified.

Invention

According to the invention this objective is achieved by a device according to claim 1 and/or a method according to claim 7 and/or a usage according to claim 11. Some embodiments of the invention are the subject of the dependent claims.

Basically the invention stipulates a graphite substrate having at least a boundary region having at least a superconducting border region to be used as a superconducting component of a device for electrical and/or optical and/or magnetic and/or electronic applications. The boundary region is defined as the transition of a first layer of the graphite substrate to a second layer, wherein these two layers are distinguished by the stacking sequences of graphene films or graphene layers. In the meaning of the invention two graphite substrate layers are different if they have different crystal structures or crystal structures with an offset to each other, which may be the same per layer or different per layer.

With such a constellation between the two layers, a boundary region establishes itself, within which there is at least a border region, which might have superconducting properties. Typically, graphite materials, that have such a constellation, must be selected from natural or artificial graphite, which will be described below. A border region is superconducting within the boundary area, if using an MFM (Magnetic Force Microscopy) it is demonstrated that a once inductively induced electric current remains constant over a long period (typically at least 1 day, preferably two or more weeks), such as described in Stiller, Markus; Esquinazi, P; Precker, Christian; Barzola-Quiquia, Jose; "Local magnetic measurements of permanent current paths in a natural graphite crystal" (2017) inter alia. Constant in this sense is a change in the current to less than 25% preferably less than 10%, more preferably less al. 5% with respect to the measurement of the current at the beginning. The method of detecting the permanence of a circuit current described in said publication is according to the invention a method, with which according to the invention the superconductor features in the invention conform graphite-based structure can be detected.

In the course of the present invention it was found, that said border region, that may be two-dimensional or three-dimensional as the boundary region, shows superconducting properties at a current density of 0 Ampere/m$^2$ and a magnetic flux density of 0 Tesla and at a critical temperature higher than −195° C., more preferably higher than −100° C., preferably higher than −50° C. and especially higher than about 85° C. (namely, 360 K). At higher current densities and higher magnetic flux densities a reduction of the critical temperature $T_c$ typically occurs. A critical temperature of 85° C. indicates that superconductivity is given below this temperature, so for example at 50° C., 40° C. as well as in, for example, 20° C. (ie, room temperature). Thus, components, devices, and the like, having the proposed material according to the invention, might be operated at room temperature conditions in the superconducting region. It is obvious to a skilled person that higher critical temperatures are associated with higher critical current density and higher critical magnetic flux densities.

Alternatively or additionally respectively, it has been found, that in the border region of the graphite material superconducting properties occur at a measurement temperature below the critical temperature, eg. 77 K, and a current density of 0 amps/m$^2$ below a critical magnetic flux density flowing through the border region with a magnetic flux density higher than 1 Tesla, preferably higher than 5 Tesla, advantageously higher than 10 Tesla, in particular higher than 20 Tesla, especially higher than 30 Tesla, most preferably higher than 40 Tesla, and more preferably higher than 50 tesla.

In the inventive device, an electric and/or magnetic and/or electromagnetic signal is coupled into the superconducting border region, which is coupled in at a frequency higher than 0 Hz or at a frequency of 0 Hertz. Therefore the signal can be a DC signal (DC) or an alternating (AC) signal or a superposition of such signals. The boundary region in which a superconducting border region is located, occurs in the transition region between a first layer of graphite with Bernal crystal structure (so-called graphite-2H) and a second layer of graphite having a rhombohedral crystal structure (so-called graphite-3R) for example. As an alternative, a superconducting border region can also be a "defect" within a graphite crystal structure. For example, such a border region may occur when one or more graphene layers or layers of an otherwise regular graphite crystal structure represented by the stacking order of the graphene layers of the graphite crystal are staggered, so that the regularity of the stacking sequence of the graphene layers of the graphite crystal is disturbed.

When the boundary region has several border regions, they might be understood as a granular superconductor. In case of a sufficiently small distance between the plurality of border regions, they might be coupled by Josephson fields. This may mean that superconductivity also exists at higher magnetic flux densities, but the coupling between the superconducting "grains", means the border regions, might be destroyed by a critical Josephson field. This modifies the critical flux density. The boundaries of the magnetic flux density defined above thus apply to a single border region.

In an expedient development of the invention it can be provided that the substrate has a plurality of first and/or plurality of second layers, so that the substrate may include a plurality of boundary regions within these limits, including one or more border regions having superconducting properties.

In a preferred embodiment, the first and the second graphite layer are parallel to each other. This is also true for the graphene layers of these layers. In the border region, the graphene layers also extend parallel. According to a development of the invention it is possible, that the graphene layers constituting the transition region or the border region are rotated, arranged against each other, and that their surface normals. Each graphene layer has a basis vector that defines the orientation of the one-dimensional crystal lattice of the graphene layer. With respect to this base vector adjacent graphene layers are rotated against each other.

Superconducting properties in the border region are present according to the meaning of the invention when at a current density of 0 Ampere/m² , or from substantially having 0 amps/m² and a magnetic flux density of 0 Tesla or substantially 0 Tesla the border region ($G_G$) has a critical temperature ($T_c$) higher than −195° C. and/or higher than −100° C. and/or higher than −50° C. and/or higher than 360 K, and/or at a temperature below the critical temperature (z. B. 77 K) and a current density of 0 Ampere/m² , or from substantially 0 Ampere/m² , the border region ($G_G$) has a critical magnetic flux density ($B_k$), which is higher than 1 T and/or T 5 and/or 10 T and/or 20 and T/30 or T and/or 40 and T/50 or T.

It is known, that the closer the temperature the superconducting material is exposed to the critical temperature of the material, the smaller are the values for the critical current density and the critical magnetic flux density. The first variant above defines superconducting properties of the material on the basis of the size of the critical temperature, which is given under the conditions of a current density close to 0 Ampere/m² or equal to 0 Ampere/m² and a magnetic flux density close to 0 Tesla or equal to 0 Tesla.

In the second variant, it is assumed, that the material is exposed to temperatures below the critical temperature, wherein at a current density close to 0 ampere/m² or equal to 0 ampere/m² of the critical magnetic flux density is in said range.

"Boundary region" in this context means, a two- or a three-dimensional transition between a first and a second graphite layer each with different crystal structures or having the same crystal structures, which, however, are arranged against each other having an offset. The boundary region according to the invention has thus only either a 2D extension, and so is an interface, or it has an extension in the direction of the layer sequence, that is in the Z-direction. Within the boundary area, a superconducting border region exists, which may be also two- or three-dimensional. A three-dimensional border region may be either a two-dimensional or a three-dimensional border region, whereas a two-dimensional boundary region comprises usually a two-dimensional border region.

The boundary region between the first and second layers may be two-dimensionally extending as far as it is the case with the two layers. The boundary region can be enclosed by the graphite of one of the two layers or by graphite with a different crystal structure. The same applies to the border region. This can lie completely within the boundary area, or may extend in a sub-region up to the edge of the boundary region. In particular, it is possible that the border region can be physically contacted by means of, for example, an ohmic contact. In so far the border region can have an "outer edge". The "outer edge" extends over at least a portion of the bounding edge of the border region.

In a further advantageous embodiment of the invention, the device may have an ohmic contact for contacting of the superconducting region. For an inductive coupling of a signal in the superconducting field it lends itself to use of a coil, while in case of a capacitive coupling an electrode is used. Optical elements might couple a signal electromagnetically into the superconducting border region.

In a further advantageous embodiment of the invention it can be provided that the device comprises at least one conductor with the superconducting border region, wherein in particular it can be additionally provided, that in the at least one conductor is at least inserted a phase-difference induced weakness (so-called Josephson-Junction).

A Josephson-Junction can also be realized in a further embodiment of the invention, in that way that the conductor having the superconducting border region is divided into a first conductor branch and a second conductor branch, between which is an opening area by area, wherein each conductor branch has a phase difference induced weakness.

By studying natural or artificial graphite it can be identified, in which zones graphite boundary regions with superconducting border regions exist. This may happen for example visually with reference to micrographs or contactless by other methods. A method according to the invention to manufacture a component for electrical and/or optical and/or magnetic and/or electronic applications comprises the following steps for example:

providing a first substrate ($G_{sub}$)
wherein the first substrate ($G_{sub}$) comprises at least two layers ($G_{B1}$, $G_{B2}$)
wherein the first layer ($G_{B1}$) and the second layer ($G_{B2}$) are disposed adjacent to one another and wherein the first layer ($G_{B1}$) and the second layer ($G_{B2}$) exhibit a common boundary region ($G_G$) extending from the first layer ($G_{B1}$) to the second layer ($G_{B2}$) and
wherein the first layer ($G_{B1}$) comprises graphite with Bernal-crystal structure (graphite 2H), and
wherein the second layer ($G_{B2}$) comprises graphite having a rhombohedral crystal structure (English rhombohedral, graphite 3R) and
wherein the boundary region ($G_{FB}$) has a border region ($G_G$)
wherein the border region ($G_G$) has superconducting properties
at a current density of 0 Ampere/m² and a magnetic flux density of 0 Tesla with a critical temperature ($T_c$) higher than −195° C. and/or higher than −100° C. and/or higher than −50° C. and/or higher than 360K, and/or
at a temperature of e.g. 77K and a current density of 0 amps/m² with a critical magnetic flux density ($B_k$), which is higher than 1 T and/or 5 T and/or 10 T and/or 20 T and/or 30 T and/or 40 T and/or 50 T, and
structuring the substrate ($G_{sub}$);
providing
an ohmic contact, which is connected electrically connected to the superconducting border region ($G_G$), and/or
a coil, which is inductively coupled with the superconducting border region ($G_G$) and/or
an electrode, which is capacitively coupled to the superconducting border region ($G_G$), and/or
an optical element, which is electro-magnetically coupled to the superconducting border region ($G_G$).

Alternative embodiments and advantageous further developments of such a process are
in that the structuring (8) of the substrate ($G_{sub}$) is carried out via wet chemical etching and/or ion or particle beam etching and/or focussed ion beam and/or plasma etching and/or electrochemical etching and/or shape cutting chipping technology and/or pressing and/or sintering and/or spark erosion and/or amorphization
That the substrate ($G_{sub}$) is provided by:
Investigation of natural or artificial graphite regarding the existence of a boundary region ($G_{FB}$) between a first layer ($G_{B1}$) with Bernal crystal structure (graphite-2H) and a second layer ($G_{B2}$) (rhombohedral crystal structure, graphite 3R);
Check if the boundary region ($G_{FB}$) has a superconducting border region ($G_G$);

Use a substrate ($G_{sub}$) with a boundary region ($G_{FB}$) having a superconducting border region ($G_G$) and/or That the check for superconductivity takes place by measuring the substrate ($G_{sub}$) with an MFM to locate a line current.

In the following, a general process for the preparation of an electrical or an optical or a magnetic or an electronic device according to the invention is proposed first, which has at least one superconducting component ($G_G$) at room temperature.

One obtains a particularly simple method of achieving this behavior by the combination of two different graphite modifications (or structures). It is proposed to achieve this behavior in a first process step by providing a first substrate ($G_{SUB}$) exhibiting at least two layers ($G_{B1}$, $G_{B2}$). Each of these two layers ($G_{B1}$, $G_{B2}$) preferably represents here a graphite modification. The first layer ($G_{B1}$) and the second layer ($G_{B2}$) are arranged one above the other and exhibit a common boundary region ($G_{FB}$). The boundary region ($G_{FB}$) comes into being because of the mechanical and therefore electrical contact of the two layers ($G_{B1}$, $G_{B2}$). The border region is preferably characterized by at least one graphene layer in which electrons are present in a different electronic configuration than that of the graphene layers of the two layers ($G_{B1}$, $G_{B2}$). The first layer ($G_{B1}$) is composed of graphite with Bernal-crystal structure (graphite 2H) for example with at least 3 atomic layers (graphene sheets) each having a thickness of exactly one atom per atom layer (graphene layer). The second layer ($G_{B2}$) is made of graphite with rhombohedral crystal structure (English rhombohed ral, graphite 3R) for example with at least 3 atomic layers (graphene sheets) each having a thickness of exactly one atom per atom layer (graphene layer). The term first and second layer ($G_{B1}$, $G_{B2}$) may be interchanged in reality. The boundary region ($G_{FB}$) comprises the actual first interface ($G_{F1}$) and preferably exhibit an orientation of the surface normal ($n_{F1}$) parallel to the hexagonal symmetry axis (c) of the crystal lattice of the graphene layers of the first layer ($G_{B1}$). For the purposes of this invention "Parallel" means that the orientation of the surface normal ($n_{F1}$) to the first interface ($G_{F1}$) relative to the hexagonal symmetry axis of the crystal lattice of the graphene layers of the first layer region ($G_{B1}$) has a rotation angle of less than 45°, preferably less than 20°, better less than 10°, more preferably less than 5°, more preferably less than 2°, more preferably less than 1°, more preferably less than 0.5°, more preferably less than 0.25°. It is therefore advised that each respective graphite source conduct its own statistical research to narrow down the range. It is certain that with a match of the orientations of the graphene layers in the boundary region both in parallel and not rotated against each other the observed effect occurs. In sofar, in case of production, it can be expected that will need to be established, to sort out non-functioning substrates (GSUB). Particularly resistance measurements and measurements with a Magnetic Force Microscope (MFM) (see FIGS. 21-23) are proven to be useful. Furthermore, the graphene-layer stack of the boundary region ($G_{FB}$) should have an orientation of the surface normal ($n_{F1}$) of the graphene layers parallel to the hexagonal symmetry axis (d) of the crystal lattice of the graphene layers of the second layer region ($G_{B2}$) as well. Regarding the tolerances of this parallelism what has been stated above applies as well.

The use as well as suitable methods for utilization of the superconducting properties between the boundary surfaces of graphene layers of different stacking is not known regarding the use in electrical, electronic, optical or magnetic components.

It has been shown that at least part of the boundary region ($G_{FB}$), hereinafter designated as border region ($G_G$), exhibits superconductive properties, as the border region ($G_G$) of the boundary region ($G_{FB}$) exhibits a critical temperature ($T_c$), which is higher than −195° C. and/or higher than −100° C. and/or higher than −50° C. and/or higher than 360K and/or e.g. at 77K has a critical magnetic flux density ($B_k$) higher than 1 T and/or 50 T. In the sense of the invention these properties of the border region or a portion of the border region are meant if in the subsequent text the discourse is about "superconducting". In particular it has been found that the configuration described herein with a boundary region ($G_{FB}$) between two crystals of different graphite modifications (eg. of Bernal and rhombohedral type) exhibit a critical temperature ($T_c$) of 370K+/−7K (corresponds to a critical temperature ($T_c$) in the range of 363K to 377 K). With the help of an MFM it has been documented that a once inductively in the boundary region ($G_{FB}$) initiated electric current remains constant for weeks. This can only be explained by superconducting effects in the sense defined above. This is therefore an essential feature to differentiate from the prior art, from which no room temperature superconductivity is known that has been proven beyond doubt as of the priority date of the present application.

To fabricate an electronic, electrical, optical or magnetic component now, it makes sense to structure the substrate ($G_{sub}$). This may in particular happen by wet chemical etching (for example, in concentrated sulfuric acid with dissolved potassium di-chromate). A problem of wet chemical etching is the aggressiveness of the chemicals necessary for etching. Therefore, a structure using ion or particle beam etching is very useful. This can be done for example in oxygen plasma or argon plasma.

Another possible and very successful method for the production of very small structures is the Focussed Ion Beam etching, that can be reactively performed using chemically etching atoms and molecules, and/or the use of gases, that cause a purely mechanical etching (e.g. argon, etc.). Also, plasma etching is possible. Here, both RIE processes and DRIE processes can be used. A wet chemical etching may be assisted by applying a voltage to the substrate ($G_{SUB}$) relative to an electrode in the etching bath. Such electrochemical etching is thus a further possibility of the structuring of such partially superconducting graphite substrate ($G_{SUB}$).

In addition to these chemical structuring methods, a shape cutting chipping technology by means of one or more tools with cutting edges might be considered. Therefore, the structuring might be performed by also durch milling, scratching, revolving, grinding, cutting, piercing in conjunction with chip generation. It is conceivable to combine a plurality of substrates by pressing and/or sintering in a larger whole.

A variation of plasma etching, that is possible, is the spark erosion. By an amorphization, for example by means of a carbon ion beam or an ion beam of another element or of other molecules, the crystal structure may be destroyed locally, whereas the boundary region ($G_{FB}$) is destroyed as such and the superconducting region, the border region ($G_G$), is limited or structured. To be able to contact the substrate capacitively, inductively, optically or electrically, it is equipped in at least one further process step with electrical contacts. It is a step of providing appropriate contacts for capacitive, resistive, inductive or electromagnetic coupling of signals at 0 Hertz (DC signal) or higher (AC signal) or mixture forms (AC/DC signal) into the boundary region ($G_{FB}$).

Advantageously, the substrate ($G_{sub}$) is aligned prior to processing, for example by means of a goniometer. Therefore, an improved method for manufacturing a device according to the invention comprises the step of determining the orientation of the surface normal (nF) of the graphene layers of the boundary region ($G_{FB}$) within the substrate ($G_{Sub}$). This orientation can, for example, be performed by means of an X-ray diffraction analysis. Other methods are also conceivable. For example, graphite can be preferably split along the atomic layers. Such an orientation step can therefore also be done in the form that a few atomic layers are separated on one side of the graphite layer packet. The remaining surface is then preferably perpendicular to the surface normal of the boundary region.

It has been shown in the course of natural graphite usage, that not all graphite substrates possess the desired room temperature superconductivity. To confirm the region is superconducting at room temperature for flat specimens the sample was first heated and then magnetized by means of a sufficiently strong permanent magnet. Here, a circle current came into being whose characteristic profile of its magnetic field could be detected by means of a Magnetic Force Microscopes (MFM) (see FIGS. 21 to 23).

It is advantageous in the subsequent process step to measure the position of the superconducting portion of the border region ($G_G$) within the substrate ($G_{Sub}$) by means of a Magnetic Force Microscope (MFM) or by other suitable measuring means for the distribution of the magnetic flux density or for the magnetic field strength, in order to identify the superconducting region.

In general, the substrate ($G_{Sub}$) is not present in the desired shape and in particular thickness. Therefore, the thinning of the layers ($G_{B1}$, $G_{B2}$) is advantageous. Such a thinning process (3) of a layer ($G_{B1}$, $G_{B2}$), hereinafter the "relevant layer," and the creation of a lower interface (UGF) parallel to the graphene layers of the boundary region ($G_{FB}$) is, therefore, a preferred element of the proposed method. The minimum thickness of the relevant layer, being thinned, should not drop below three atomic layers. Better is a thinning to more than 6, preferably more than 10, preferably more than 20, preferably more than 50, preferably more than 100 atomic layers. The thinning, for example might be performed using a method which is applied for structuring. This may include, but is not limited to, wet chemical etching, ion or particle beam etching, Focussed Ion Beam etching, plasma etching with RIE and/or DRIE etching, electrochemical etching, shape cutting chipping technology and spark erosion. The process engineering possibilities of thinning are not limited to these methods. Primarily to mention here would be particularly precise methods such as lapping and electrochemical polishing and polishing with hot metal disks, in which carbon dissolves in the metal during contact with the graphite.

Now that one of the layers ($G_{B1}$, $G_{B2}$) has thus far been thinned so that it can be structured for example by photolithography method or electron beam lithography it is proposed in a variant of the method for manufacturing the electrical component to fix or to place the substrate ($G_{Sub}$) with the thus formed, typically almost ideal smooth surface in a further step onto the surface (OF) of a carrier ($Sub_1$) after thinning of the relevant layer region of the two layers ($G_{B1}$, $G_{B2}$). It is the method step of applying the thinned substrate ($G_{Sub}$) onto the surface (OF) of a carrier ($Sub_1$).

Provided that the resulting surface of the substrate ($G_{Sub}$) produced during the thinning was ideally polished, and provided that the surface (OF) of the carrier ($Sub_1$) is also ideal, van der Waals forces can already act between these surfaces, and might cause a "welding" of the surfaces. In this case, this is a mounting of said thinned substrate ($G_{Sub}$) onto the surface (OF) of the carrier ($Sub_1$) by means of adhesion.

In a further process step the thinned substrate ($G_{Sub}$) on the surface (OF) of the carrier ($Sub_1$) is preferred reliably mounted by forming a carbide, e.g. by heat treatment in an oven and by means of choosing a carbide-forming material of the carrier ($Sub_1$). In a further embodiment of the formation of a eutectic is conceivable. Finally, bonding or welding, in particular laser welding, are considered. In the latter case the use of a protective gas or the vacuum processing as in all graphite heat treatments are indicated.

After subject layer ($G_{B2}$, $G_{B1}$) thinning, it is now generally useful to thin the not yet thinned layer of the two layers ($G_{B1}$, $G_{B2}$) as well. The inventive method is therefore preferably extended by a further thinning step of the other layer ($G_{B1}$, $G_{B2}$), in the following the "other layer," which is not the subject layer. This results in the creation of a top interface (OGF) in parallel to the graphene layers of the boundary region in parallel ($G_{FB}$). Again, the same minimum thickness of the other layer region should be maintained as in the above-described relevant layer. The minimum thickness of the other layer thinned now as well should not be less than three atomic layers again. Better is a thinning to more than 6, preferably more than 10, preferably more than 20, preferably more than 50, preferably more than 100 atomic layers. The thinning can be carried out as well, for example, by applying methods used for structuring. This might be for example again, but not limited to, the wet chemical etching, ion or particle beam etching, Focussed Ion Beam etching, plasma etching with RIE and/or DRIE etching, electrochemical etching, shape cutting chipping technology and spark erosion. The procedural thinning options of the other layer are not limited to these methods. In particular to mention here are especially precise methods such as lapping and electrochemical polishing and polishing with hot metal disks, in which carbon dissolves in the metal during contact with the graphite.

More generally, the process variants of the invention are characterized in that process steps for thinning of layer regions ($G_{B1}$, $G_{B2}$) include the application of at least one of the following methods:
  metal-cutting manufacturing and/or
  polishing and/or
  grinding and/or
  electrochemical polishing and/or
  chemical mechanical polishing (CMP) and/or
  wet chemical etching and/or
  ion etching and/or
  particle beam etching and/or
  chemical etching and/or
  plasma etching.

In a further embodiment/design of the invention, it has been found to be meaningful that an electric, electronic, optical or magnetic component thus created can be combined with conventional circuits. For example, it makes sense to provide a conventional circuit in the form of providing a second substrate (SUB) for this combination. This second substrate (SUB) may be electrically insulating or electrically normally conducting or electrically semiconducting of the p-conduction-type or electrically semiconducting of the n-conduction-type or electrically metallically conductive. The second substrate (SUB) may be identical to the carrier ($Sub_1$). However, the carrier ($Sub_1$) can also be attached to the second substrate (SUB) by gluing etc., for example. This variant of the method also comprises carrying out the method as described above. In this case, the order of the method steps, in particular as regards the provision of the second substrate (SUB), may be changed. If it is a completely or partially semiconductive substrate, for example an integrated circuit, it makes sense if the second substrate (SUB) comprises at least one semiconductive electronic component. These may include, but are not limited to: wirings, contacts, through-silicon via (TSV), junctions, insulating layers, diodes, PN diodes, Schottky diodes, ohmic resistors, transistors, PNP and/or PNP bipolar transistors, n- or p-channel MOS transistors, diacs, tricacs, pip-, or nin- or pin-diodes, solarcells, etc. The second substrate (SUB) may also include more complex structures, such as logic gates, amplifiers, filters, operational amplifiers, multipliers, analog-to-digital converters, reference voltage sources and reference current sources, current mirrors, differential amplifiers, digital-to-analog converters, comparators, memories, microcomputers, oscillators, etc. In addition to these purely electronic and microelectronic subdevices, the second substrate (SUB) can also be modified simultaneously or alternatively in another way, so that it includes fluidic and/or microfluidic and/or optical and/or microoptical subdevices. For example, it is conceivable to exploit the magnetohydrodynamic (MHD) effect in such a device.

According to another embodiment, the second substrate (SUB) may comprise another electronic and/or electrical component, in particular (but not limited to) a flat coil or a capacitor, wherein the component is fabricated in microstructure technology on the second substrate or in this second substrate (SUB). Wiring or contacting between the first and second substrate is preferably produced by applying at least one electrically conductive layer to the first ($G_{sub}$) or second substrate (SUB). In this case, the electrically conductive layer may be electrically normally conducting or electrically semiconducting of the p-type conductivity or electrically semiconducting of the n-type conductivity or electrically metallically conducting. In particular, it may also be an amorphous or polycrystalline semiconductor, for example, silicon or germanium or diamond or diamond-like layers (DLC). In a further embodiment, semiconductive electronic components such as diodes, transistors and resistors can be embedded in a semiconductive layer. Parts of such a semiconducting layer can therefore have a different doping and thus a different conduction type than other parts of the same semiconducting layer. The specific resistivities and/or the mobility and/or the charge carrier density and/or the dopant density and/or the density of the traps may vary within such a semiconductive layer as well. In order to be able to wire the components well, it is convenient to structure them in particular by means of photo and/or ion beam lithographic methods. From state of the art these methods are well known. Therefore we waive further descriptions here.

Thus, the proposed method in this case also includes the structuring of the at least one electrically conductive, in particular electrically normally conductive layer, for example, to produce interconnects. It should be noted here that conductor tracks can also be produced from highly doped semiconductor material. In order not to short-circuit these conductor tracks through the first substrate ($G_{sub}$), it makes sense if it is electrically insulated from the graphite body of the first substrate ($G_{sub}$). For this purpose, it is expedient to carry out the application of at least one electrically insulating layer to the first substrate ($G_{sub}$) or the second substrate (SUB) or to an electrically normal conducting layer before the normal conducting layer application. For this purpose, for example, silicon dioxide or other insulating materials, such as silicon nitride, are suitable. It is also conceivable to use preferably photolithographically structurable plastics such as polyimide for this purpose. Typically, the opening of the electrical contacts is then necessary. This can be done by structuring the at least one insulating layer.

In order to create the electrical contact, it is necessary for the electrically conductive layer to be in direct mechanical contact with the first substrate ($G_{sub}$) at least one location. This is preferably not only a mechanical, but also an electrical contact. The insulating layer must also be supported mechanically by the first substrate ($G_{sub}$) as well. The electrically insulating layer is therefore in direct mechanical contact with the first substrate ($G_{sub}$) at at least one location. The structuring of the insulating layer, like that of the electrically conductive or semiconducting layer, preferably takes place photolithographically and/or wet-chemically and/or by plasma etching and/or ion and particle beam bombardment and/or amorphization and/or e-beam irradiation and/or laser irradiation and/or mechanical cutting methods and/or forming methods, which are combined with a cracking of the graphene layers of the boundary region ($G_{FB}$) in a structuring, which includes the structuring of the interface.

As a result of the above-described exemplary fabrication process, an electrical or optical or magnetic or electronic device is provided comprising at least one subdevice comprising a first substrate ($G_{sub}$) having at least two layers ($G_{B1}$, $G_{B2}$), the first layer ($G_{B1}$) and the second layer ($G_{B2}$) are arranged one above the other and have a common boundary area ($G_{FB}$) with a first interface ($G_{F1}$). For the purposes of the invention, "arranged one above the other" means that, given a suitable orientation of the overall package, that is to say of the layer stack of the first substrate ($G_{sub}$), the respective layers lie against one another. Therefore, the whole package can be aligned in other orientations. The first layer ($G_{B1}$) of the subassembly consists in the particularly preferred and especially tested example of graphite with Bernal crystal structure (graphite 2H) discussed hereinbefore, with preferably at least 3 atomic layers with a respective thickness of exactly one atom. These atomic layers are also referred to as graphene layers within the scope of the application. The second layer ($G_{B2}$) of the sub-device consists of graphite with rhombohedral crystal structure (English rhombohedral, graphite-3R) with e.g. at least 3 atom layers with a respective thickness of exactly one atom. The graphene layers of the boundary region ($G_{FB}$) furthermore have an orientation of their first surface normals ($n_{F1}$) parallel to the hexagonal symmetry axis (c) of the crystal lattices of the graphene layers of the first layer region ($G_{B1}$). The graphene layers of the boundary region ($G_{FB}$) furthermore have an orientation of their first surface normal ($n_{F1}$) parallel to the hexagonal symmetry axis (d) of the crystal lattices of the graphene layers of the second layer region ($G_{B2}$). In contrast to the prior art at least a part of the boundary region ($G_{FB}$), the border region ($G_G$) has the abovementioned superconducting properties in the sense of the invention. In order to make it possible to contact the graphene layers of the boundary region ($G_{FB}$), the first substrate ($G_{sub}$) is structured in such a way that the outer edge of the boundary region ($G_{FB}$) in at least a partial region of the first substrate ($G_{sub}$) is altered by machining. Preferably, this edge region of the first substrate ($G_{sub}$) is changed in such a way, that the border area ($G_{FB}$) is opened, for example, by a chamfer and can be contacted by means of metal deposition. In order to be able to connect the component, it is preferred that the boundary region ($G_{FB}$) has at least one electrical contact which is suitable for connecting the boundary region ($G_{FB}$) to an electrical conductor. Capacitive, inductive or electromagnetic coupling of signals into the border region ($G_G$) are also possible.

In order to obtain a suitable signal from the component, the component is supplied with electrical energy by means of a method for operating an electrical or optical or magnetic or electronic component. For this purpose, said component is provided. One of the features of the proposed method is that the component has a sub-device which is superconducting in the sense of the invention, namely the border region ($G_G$). By energizing the electrical component at a temperature (T), that is above −196° C., an electrical current flow is caused in the electrical or optical or magnetic or electronic component. Here it is advantageous first to heat the component to a temperature above the critical temperature ($T_c$) and then to operate below the critical temperature, but still above −195° C. In the process, a current flow occurs within the superconducting subregion, the border region ($G_G$) within the boundary region ($G_{FB}$). On the basis of the sub-region superconducting at room temperature, the border region ($G_G$), it is possible to define an electrical component that is characterized in that it has at least one subdevice, the border region ($G_G$), which is an electrical superconductor according to the meaning of the invention. The component preferably has carbon as an electrical superconductor, preferably in crystalline form, particularly preferably in a rhombohedral crystal structure (graphite 3R) and/or in a Bernal crystal structure (graphite 2H). The component is preferably operated in a first intended operation condition above the critical temperature ($T_c$) and in a second intended operating condition at a working temperature ($T_a$) below the critical temperature ($T_c$).

The superconductive device can be used by utilizing the critical temperature ($T_c$) as a temperature sensor. A proposed temperature sensor is accordingly characterized in that it comprises an electrical component as previously proposed comprising at least one superconducting subdevice, the border region ($G_G$). The conductivity of the electrical component depends on an external magnetic field. This dependence is abruptly caused by exceeding the critical magnetic field strength ($B_k$) or by slow penetration of the magnetic flux lines into the superconductor, here the border region ($G_G$). Of particular interest are circular and/or spiral structures, in particular in connection with flat coils and/or Josephson contacts. Such structures are characterized in that the superconducting substructure, the border region ($G_G$), of such a device has a topological genus higher than 0. This means that the superconducting structure, in this case the border region ($G_G$), has at least one hole (O1) completely surrounded by the superconductor (see FIG. 13). For the purposes of the invention, circular superconductors are thus disclosed, for example, which are interrupted at at least one point, for example by tunneling sections for charge carriers (see FIGS. 28, 29). Such constructions are also covered by the topological genus 0 in the sense of the invention.

The simplest electronic component that can be created by the method outlined above is that of an electrical conduction line. For this purpose, the first substrate ($G_{sub}$) is thinned on both sides as described above and mounted on a second substrate (SUB) as a carrier. The crystal edges are worked out parallel to the conduction line direction left and right of the center line of the conduction line by structuring so that preferably only the conduction line as such remains on the second substrate (SUB). Possibly, the conduction line is connected at its two ends, as described above, by means of metal deposition and subsequent, preferably photolithographic structuring of the metal. This metallization contacts the boundary region ($G_{FB}$) or an interface ($G_F$) contained therein. It is also conceivable to use a first substrate ($G_{sub}$) for example mechanically working to yield an elongated rod, the vector of the rod direction preferably being parallel to a plane vector of the graphene layers of the boundary region ($G_{FB}$) parallel to the graphene layers of this boundary region ($G_{FB}$), This divides the bar into two halves, the first layer ($G_{B1}$) and the second layer ($G_{B2}$). The electrical contacts to the boundary region ($G_{FB}$) can also be made in such a case by metal caps, which are placed on the finished rod at its respective ends.

Since a magnetic field occurs in case of a current flow, it is possible, by means of a first conduction line, if it is is guided to a second conduction line in a distance ($d_L$) to change electrical properties of the first conduction line by the current flow in the second conduction line (see FIG. 10). In this case, the second conduction line may also be a subsection of another proposed device comprising a room temperature superconductor as a functional subdevice [border region ($G_G$)]. Instead of a ring structure, it is conceivable not to produce the component in planar technology. The production of graphite with a high proportion of rhombohedral crystal structure is known for example from AU 2015 234 343 A1, EP 2 982 646 A1 and JP 5 697 067 B1.

It is particularly advantageous if, based on the proposed device, a conduction line superconducting at room temperature is produced. This should then preferably be cylindrical and graphitized all around. In such a line, preferably at least one superconducting substructure, the border region ($G_G$), should be cylindrical.

Another electrical component with a sub-structure superconducting at room temperature, the border region ($G_G$), may be, for example, an electrical coil, in particular a flat coil. Two such coils can be combined to form a signal and/or energy transformer superconducting at room temperature. If a cylinder with bernal and rhombohedral graphite is alternately coated circumferentially and, for example, a spiral trench is milled into the resulting graphite layer package, which electrically intersects it, a cylindrical coil superconducting at room temperature is obtained.

Micro strip lines are known from micro wave technology. It is therefore proposed to manufacture such microstrip lines by means of partial structures superconducting at room temperature, the border regions ($G_G$) (FIG. 30). The process that can be done for this purpose has been described above. In many applications, no transformer is necessary, but an efficient antenna or other RF device that works as lossless as possible. It is therefore proposed to produce resonators, in particular microwave resonators and/or THz resonators and/or antennas, and/or an oscillator with at least partial devices from a material superconducting at room temperature. Here, for example, the above-mentioned method can be used.

Furthermore, it is proposed to use the room temperature superconducting sub-devices as components of electrical capacitors. For example, the leads and/or the capacitor plates may be fabricated from the room temperature superconducting material described above (see FIG. 30b). The device according to FIG. 30a,b,c is basically known in terms of its construction and mode of action, but here is made of the superconducting graphite material according to the inventions made.

A component (for example according to FIG. 30c) can be manufactured in a known manner so that it freezes a predetermined magnetic flux. If it is combined with a sensor for evaluating the magnetic flux, the component has a bistable behavior.

A special component in this regard is a Josephson diode. A Josephson junction (English: Josephson junction) is preferably used as a phase-modulating element for electron waves or Cooper pair waves. To produce such a Josephson diode, for example, a room temperature superconducting conductor from the material according to the invention is cut by means of a focussed ion beam or electron beam and the cutting point is filled with a few atomic layers of an insulator. The layers are so close together that tunneling of the charge carriers is still possible. Such a structure has a bistable behavior. DE 2 434 997 discloses that Josephson memories can be produced on the basis of such Josephson diodes.

On the basis of such a room temperature superconducting device quantum register bits can be produced, which will be discussed later.

According to a further embodiment of the invention, it is also possible to produce optical components which have at least one subdevice, the border region ($G_G$), which have an electrical superconductor in the sense of the invention.

Likewise, according to the invention, it is also preferable to produce magnetic components which have at least one subdevice, the border region ($G_G$) of which has at least one electrically conductive superconductor in the sense of the invention. By impressing a ring current, the material according to the invention can be used, for example, as a permanent magnet. The material is thus intended to be operated, for example, at a temperature below the critical temperature ($T_c$) and/or at an external magnetic field below the critical magnetic flux density ($B_k$). When used as intended, the proposed magnetic component has a permanent magnetic field with a magnetic flux density (Br) of more than 5 µT. Such a magnetic component is a flux quantum generator. In this connection, reference is made to DE 28 43 647.

A component according to the invention can also be used in electrical machines. In particular, such components can be used for measuring the magnetic field and thus for determining the rotor position in rotating electrical machines. It is therefore proposed an electric machine, which may be a rotating machine or a linear motor, which comprises at least one sub-device—for example, an electromagnetically operating sensor for rotor position determination—, which in turn comprises a sub-device, a border region ($G_G$), which comprises an electrical superconductor in the sense of invention, whereby the relevant electrical machine also has this property.

Such magnetic sensors with at least one sub-device superconducting at room temperature, the border region ($G_G$), which has an electrical superconductor within the meaning of the invention, are of particular interest for medical technology because of their sensitivity. For example, they can be used as sensors and antennas for NMR systems, etc.

It is also proposed with advantage to equip mobile devices with such sensors. The proposed mobile device therefore has at least one subdevice, the border region ($G_G$), which is an electrical superconductor in the sense of the invention. In a further embodiment, such a sub-device is, for example, an energy storrage for the mobile device. It is also conceivable to build portable quantum computers by utilizing the properties of the material described here in future. Since the cooling devices are eliminated, the availability of the material described herein is crucial to the realization of such portable quantum computers.

Furthermore, an energy storage is also proposed which stores energy, for example, in the form of a superconducting circulating current. Such an energy storage is characterized in that it has at least one subdevice, the border region ($G_G$), which is an electrical superconductor in the sense of the invention.

General Inventive Concept

In its most general form, the invention relates to a component for electrical and/or optical and/or magnetic and/or electronic applications
- with a substrate ($G_{sub}$) having at least two layers ($G_{B1}$, $G_{B2}$),
- wherein the first layer ($G_{B1}$) and the second layer ($G_{B2}$) are arranged adjacent to each other and have a common boundary region ($G_G$) extending from the first layer ($G_{B1}$) to the second layer ($G_{B2}$) and
- wherein the first layer ($G_{B1}$) comprises graphite with graphene layers with a first stacking sequence, e.g. with a Bernal crystal structure (graphite 2H), and
- wherein the second layer ($G_{B2}$) comprises graphite with graphene layers with a second stacking sequence, for example with a rhombohedral crystal structure (English rhombohedral, graphite-3R),
- wherein the total stacking sequence of first and second stacking sequences is different from the first stacking sequence,
- wherein the boundary region ($G_{FB}$) has a border region ($G_G$),
- wherein the border region ($G_G$) has superconducting properties, namely
  - at a current density of 0 amps/m² and a magnetic flux density of 0 Tesla the border region ($G_G$) has a critical temperature ($T_c$) that is higher than −195° C. and/or higher than −100° C. and/or higher than −50° C. and/or higher than 360K, and/or
  - at a temperature below the critical temperature e.g. 77K and a current density of 0 amps/m² the border region ($G_G$) has a critical magnetic flux density ($B_k$) which is higher than 1 T and/or 5 T and/or 10 T and/or 20 T and/or 30 T and/or 40 T and/or 50 T, and
- wherein the superconducting border region ($G_G$) is coupled to an electrical and/or magnetic and/or electromagnetic signal with a frequency higher than or equal to 0Hertz.

Components with such a stacking sequence are shown for example in FIGS. 26, 27, 31, 32.

Advantage of the Invention

The method according to the invention and the material according to the invention and its use according to the invention make it possible to use superconducting electrical conductors at room temperature without loss of energy. The advantages are not limited to this. For example, such devices may be used as information storage. In this case, the superconducting partial device stores the information, while the magnetic field-sensitive sensor element can read the information.

Possible Applications of the Invention

Exemplary possible applications of the device are, that it is part of an electrical conduction line and/or of an electrical coil and/or of a flat coil and/or of a transformer and/or of a multiport network with at least two magnetically and/or electrostatically coupled conduction lines and/or of a cylindrical coil and/or of a resonator and/or of a microwave resonator and/or of an antenna and/or of an oscillator and/or of an electrical capacitor and/or of a quantum register bit and/or of a Josephson memory and/or of a permanent magnet and/or of a rotor of an electrical machine and/or of a rotor of an electrical machine and/or of a stator of an electrical machine and/or of an energy storage and/or of a quantum interference component and/or of a metamaterial and/or of a digital-optical element and/or of a microelectronic circuit and/or of a micromechanical device and/or of a micro-optical device and/or of a microfluidic device and/or of a flux quantum generator and/or of a measuring device (sensor).

In many quantum interference applications, the device has a Josephson diode or the device is such a Josephson diode.

Exemplary Description of an Exemplary Hall Device as an Exemplary Electromagnetic Sensor Device The exemplary Hall device is an electronic component with a Hall measurement structure. Advantageously, recourse to semiconducting Hall structures available in the prior art is possible. In terms of the invention, it is possible to replace the Hall device by another magnetic field sensitive electronic component, such as a GMR resistor or an AMR sensor. More generally, therefore, an electronic device is proposed which has an electronic sub-device which changes an electrical parameter as a function of a magnetic field magnitude or of another parameter of the electromagnetic field and thus can serve as a magnetic field sensor.

On this partial device, that is to say, for example, the said Hall structure, the superconducting substrate described above ($G_{sub}$) is additionally applied. (FIG. 19) This can be done for example by sticking or clamping with a non-magnetic material (eg, an adhesive GL). That is, the electronic component, preferably in its immediate vicinity, comprises at least one subdevice, the border region ($G_G$), which comprises an electrical superconductor having a critical temperature ($T_c$) higher than $-195°$ C. and/or higher than $-100°$ C. and/or higher than $-50°$ C. and/or higher than 360K. Vicinity here means that an electrical, inductive, electromagnetic, optical and/or resistive interaction between the electronic component and the sub-device exists at least partially. Another equal feature for superconductivity is a critical magnetic flux density ($B_k$) at e.g. 77K of higher than 1 T and/or 50 T. Preferably, the device described above is prepared by using the previously described graphite structure. In this case, the first sub-device is then a first substrate ($G_{sub}$) having at least two layers ($G_{B1}$, $G_{B2}$), wherein the first layer ($G_{B1}$) and the second layer ($G_{B2}$) are arranged one above the other and have a common boundary region ($G_{FB}$) and wherein at least the first layer ($G_{B1}$) or the second layer ($G_{B2}$), but better both layers ($G_{B1}$, $G_{B2}$) are arranged over the Hall measurement structure. In the case of using another magnetic field-sensitive electronic component instead of a Hall structure, for example a GMR resistor or an AMR sensor, then at least the first layer ($G_{B1}$) or the second layer ($G_{B2}$) is over or in the vicinity of the substructure sensitive for magnetic fields of the other magnetic field sensitive electronic component. "Vincity" means that a magnetic field of the room temperature superconducting structure, the border region ($G_G$), is able to influence the substructure sensitivity for magnetic fields of the other electronic device sensitivities for magnetic fields in that way, that an electrical current is modified measurably in dependence on or in correlation with the magnetic field of the roomtemperature superconducting structure.

The first layer area ($G_{B1}$), consists of graphite with Bernal crystal structure (graphite 2H) with z. B. at least 3 atom layers with a respective thickness of exactly one atom per atomic layer and the second layer region ($G_{B2}$) of graphite with rhomboedral crystal structure (English rhombohedral, graphite-3R) with e.g. at least 3 atomic layers with a respective thickness of exactly one atom per atomic layer.

The graphene layers of the boundary region ($G_{FB}$) preferably have an orientation of their surface normals ($n_{F1}$) parallel to the hexagonal symmetry axis (c) of the crystal lattice of the graphene layers of the first layer ($G_{B1}$).

The graphene layers of the boundary region ($G_{FB}$) preferably have an orientation of their surface normals ($n_{F1}$) parallel to the hexagonal symmetry axis (d) of the crystal lattice of the graphene layers of the second layer ($G_{B2}$).

At least a portion of the boundary region ($G_{FB}$), the border region ($G_G$), then again has superconducting properties, wherein the relevant portion of the boundary region ($G_{FB}$) is superconducting in the context of the invention.

It has been found that doping, in particular with boron or other III/IV/V elements, makes sense in some cases for influencing the critical temperature ($T_c$). The doping with, for example, boron thereby results, for example, in the electrical connection of the boundary layer. At least the first layer region ($G_{B1}$) or the second layer region ($G_{B2}$) is preferably arranged above or in the vicinity of a Hall measurement structure or another magnetic field sensitive sensor or sensor element. Herein, in the vicinity means that a magnetic field generated by a current in the boundary region ($G_{FB}$) or the first layer region ($G_{B1}$) or the second layer region ($G_{B2}$) can change a parameter, in particular a measurement signal, of the Hall measurement structure or the other magnetic field-sensitive sensor or sensor element.

It will be reasonable for those skilled in the art that, based on this basic principle disclosed herein, any integrated circuit in the prior art can be combined with the roomtemperature superconducting substrate ($G_{sub}$). For this purpose, the above-described, roomtemperature superconducting substrate ($G_{sub}$) is applied to the integrated circuit as a carrier ($Sub_1$) or introduced into this. This can be done, for example (and not by limitation) by gluing or clamping with a non-magnetic material. The integrated circuit then also includes the superconducting substrate ($G_{sub}$) as a subdevice of the integrated circuit. As a result, the integrated electronic circuit has at least one partial device, namely the border region ($G_G$), which is an electrical superconductor in the sense of the invention. This, for example, is advantageous if the signal of the Hall element is to be amplified. Preferably, the device described above is produced by using the previously described graphite structure. In this case, the first subdevice is a first substrate ($G_{sub}$) comprising at least two layers ($G_{B1}$, $G_{B22}$), the first layer ($G_{B1}$) and the second layer ($G_{B2}$) being arranged one above the other and having a common boundary region ($G_{FB}$). and wherein at least the first layer ($G_{B1}$) or the second layer ($G_{B2}$) is/are arranged on a surface of the integrated circuit.

Inventive Component Structure with Modified Materials

Based on the foregoing, an electrical or optical or magnetic or electronic device with a modified graphite material is proposed as a generalization of the invention. It has been recognized that altered graphene stacking sequences and stacking faults may result in a change in the order parameter A, which is typically proportional to the critical temperature $T_c$ of the conductor, which can be used for a specific modification of the critical temperature ($T_c$). It has thus been recognized in the context of the invention that, by means of a suitable deviation from the previously described overall stacking sequence, of a first, in particular bernal, stacking sequence and a second, in particular rhombohedral, stacking sequence, the critical temperature ($T_c$) of the substrate ($G_{sub}$) can be modulated in the border region of both stacking sequences. Now that it is known for the total stacking sequence of bernal and rhombohedral graphite that room temperature superconductivity is possible in a border region ($G_G$), it is also obvious that by modulating the stacking sequences of the graphene planes in the sequence of graphene planes in a graphite crystal in fact, the critical superconduction temperature $T_c$ and possibly also other electrical properties of the overall stacking sequence can be modified. It is therefore proposed, starting from the total stacking sequence of bernal and rhombohedral graphite for the substrate ($G_{sub}$) to vary the resulting total stacking sequence and in this way to modify the critical temperature ($T_c$) and the critical flux density ($B_c$) according to the desired application, which sets up superconducting properties in the context of the invention.

It was therefore recognized that in addition to the actual roomtemperature superconducting combination of a rhombohedral graphite crystal as a second layer ($G_{B2}$) and a bernal graphite crystal as the first layer ($G_{B1}$) further graphene layer stacking sequences will typically exhibit in the border region ($G_G$) superconductivity of the overall stacking sequence with a deviating critical temperature ($T_c$).

Therefore as a generalization of this principle recognized an electrical or optical or magnetic or electronic device is proposed with a different critical temperature ($T_c$) and deviating critical magnetic flux density ($B_c$) proposed that comprises a first substrate ($G_{sub}$) comprising at least two layers ($G_{B2}$, $G_{B1}$). The first layer ($G_{B1}$) and the second layer ($G_{B2}$) are stacked and have a common first boundary region ($G_{F1}$) between the first layer ($G_{B1}$) and the second layer ($G_{B2}$). In this respect, this arrangement agrees with the arrangement described above. Preferably, the first layer ($G_{B1}$) consists of graphite with a first stacking sequence of z. B. at least 3 graphene layers. The 3 graphene layers are the minimum number to distinguish between a bernal and rhombohedral stacking sequence. It was recognized in the development of the invention that a larger number of graphene layers is advantageous in order to achieve the desired superconducting effect with certainty. Therefore, a graphene layer package with substantially more than 3 graphene layers as the first layer ($G_{B1}$) is preferred. The second layer ($G_{B2}$) consists of graphite with a second stacking sequence of graphene layers.

The total stacking sequence of the first layer stacking sequence ($G_{B1}$) and the second layer stacking sequence ($G_{B2}$) and the common interface ($G_F$) does not correspond to the first layer stacking sequence ($G_{B1}$). This means that a stacking fault occurs at the boundary between the first layer ($G_{B1}$) and the second layer ($G_{B2}$). An essential insight of this invention is that not only point-lattice defects such as impurities can be used to alter electronic properties of materials, but also stacking faults of conductive materials. In this case, the conductive material is graphite. In a semiconductor, doping provides insulating, n-semiconducting and p-semiconducting regions. It is an essential insight of this invention to create on the one hand superconducting sub-regions and non-superconducting sub-regions inside a substrate ($G_{sub}$) and on the other hand to modify the critical temperature ($T_c$) by modifying the combination of stacking sequences of the graphene layers. The component is characterized in that a subregion of the overall stacking sequence, namely the border region ($G_G$), has superconducting properties in the sense of the invention.

In preferred implementations, the critical temperature ($T_c$) or the critical magnetic flux density ($B_k$) at e.g. 77K depend from the total stacking sequence. The critical temperature ($T_c$) should be adjusted by the proper choice of stacking sequence to be higher than −195° C. and/or higher than −100° C. and/or the critical magnetic flux density ($B_k$) at e.g. 77K is higher than 1 T and/or 50 T. As already explained above, a possible overall stacking sequence for the adjustment of superconducting properties at room temperature consists in the form of a stacked stacking sequence of a first layer ($G_{B1}$) in form of a bernal stacking sequence in combination with a stacking sequence of the second layer ($G_{B2}$) in the form of a rhombohedral stacking sequence.

Preferably, the interface ($G_{F1}$) has an orientation of its first surface normal ($n_{F1}$) parallel to the hexagonal symmetry axis (c) of the crystal lattices of the graphene layers of the first layer region ($G_{B1}$). and an orientation of their first surface normal ($n_{F1}$) parallel to the hexagonal symmetry axis (d) of the crystal lattice of the graphene layers of the second layer region ($G_{B2}$).

The first substrate ($G_{sub}$) is preferably structured so that the outer edge of the interface ($G_{F1}$) in at least a portion of the first substrate ($G_{sub}$) is changed by machining. In this regar, reference is expressly made to the comments above.

In order to operate the electrical component, the interface ($G_{F1}$) should have at least one electrical contact designated or applicable to electrically connect the interface ($G_{F1}$) or boundary region ($G_{FB}$) containing this interface ($G_{F1}$) to an electrical conductor. However, it is also conceivable to connect superconducting components purely capacitively or inductively, without direct contact. For example, a superconducting magnetic device at room temperature may include a sub-device having a superconducting ring in which a previously induced permanent current flows. Such a sub-device behaves similar to a permanent magnet.

For direct contacting, the interface ($G_{F1}$) or a boundary region ($G_{FB}$) containing it should preferably have at least one electrical contact designated or applicable to electrically connect the interface ($G_{F1}$) or the boundary region ($G_{FB}$) containing this interface ($G_{F1}$) or the border region ($G_G$) to an electrical conductor.

As already mentioned above, the first stacking sequence of the first layer ($G_{B1}$) or respectively in the second stacking sequence of the second layer ($G_{B2}$) is preferably the stacking sequence of bernal graphite and respectively the stacking sequence of rhombohedral graphite.

Other stacking sequences might be synthesized, which microscopically should be combinations of A, B and C positions of graphene layers. However, the sequence can be varied, which influences the ritical temperature ($T_c$) or the critical magnetic flux density ($B_c$).

In a particular embodiment of the invention, the first stacking sequence of the first layer ($G_{B1}$) is equal to the second stacking sequence of the second layer ($G_{B2}$). In this variant, however, the second stacking sequence is offset from the first stacking sequence by a translational displacement vector along the first interface ($G_{F1}$). A rotational offset is also conceivable. Then, due to the rotational offset about a rotation axis, a Morié pattern arises in the electrical properties of the modified graphite. In such a component, the first stacking sequence of the first layer ($G_{B1}$) is preferably the same as the second stacking sequence of the second layer ($G_{B2}$), whereas the second stacking sequence ($G_{B2}$) is rotated vs. the first stacking sequence ($G_{B1}$) by an non zero angle around the surface normal of the first interface ($G_{F1}$).

Instead of equality, it is also possible to use inequality of the stacking sequence of the first layer ($G_{B1}$) with that of the second layer ($G_{B2}$), for example, bernal graphite in combination with rhombohedral graphite. In this context the stacking sequence of the first layer ($G_{B1}$) is not equal to the stacking sequence of the second layer ($G_{B2}$).

As with a PN diode in the doping of semiconductors, multi-layer structures structurally corresponding to PNP or NPN structures of semiconductor technology can be defined. For this purpose, a third layer ($G_{B3}$) is introduced which, together with the first layer ($G_{B1}$), encloses the second layer ($G_{B2}$) from above and below (see FIG. 31).

In this variant with three layers ($G_{B1}$, $G_{B2}$, $G_{B2}$), a component according to the invention exhibits a sub-device which has a first substrate ($G_{sub}$) with at least three layers ($G_{B1}$, $G_{B2}$, $G_{B2}$). The first layer ($G_{B1}$) and the second layer ($G_{B2}$) are arranged one above the other and have a boundary region with a superconducting border region between them. In addition, in this variant, the second layer ($G_{B2}$) and the third layer ($G_{B3}$) are arranged one above the other and have a common boundary region with a superconducting border region. The first layer ($G_{B1}$) consists of graphite with a stacking sequence of e.g. at least 3 graphene layers. The third layer ($G_{B3}$) is also made of graphite with a stacking sequence of e.g. at least 3 graphene layers. The second layer ($G_{B2}$) consists of graphite with a stacking sequence of graphene layers. In this case, the second layer ($G_{B2}$) may also comprise only one graphene layer or only two graphene layers or at least 3 graphene layers. In this case, the term "layer sequence of the second layer ($G_{B2}$)" is broader, since in this variant it can comprise a layer sequence with only a single graphene layer.

As before, the total stacking sequence should not match to any of the stacking sequences of the three layers ($G_{B1}$, $G_{B2}$, $G_{B3}$). If the stacking sequence of the second layer ($G_{B2}$) is a single graphene layer, then this stacking sequence is to be regarded as different from the other stacking sequences in the sense of this invention. If the stacking sequence of the second layer ($G_{B2}$) consist of two graphene layers, then this second stacking sequence of the second layer region ($G_{B2}$) in the context of the invention should be regarded as a bernal stacking sequence.

It is important that the total stacking sequence again consists of the stacking sequence of the first layer ($G_{B1}$) and the stacking sequence of the second layer ($G_{B2}$) and the stacking sequence of the third layer ($G_{B3}$) and the first boundary region ($G_{F1}$) or its border region and the second boundary region ($G_{F2}$) or its border area in its entirety does not correspond to the first stacking sequence of the first layer area ($G_{B1}$). Preferably, the total stacking sequence in its entirety should also not correspond to the stacking sequence of the third layer ($G_{B3}$). Preferably, the total stacking sequence in its entirety should also not correspond to the stacking sequence of the second layer ($G_{B2}$).

Preferably, the second border region ($G_{F2}$) should have an orientation of its second surface normal ($n_{F2}$) parallel to the hexagonal symmetry axis (c) of the crystal lattices of the graphene layers of the third layer region ($G_{B3}$). and an orientation of their second surface normal ($n_{F2}$) parallel to the hexagonal symmetry axis (d) of the crystal lattice of the graphene layers of the second layer region ($G_{B2}$).

In a further variant of the proposed component, the stacking sequence of the laminated layer ($G_{B3}$) is preferably the stacking sequence of rhomboid graphite or the stacking sequence of bernal graphite.

In a preferred embodiment for generating the two-dimensional perturbation and for modifying the electronic properties, it is provided that the stacking sequence of the first layer ($G_{B1}$) is equal to the stacking sequence of the third layer ($G_{B3}$), but this stacking sequence is offset vs. a translational vector along the first interface ($G_{F1}$) vs. the stacking sequence of the first layer. In a further embodiment, the stack layer of the first layer ($G_{B1}$) is equal to the stacking sequence of the third layer ($G_{B3}$), but this stacking sequence can be rotated with respect to the stacking sequence of the first layer by a non-zero angle around the surface normal of the first interface ($G_{F1}$).

Likewise, the stacking sequence of the second layer ($G_{B2}$) may be equal to the stacking sequence of the third layer ($G_{B3}$), but this stacking sequence may be offset from the stacking sequence of the second layer by a translatory vector along the second interface ($G_{F2}$). In a further embodiment, the second stacking sequence of the second layer region ($G_{B2}$) is equal to the third stacking sequence of the third layer region ($G_{B3}$), but the third stacking sequence rotated against the second stacking sequence by an angle not equal to zero around the surface normal of the second interface ($G_{F2}$).

As a first principle possibility, therefore, the stacking sequence of the first layer ($G_{B1}$) may be equal to the stacking sequence of the second layer ($G_{B2}$) and/or the stacking sequence of the third layer ($G_{B3}$) may be equal to the stacking sequence of the second layer ($G_{B2}$) and/or the stacking sequence of the third layer ($G_{B3}$) will be equal to the stacking sequence of the first layer ($G_{B1}$).

As a second principal possibility, the stacking sequence of the first layer ($G_{B1}$) may not be equal to the stacking sequence of the second layer ($G_{B2}$) and/or the stacking sequence of the third layer ($G_{B3}$) may not be equal to the stacking sequence of the second layer ($G_{B2}$) and/or the stacking sequence of the third layer ($G_{B3}$) does not equal the stacking sequence of the first layer ($G_{B1}$).

It is essential to the invention that the resulting overall stacking sequence has the said stacking fault which is responsible for suitably changing the critical temperature ($T_c$) and/or the critical magnetic flux density ($B_k$). For example, the transition from a bernal stacking sequence to a rhombohedral stacking sequence is one such stacking fault.

As above for the first layer a minimum thickness of each of the graphene layers is indicated. However, it was recognized in the development of the invention that the observability of the effect increases when the number of graphene layers used is higher. The layer ($G_{B1}$) should therefore comprise at least three and/or better at least six and/or better at least 10 and/or better at least 20 and/or better at least 50 and/or better at least 100 graphene layers.

The third layer region ($G_{B3}$), which is arranged in the third stacking sequence ($G_{B3}$), should therefore comprise at least three, more preferably at least six, preferably at least 10, in particular at least 20, especially at least 50 and very preferably at least 100 graphene layers.

The second layer region ($G_{B2}$), which is arranged in the second stacking sequence ($G_{B2}$), should comprise at least three, better still at least six, preferably at least 10, in particular at least 20, in particular at least 50 and very preferably at least 100 graphene layers.

The proposed method for the transport of electrical charge carriers can be applied to a device according to the invention. For this purpose, said component is provided and contacted ohmic and/or inductive and/or capacitive. First charge carriers are injected into the superconducting sub-area, the border region ($G_G$), at a first point and, apart from the quantum-mechanical uncertainty, second charge carriers of the same polarity are extracted out of the superconducting subarea, ie the border region ($G_G$), at a second location of the device, which differs from the first location.

Moreover, it may be advantageous if one or more graphene layers of the first substrate ($G_{sub}$) are doped by impurity atoms. It may also be advantageous to produce the graphene layers isotope pure. Accordingly, it may be advantageous if at least one graphene layer of the first substrate ($G_{sub}$) isotope-pure or at least one graphene layer of the first substrate ($G_{sub}$) exhibits a concentration of $C^{13}$-isotopes deviating at least 10% better 50%, better 100% from that of living organic biological material of the earth's surface. Especially preferred is the use of graphene layers with 100% $C^{13}$-isotopes and/or 100% $C^{14}$-isotopes. The use of $C^{14}$-isotopes instead of $C^{13}$-isotopes is possible as well.

Description of Possible Quantum Components

It is known from the prior art that so-called Cooper pair boxes can be produced using superconductors. However, in the prior art, these require cooling in order to be able to produce the superconductivity. This serious disadvantage can be avoided with the materials described above in the inventive choice of stacking sequences.

Accordingly, a preferred embodiment is an electrical component and/or quantum interference component (FIG. 13) having a conductor (W), wherein the material of the conductor (W) is preferably a graphene layer package having a sub-structure superconducting at room temperature—in particular a border region ($G_G$) as described above.

In the following, the conductor (W) is described as consisting of several sections (W1a, W1b, W2a, W2b). The conductor (W) is preferably divided into a first conductor branch (W1a, W1b) and a second conductor branch (W2a, W2b). The first conductor branch (W1a, W1b) and the second conductor branch (W2a, W2b) are preferably arranged such that they at least partially enclose an opening (O1) between them. In contrast to the prior art, the conductor (W) has at least partially a superconducting material in the sense of the invention.

In a further embodiment of the component element, at least the first conductor branch (W1a, W1b) preferably exhibits a weak point ($TU_1$) (Josephson Junction) introducing a phase difference. In a further refinement, the second conductor branch (W2a, W2b) also has a weak point ($TU_2$) introducing a phase difference. Preferably, each of the phase difference introducing weak points is formed by an insulator or a local modification of the stacking sequence of the graphene layers. The gap which represents the respective phase difference introducing weak point ($TU_1$, $TU_2$) thus in the respective branch is preferably smaller than 1 µm, better smaller than 500 nm, more preferably smaller than 200 nm, even better smaller than 100 nm, especially better smaller than 50 nm, more preferably less than 20 nm, even more preferably still less than 10 nm, more preferably less than 5 nm, even better less than 2 nm and in particular less than 1 nm and most preferably less than 0.5 nm. Therefore, the respective phase difference introducing weak point ($TU_1$, $TU_2$) is preferably manufactured by means of ion or electron beam machining.

Theoretically, the phase difference inducing weak point might be made instead of an insulator by an at room temperature normally conducting region (eg by disturbing the stacking sequence) or by metal or by normal conducting graphite (eg by disturbing the stacking sequence) or by reducing at least one cross-sectional dimension, in particular the width and/or the thickness of the conductor (W).

In a further embodiment, the weak point ($TU_1$, $TU_2$) introducing a phase difference may be covered by a control electrode ($G_1$, $G_2$) which is electrically insulated from the conductor (W).

In another embodiment of the proposed device, a portion of a conductor branch (W1a, W1b) is covered with a control electrode ($G_1$) which is electrically insulated from the conductor (W). As a result, a capacitive coupling of this conductor portion, for example, to a voltage source is possible. It is proposed, by means of an electrical circuit to which a proposed electrical component and/or quantum interference component belongs, to control the proposed electrical component and/or quantum interference component by a control voltage source (V1) by means of a voltage (v1) between a conductor branch (W1b, W2b) and at least one control electrode ($G_1$).

In this case, the conductor (W) is preferably produced on an electrically normally conducting or semiconducting carrier ($Sub_1$), for example a silicon wafer. However, it is also possible to manufacture the conductor on an insulating support ($Sub_1$), for example a glass substrate or an electrically insulating crystal (e.g. sapphire). Preferably, the conductor (W) is electrically insulated from an electrically normally conducting or semiconducting carrier ($Sub_1$). This can be done for example by vapor deposition of silicon dioxide or the same or by thermal oxidation of the carrier ($Sub_1$).

The electronic components and/or quantum interference components produced in this way can typically be interconnected to form more complex circuits. The interconnection can be achieved by electrical contact of the component connections or by field coupling by means of electric fields (capacitive) or magnetic fields (inductive). Such an electrical circuit may also comprise conventional components. These can be realized, for example, as integrated components in a semiconducting carrier ($Sub_1$). Therefore, an electrical circuit is proposed which comprises at least one electrical component according to the invention and/or quantum interference components.

Furthermore, an electrical component and/or quantum interference component (FIG. 34) having a conductor (W, W1a, W1b) is proposed in which the electrical component and/or quantum interference component has a subdevice that performs the function of a Cooper pair box (English Cooper pair box) has. In such a Cooper-pair box, there is a reflection of the wave of the state function of the Cooper pair at the boundaries of the Cooper pair box. This proposed subdevice has at least one conductor (W), which at least partially comprises a material which is superconducting in the sense of the invention. This conductor (W) is divided into a first conductor portion (W1a) and a second conductor portion (W1b) by a weak point introducing a phase difference ($TU_1$). The first conductor section (W1a) can be contacted electrically by means of a first node (N1). The second conductor section (W1b) can be capacitively contacted via a second node (N2) by means of a coupling capacitance (Cg). Thus, the second conductor section (W1b) is insulated on the one hand by the weak point introducing a phase difference ($TU_1$), which may for example be made of an insulator again, and on the other hand by the coupling capacity (Cg). The second conductor section (W1b) thus forms the Cooper pair box.

A further variant of the previously proposed electrical component, instead of a weak point introducing a phase difference ($TU_1$) additionally has a further weak point introducing a phase difference ($TU_2$). It is therefore an electrical component and/or quantum interference component (FIG. 35) in which the electrical component and/or quantum interference component has a subdevice that performs the function of a Cooper pair box, and in which the sub-device exhibits a conductor (W), which is divided by the two phase difference introducing weak points ($TU_1$, $TU_2$) into a first conductor portion (W1a), a second conductor portion (W1b) and in a third conductor portion (W1c). In contrast to the prior art, the conductor (W) is at least partially made of a superconducting material according to the invention. The first conductor section (W1a) can be electrically contacted by means of a first node (N1), the second conductor section (W1b) can be capacitively contacted via a second node (N2) by means of a coupling capacitance (Cg) and the third conductor section (W1c) can be electrically contacted by means of a third node (N3). Thus, also in this example, the second conductor section (W1b) represents a Cooper pair box.

Metamaterial Carried Out According to the Invention

On the basis of such quantum interference components, a metamaterial is proposed which consists of a two-dimensionally periodic arrangement of n*m meta material substructures ($MTS_{i,j}$) with n and m as integer positive numbers and $1 \leq i \leq n$ and $1 \leq j \leq n$. The n*m metamaterial substructures ($MTS_{i,j}$) preferably form a two-dimensional translatory or rotary lattice. Each of the metamaterial substructures ($MTS_{i,j}$) preferably comprises at least one conductor ($W_{i,j}$). These conductors ($W_{i,j}$) are preferably produced from a room temperature superconducting material. In this case, preferably, each metamaterial substructure ($MTS_{i,j}$), which does not lie at the edge of the metamaterial, and at least the adjacent metamaterial substructures ($MTS_{(i+1),j}$, $MTS_{(i-1),j}$, $MTS_{i,(j+1)}$, $MTS_{i,(j-1)}$) form a sub-device of a quantum interference device. This results in a metamaterial with a two-dimensionally periodic array of (n−1)*(m−1) quantum interference devices with (n−1) and (m−1) as integer positive numbers. Each of these meta-material substructures ($MTS_{i,j}$) preferably comprises at least one conductor ($W_{i,j}$) connected to the adjacent conductors ($W_{(i+1),j}$, $W_{(i-1),j}$, $W_{i,(j+1)}$), $W_{i,(j-1)}$) of the adjacent metamaterial substructures ($MTS_{(i+1),j}$, $MTS_{(i-1),j}$, $MTS_{i,(j+1)}$, $MTS_{i,(j-1)}$) ohmically, in particular by conducting or superconducting compounds between the conductors ($W_{(i+1),j}$, $W_{(i-1),j}$, $W_{i,(j+1)}$), $W_{i,(j-1)}$) and/or inductively, through openings in the conductors ($W_{i,j}$, $W_{(i+1),j}$, $W_{(i-1),j}$, $W_{i,(j+1)}$), $W_{i,(j-1)}$), and/or capacitively, by coupling surfaces of the conductors ($W_{i,j}$, $W_{(i+1),j}$, $W_{(i-1),j}$, $W_{i,(j+1)}$, $W_{i,(j-1)}$).

Each of the metamaterial substructures ($MTS_{i,j}$) thus preferably has at least one associated conductor ($W_{i,j}$). This conductor ($W_{i,j}$) is preferably made at least in part of a material which is superconducting in the sense of the invention.

The electrical connection between the adjacent metamaterial substructures ($MTS_{i,j}$, $MTS_{(i+1),j}$, $MTS_{(i-1),j}$, $MTS_{i,(j+1)}$, $MTS_{i,(j-1)}$) can also be introduced by phase shift introducing weak points ($TU_{l,i,j}$, $TU_{o,i,j}$, $TU_{l, i,(j-1)}$, $TU_{o,(i+1),j}$). Thus, a metamaterial is proposed in which conductors ($W_{i,j}$) of metamaterial substructures ($MTS_{i,j}$) are connected by conductors ($W_{(i+1),j}$, $W_{(i-1),j}$, $W_{i,(j+1)}$, $W_{i,(j-1)}$) of adjacent metamaterial substructures ($MTS_{(i+1),j}$, $MTS_{(i-1),j}$, $MTS_{i,(j+1)}$, $MTS_{i,(j-1)}$) via the said phase shift introducing weak points ($T_{l,i,j}$, $T_{o,i,j}$, $T_{l, i,(j-1)}$, $TU_{o,(i+1),j}$), in particular Josephson compounds (English: Josephson Junctions). As a result, several metamaterial substructures (e.g. $MTS_{i,j}$, $MTS_{(i+1),j}$, $MTS_{i,(j+i)}$, $MTS_{(i+1), (j+1)}$) each might form a quantum interference component. This results in the said metamaterial having a two-dimensional periodic arrangement of (n−1)*(m−1) quantum interference components with (n−1) and (m−1) as positive integer numbers. Instead of a two-dimensional arrangement, the periodic stacking of such two-dimensional metamaterials makes possible a three-dimensional arrangement of the metamaterial substructures (eg, $MTS_{i,j,k}$) as well. This results in a three-dimensional arrangement of the resulting quantum interference components.

Such two-dimensional metamaterials can be used as a shield or as a filter for electromagnetic waves or as a digital optical element (see, eg, B C Kress, P. Meyrueis, "Applied Digital Optics: from micro-optics to nanophotonics" ISBN 987-0-470-02263-4, 2009 John Wiley & Sons Ltd) For example, the use as a one-dimensional or two-dimensional lattice of entangled flux quanta in quantum systems (e,g. quantum computers) is particularly preferred. For the last one it makes sense to use only a one-dimensional periodic arrangement of (n−1) quantum interference devices with (n−1) as a positive integer number, which requires a two-dimensional arrangement of n*2 metamaterial substructures.

For example, a metamaterial can also be produced by superconducting granulation in the boundary region in the form of several border regions, which in this respect may constitute a granulation. This granulation may be self-adjusting where applicable. This granulation does not necessarily show a regular order. However, in the sense of this invention it should be regarded as a metamaterial according to the invention.

Application to Machines

In a further embodiment, the partial device according to the invention, which is at least partially made of a material which is an electrical superconductor in the sense of the invention, is part of an electric machine, preferably a rotating machine and/or a linear motor. Preferably, the superconducting sub-device, the border region ($G_G$), is part of a rotor and/or a rotor (LF) and/or of a stator of the machine.

In the broadest sense, an electric machine is thus proposed with the invention, which may be a rotating machine or a linear motor. In the example of FIGS. 35 and 36 the rotor (LF) of the machine can perform movements around all its six degrees of freedom. This simplest machine proposed is characterized by a superconducting sub-device in the context of this invention. Preferably, the superconducting sub-device should be part of a rotor and/or a rotor (LF) and/or of a stator of the machine. However, it is also conceivable that the superconductive device is located, for example, for lowering an electrical supply line resistance in a control of the machine, which is interpreted as part of the machine in the sense of the invention.

According to the foregoing, an electric machine is thus proposed as a variant of the invention, in which the machine exhibits a rotor (LF) and a stator ($Sub_1$) and in which the stator ($Sub_1$) and/or the rotor (LF) exhibit a sub-device according to the invention superconducting (border region ($G_G$)). According to the invention the stator ($Sub_1$) and the rotor (LF) then exercise a force to each other, that is of magnetic or electrostatic origin, by means of the sub-device.

At this point, it can be seen that for very small machines an interaction is possible with electromagnetic radiation, in particular RF radiation, but also optical radiation, in case of a suitable design of the rotor (LF) or the rotor, in particular with a smaller moving mass as nano- or micromechanical machine. Such an electric machine exhibits a rotor (LF) or a rotor or a stator ($Sub_1$) and is intended to interact with an electromagnetic wave outside the electric machine.

For the purpose of the invention, actuators in which a mechanical force is used using a superconducting sub-device of the actuator are electrical machines.

DESCRIPTION OF THE FIGURES

The figures represent schematically simplified schematic sketches.

Provision of (1) a first substrate ($G_{sub}$) having at least two layer regions ($G_{B1}$, $G_{B2}$);
Determination (2) on the orientation of the surface normals the graphene layers of the boundary region ($G_{FB}$) within the substrate ($G_{sub}$);
Thinning (3) a "relevant" layer region ($G_{B1}$, $G_{B2}$) and creating a lower boundary surface (UGF) parallel to the graphene layers of the boundary region ($G_{FB}$);
Applying (4) the preferably thinned substrate ($G_{sub}$) to the surface (OF) of a carrier ($Sub_1$);
Attaching (5) the preferably thinned substrate ($G_{sub}$) to the surface (OF) of the carrier (Sub);
Thinning (6) of the other layer area ($G_{B1}$, $G_{B2}$), which is not the relevant layer area;
Providing (7) a second substrate (SUB), for example in the form of a microelectronic circuit;
Structuring (8) of the first substrate ($G_{sub}$);
Applying (9) at least one electrically conductive layer to the first substrate ($G_{sub}$) or to the second substrate (SUB), for example to produce the contacts;
Structuring (10) the at least one electrically conductive layer;
Applying (11) at least one electrically insulating layer to the first substrate ($G_{sub}$) or second substrate (SUB) or the carrier ($Sub_1$) or to an electrically, in particular normal, conducting layer;
Structuring (12) of the at least one insulating layer, e.g. for opening the contacts or through holes;
Providing (13) border region ($G_{FB}$) contacts.

Figure 4:
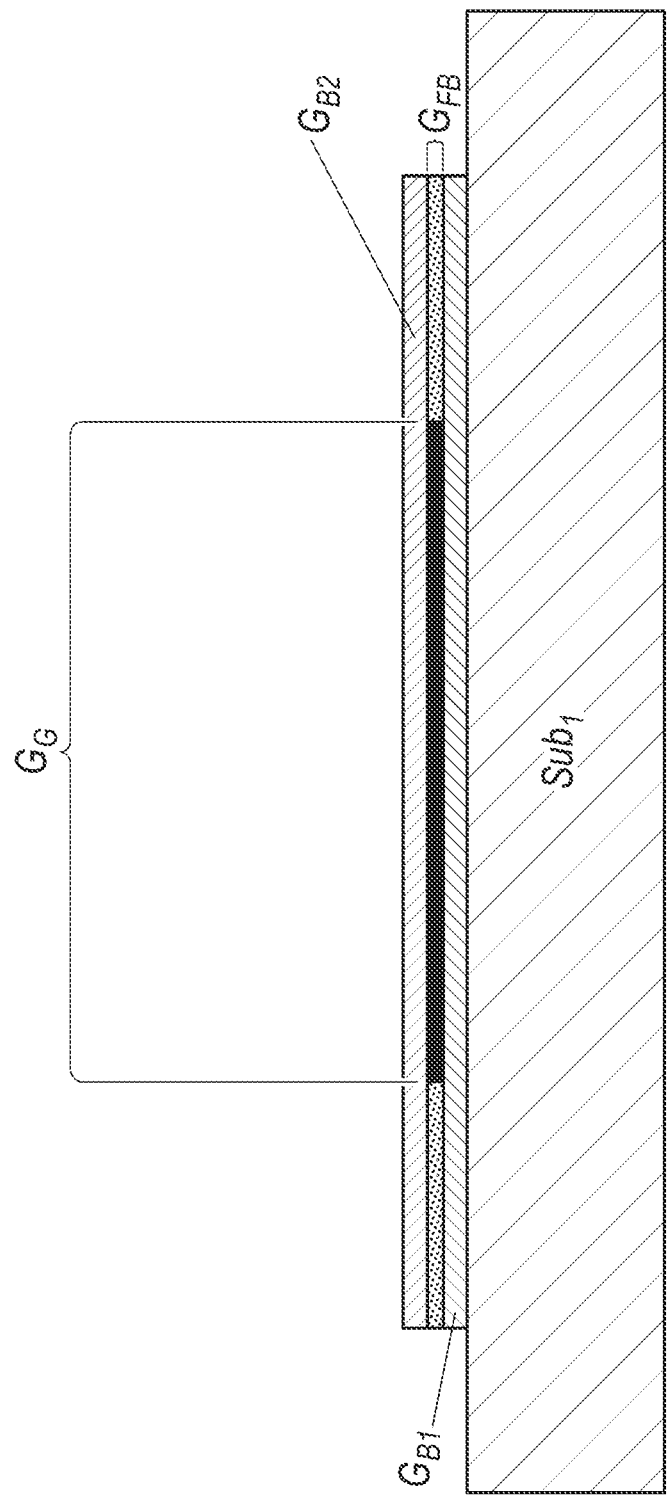
FIG. 4 shows a further preferred step of processing the substrate ($G_{sub}$) of FIG. 3 in the form of the thinning (6) of the other layer area, which is not the relevant layer area. This is the second layer area ($G_{B2}$).
Figure 5:
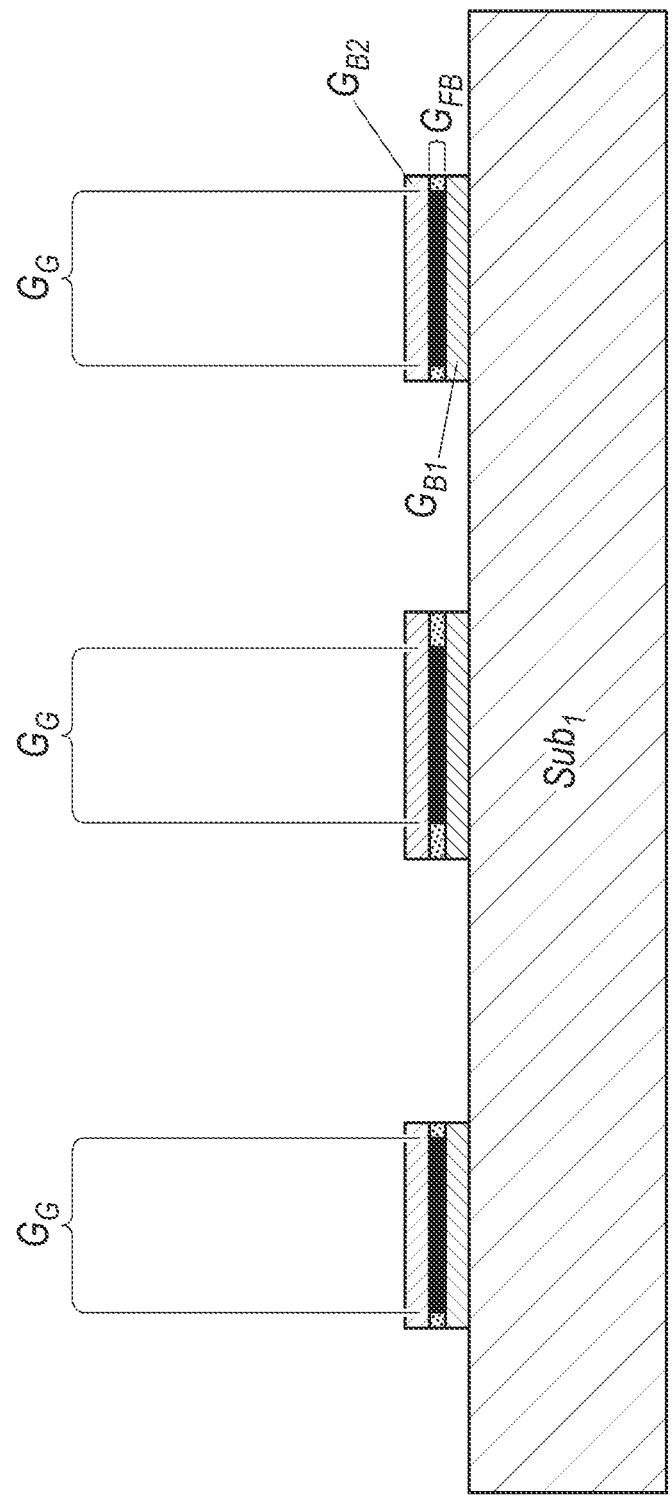
FIG. 5 shows an exemplary structuring (8) of the first substrate ($G_{sub}$) of FIG. 4.
Figure 6:
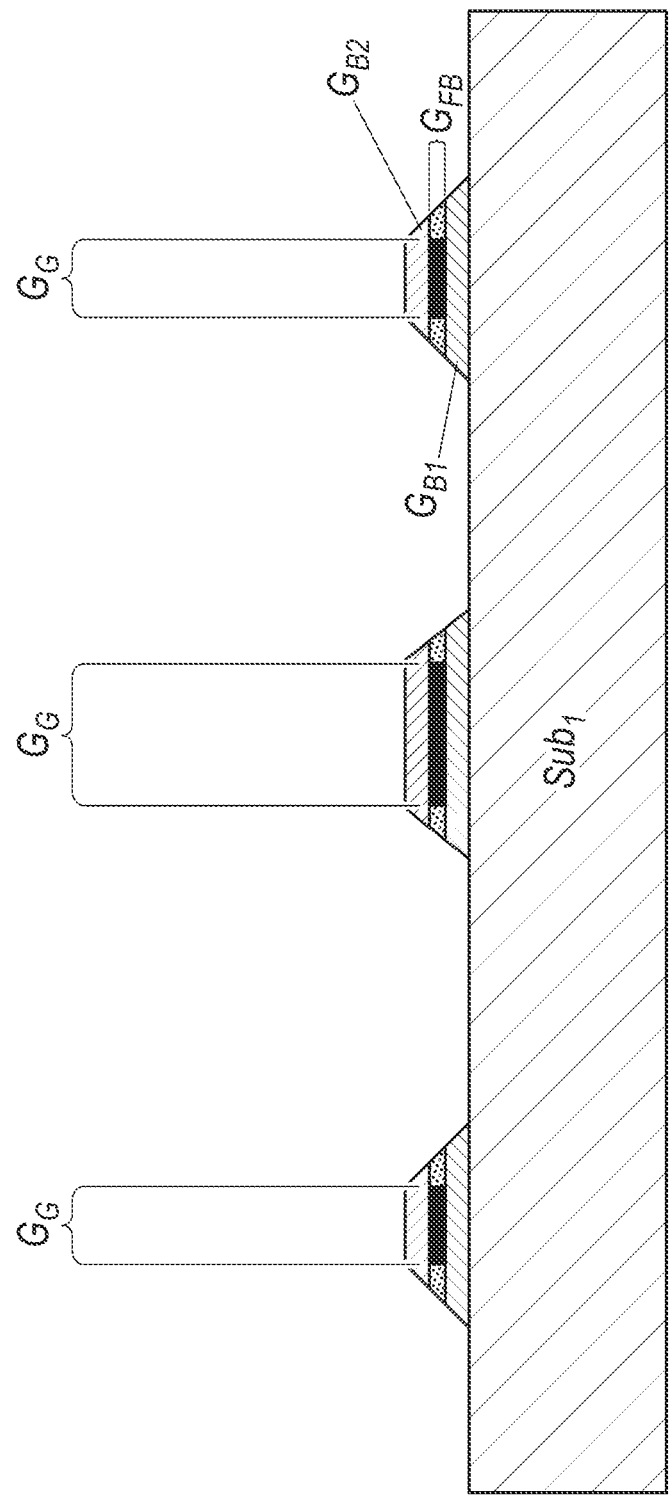
FIG. 6 shows the exemplary structuring (8) of the first substrate ($G_{sub}$) of FIG. 5 with exemplary beveling of the etching edges by a suitable choice of the process parameters. In particular, photolithographic etching processes as mentioned above come into question here.
Figure 7:
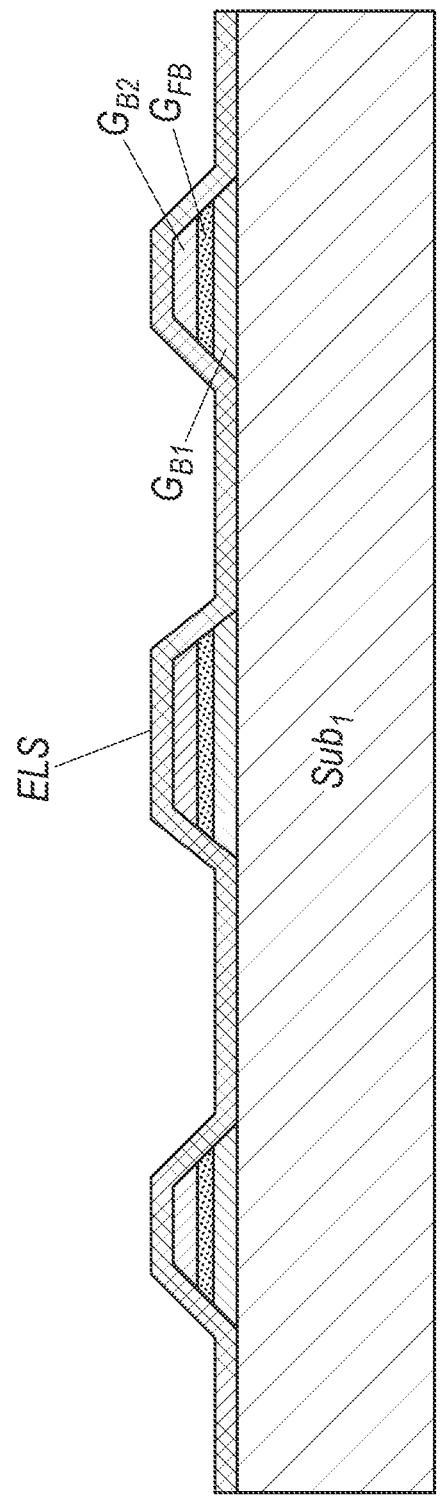
FIG. 7 shows the exemplary application (9) of at least one electrically conductive layer (ELS) to the first substrate ($G_{sub}$) of FIG. 6 to produce the contacts.
Figure 8:
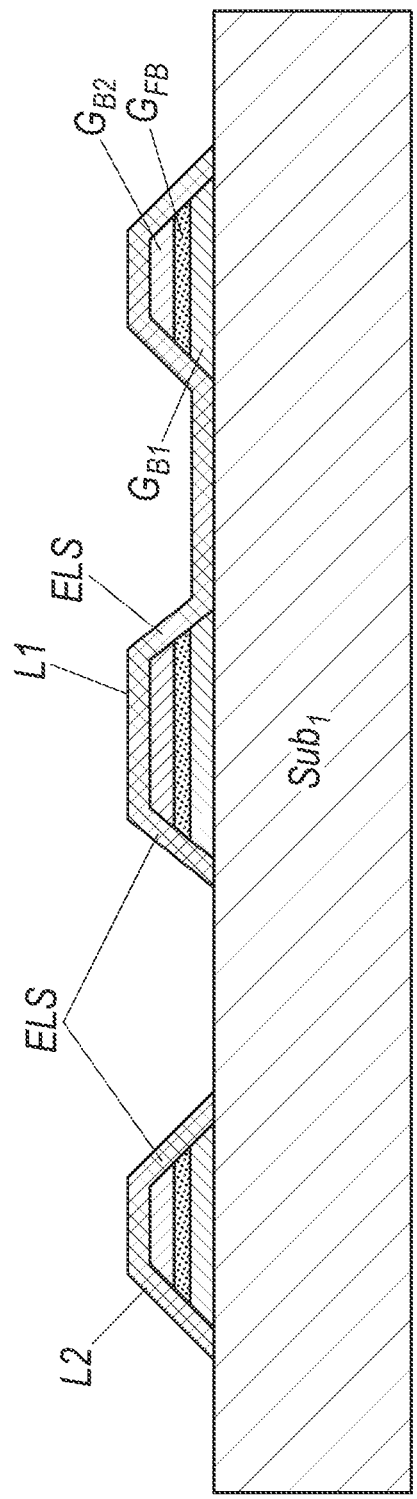
FIG. 8 shows the exemplary structuring (10) of the at least one electrically conductive layer (ELS) of FIG. 7, by means of which it forms a first conductor line (L1) and a second conductor line (L2) in the example of FIG. 8.
Figure 9:
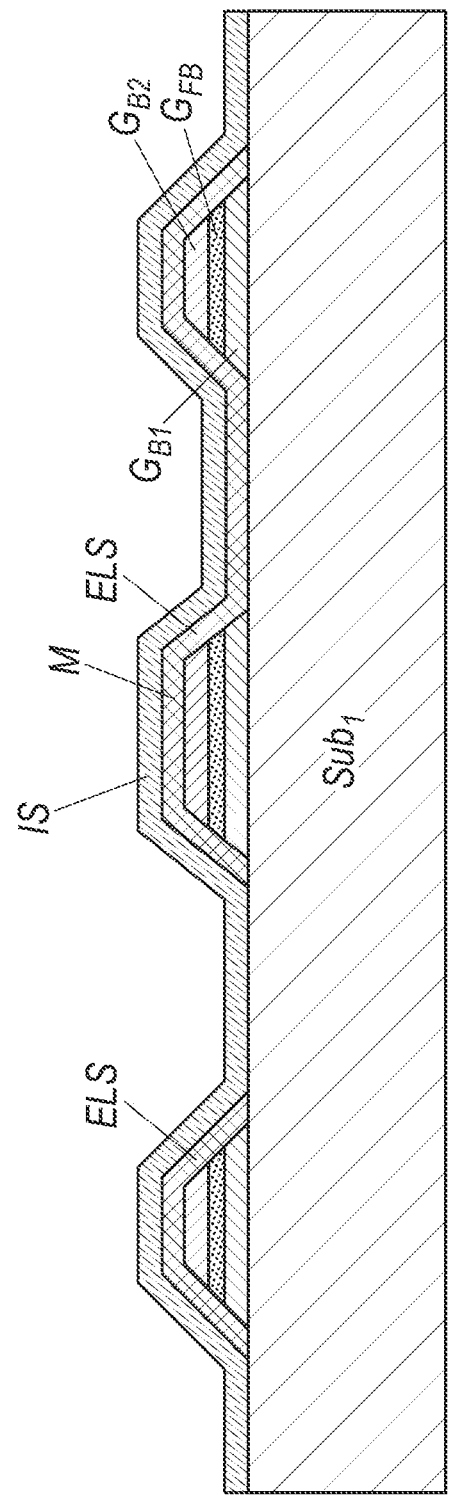
FIG. 9 shows the exemplary application (11) of at least one electrically insulating layer (IS) on the first substrate ($G_{sub}$) of FIG. 8 or respectively on the substrate ($Sub_1$) of FIG. 8 or respectively on the electrically, in particular the electrically normally conductive layer (ELS) of FIG. 8.
Figure 10:
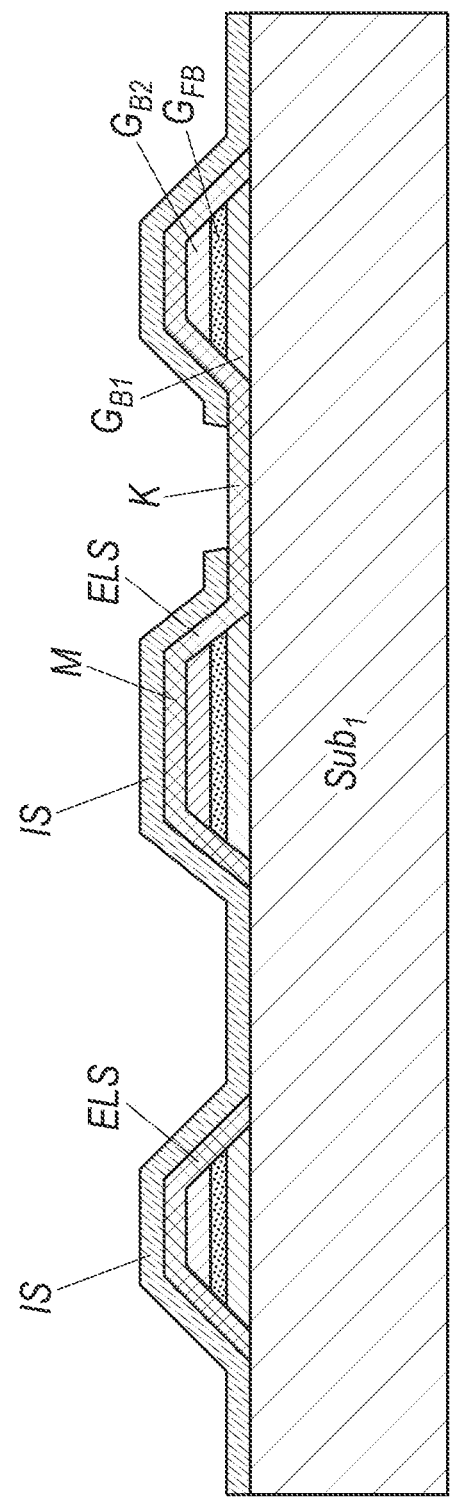
FIG. 10 shows the exemplary structuring (12) of the at least one insulating layer (IS) of FIG. 9, e.g. for opening the contacts (K) or for vias.
Figure 11:
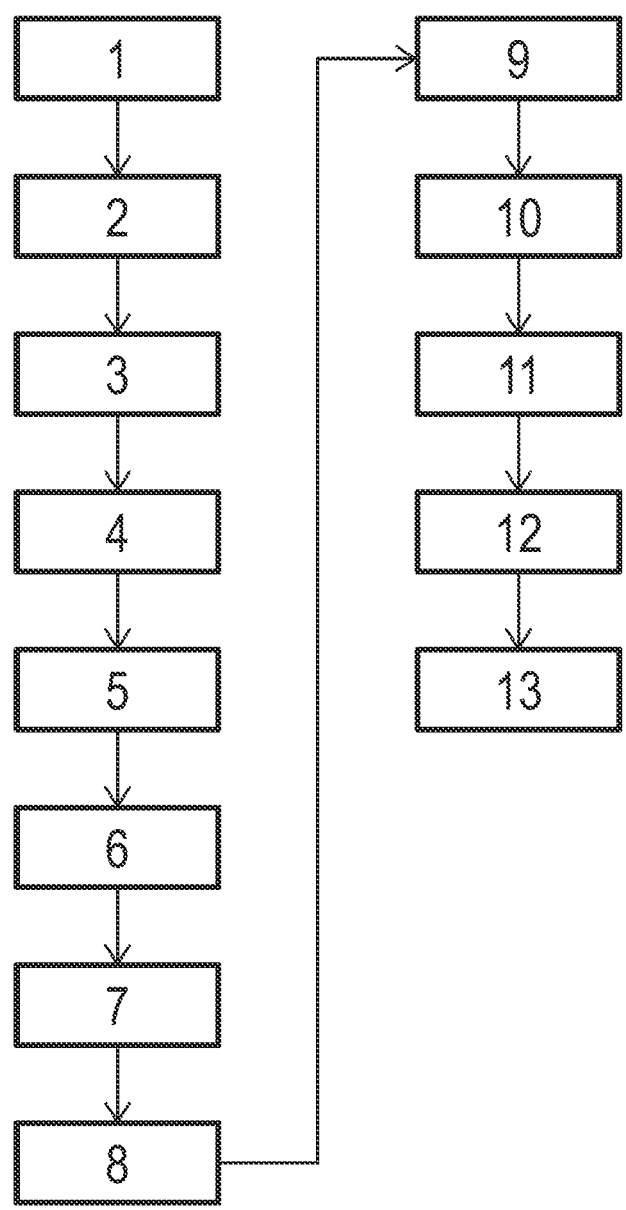
FIG. 11 shows an exemplary sequence of steps for producing the proposed devices.
Figure 12:
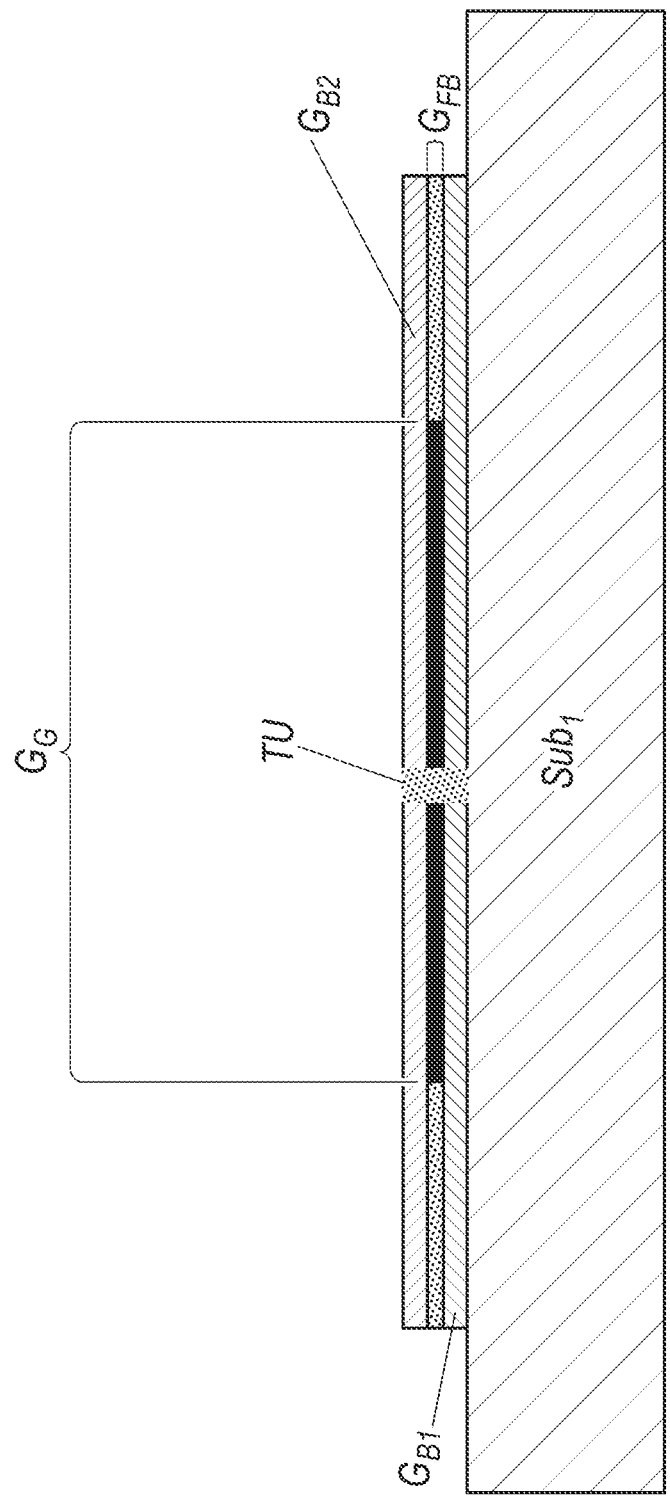

FIG. 12 shows a Josephson diode in cross section. The exemplary first substrate ($G_{sub}$) of FIG. 4 is intersected by a first phase difference inducing weak point, namely the tunneling element (TU), in the form of, for example, an a few atom thick oxide or of a normally conducting disturbance of the stacking sequence of the graphene layers. Such a phase difference introducing weak point can be formed by an insulator, in particular air or vacuum, or
by a local modification of the graphene stacking sequence or by another at room temperature normally conducting or
by at temperatures higher than −195° C. or better at temperatures higher than the critical temperature $T_c$ non-superconducting graphite regions that form border regions ($G_G$) within the conductor (W) or by metal.

The exemplary first substrate ($G_{sub}$) of FIG. 4 is interrupted by the tunneling element (TU), for example, a few atomic layers thick oxide.

Figure 13:
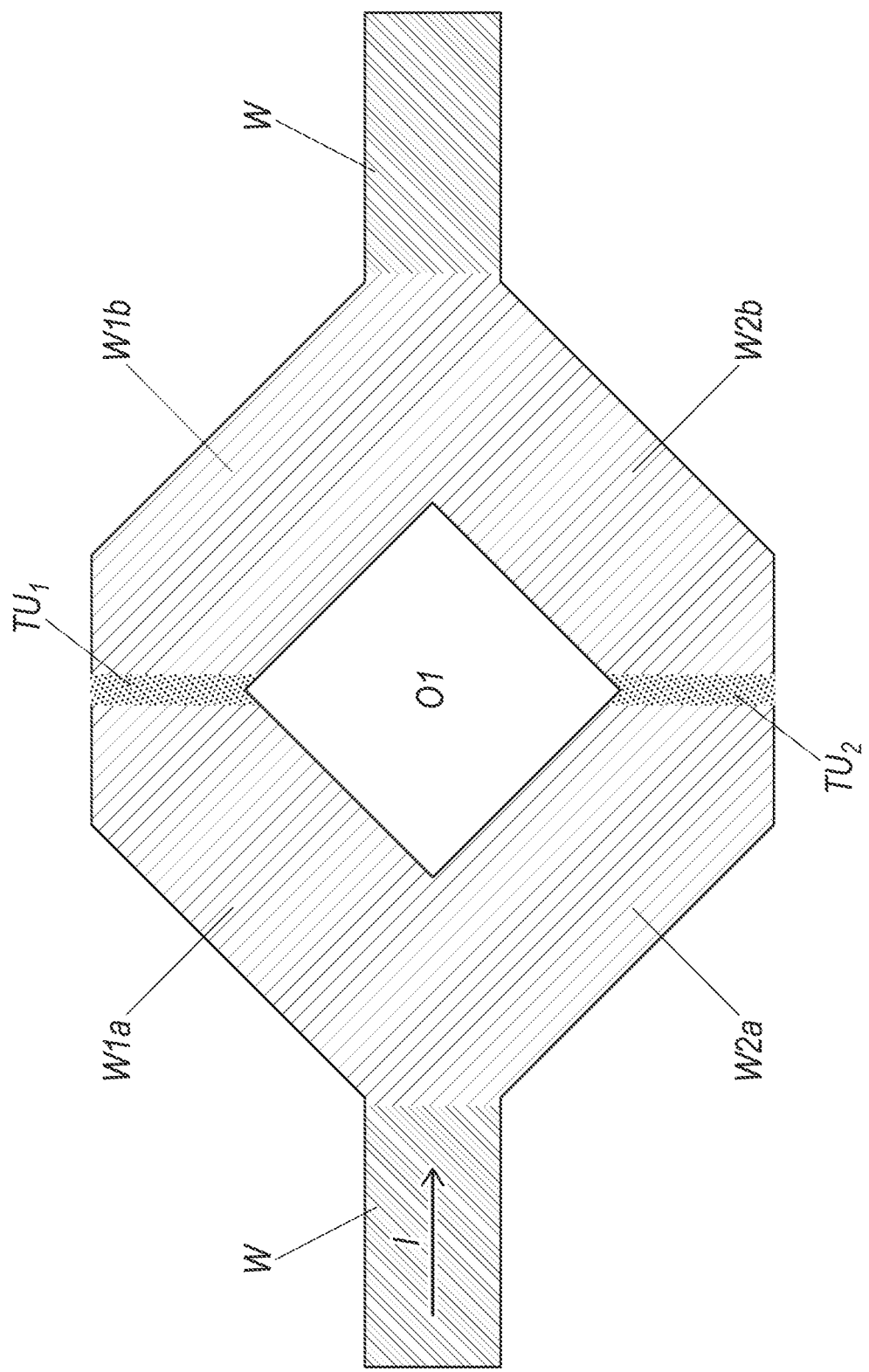

FIG. 13 shows the exemplary electrical component (SQUID) on the basis of the phase difference-introducing weak point (Josephson contact) from FIG. 12 in plan view. The first substrate ($G_{sub}$) is structured such that an annular structure with two branches results. The two branches are each interrupted by a Josephson diode in the form of a phase-modulating tunnel element ($TU_1$, $TU_2$). In case of a current flow (I), the voltage drop depends on the magnetic field perpendicular to the plane of the drawing. A SQUID can be used as a phase Q-bit (English phase qbit) within quantum computers. In this context, reference should be made to Xiu Gua "Microwave photonics with superconducting quantum circuits" ArXiv: 1707.02046v2 [quant-ph] 19 Oct. 2017.

FIGS. 14 to 20 show, by way of example, Hall structures using superconducting material in accordance with the invention.

Figure 14:
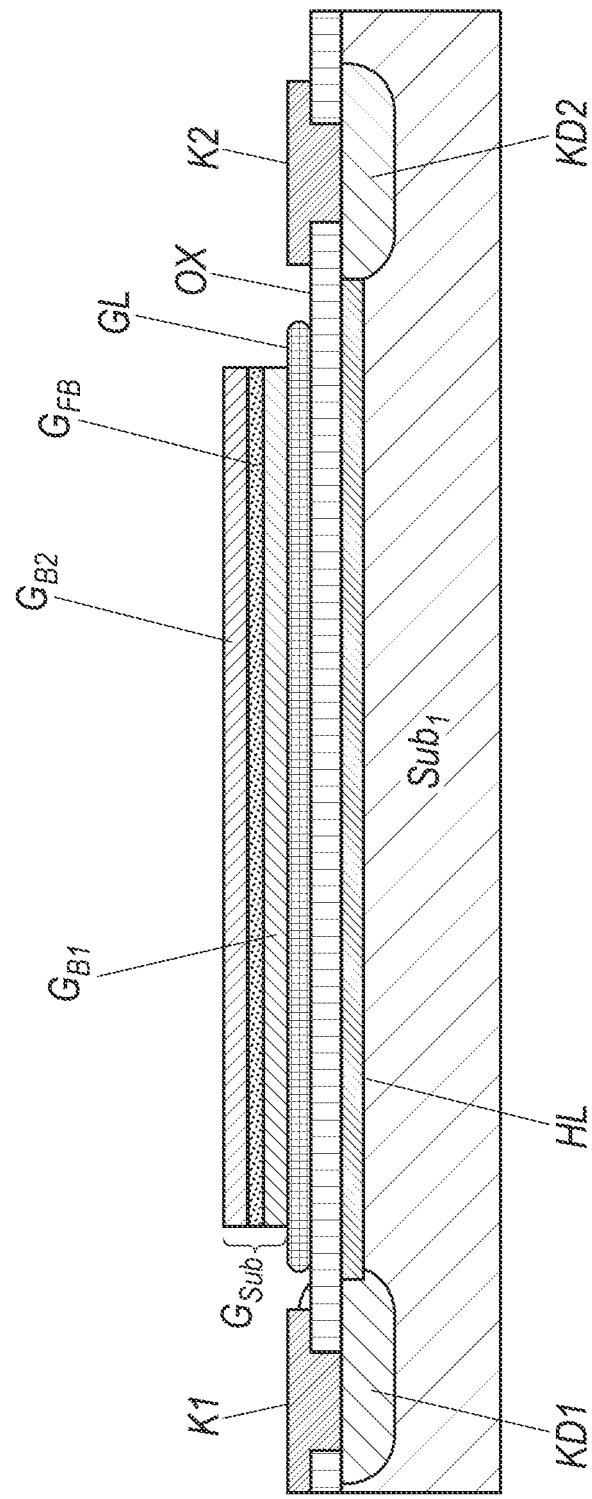

FIG. 14 shows a schematic simplified principle cross section through an integrated microelectronic circuit with a Hall structure (HL), which is part of an integrated circuit as a device sensitive to magnetic fields. The Hall structure (HL) is manufactured in a semiconducting carrier ($Sub_1$). The Hall structure (HL) is protected by an insulator (OX). Other isolators or insulator materials are conceivable. Also, whole metal/oxide stacks as insulator (OX) are conceivable. From the state of the art here diverse interconnection systems for integrated circuits and Hall sensor structures are known. The Hall structure in this example can be contacted via contacts (K1, K2). With the aid of an adhesive (GL), the superconductive layer package, ie the first substrate ($G_{sub}$ with $G_{B1}$, $G_{B2}$, $G_{FB}$, $G_G$) with the superconducting interface or the superconducting border region within a boundary region on the Hall structure (HL) having carrier (Sub$_1$), is attached. On this sub-device, so for example, the said carrier (Sub$_1$) with the said Hall structure (HL) so the above-described, superconducting at room temperature first substrate ($G_{B1}$, $G_{B2}$, $G_{FB}$, $G_G$) is applied. This can happen, for example, but not only by gluing or clamping with a non-magnetic material, here the adhesive (GL). As a result, the Hall structure (HL), as a magnetic field sensitive electronic component, exhibits in its immediate vicinity at least one subdevice, the border region ($G_G$), which is an electrical superconductor within the meaning of the invention.

It has also been shown in laboratory experiments that thinning of the graphite layers is not always necessary, depending on the starting material.

By a first contact doping (KD1) and a second contact doping (KD2) the Hall structure (HL) is electrically contacted in the example of FIG. 14 via the first contact (K1) and the second contact (K2). The dopings of the substrate of the carrier (sub$_1$) usually take place with a very high dopant concentration in order to produce ohmic contacts (K1, K2). If the semiconductor substrate of the carrier (Sub$_1$) is of a first conductivity type (eg p-doped), for example a p-doped silicon substrate, as is usual in CMOS circuits, then the Hall structure (HL) is of a second conductivity type opposite to the first conductivity type, if it is not placed in a separate well, thus, for example, a weakly n-doped silicon structure within the semiconducting substrate of the carrier (Sub$_1$). In this case, the contact dopants (KD1, KD2) are also of a second conductivity type opposite to the first conductivity type, that are, for example, formed as highly n-doped silicon structures within the semiconducting substrate of the substrate (Sub$_1$) in contact with the Hall structure (HL) and the metal of the contacts (KI, K2). It will be apparent to those skilled in the art that prior to application of the substrate ($G_{sub}$) on the carrier (Sub$_1$) of the carrier may have been subjected to a microtechnical process, wherein on or in the carrier nano- or microelectronic circuits and/or nano- or micromechanical devices and/or micro-optical devices and/or microfluid may have been manufactured.

Figure 15:
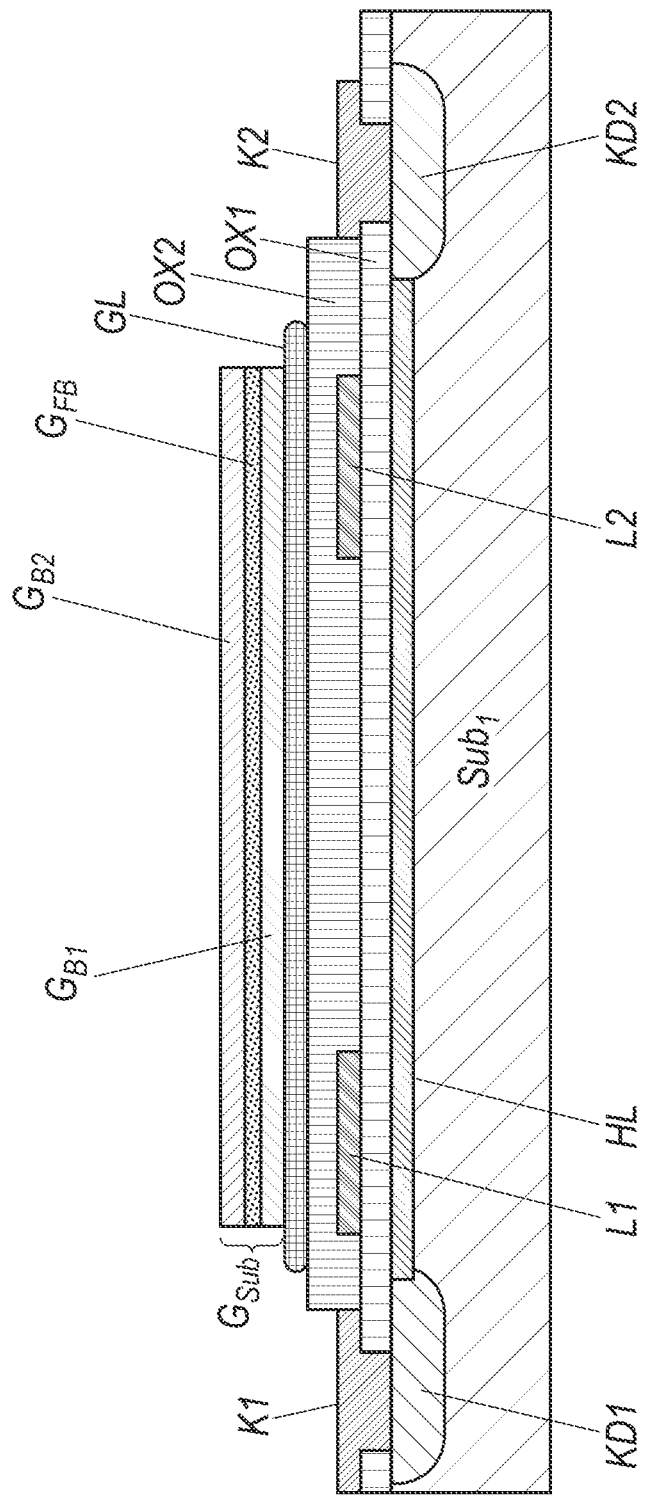

The structure shown in FIG. 15 is based on that of FIG. 14. In contrast to FIG. 14, FIG. 15 shows a more complex metallization stack now. This consists of a first insulating layer, preferably a first oxide (OX1), which is preferably a gate oxide, and a second insulating layer (OX2), preferably a second oxide. Between the first insulation layer (OX1) and the second insulation layer (OX2) are two exemplary interconnection lines (L1, L2). There is now an interaction between the current flow in the interconnects (L1, L2) and the room temperature superconducting border region ($G_G$) or the interface ($G_F$) of the boundary region ($G_{FB}$) of the substrate $G_{sub}$. The inductance coating of the interconnects (L1, L2) is changed by the proximity of the room temperature superconducting border region ($G_G$) of the substrate ($G_{sub}$). More complex metallization stacks and doping structures within the carrier (Sub$_1$) are of course possible.

Figure 16:
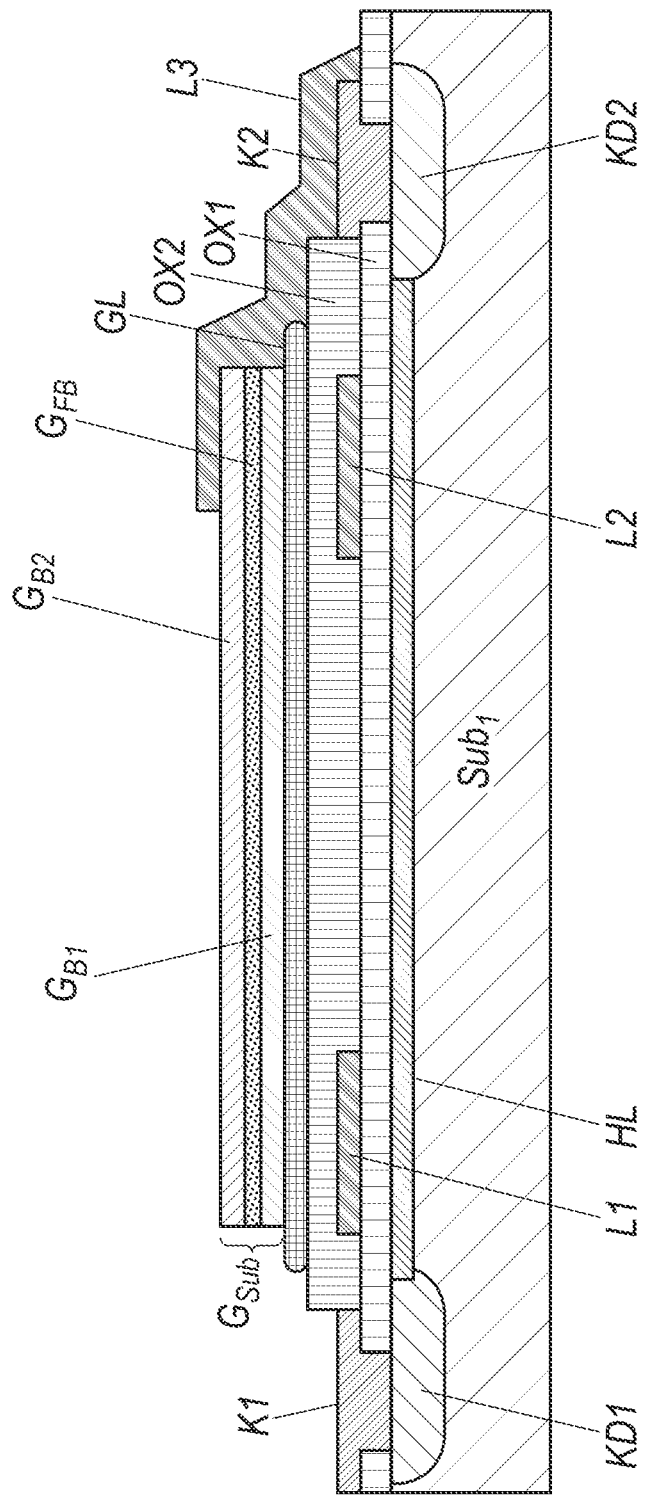

FIG. 16 corresponds to FIG. 15 with the difference that the substrate ($G_{sub}$) is now photolithographically connected via a third interconnect (L3). In the example, the substrate ($G_{sub}$) is exemplarily electrically connected to the second contact (K2). This prevents the substrate ($G_{sub}$) from being able to charge statically.

Figure 17:
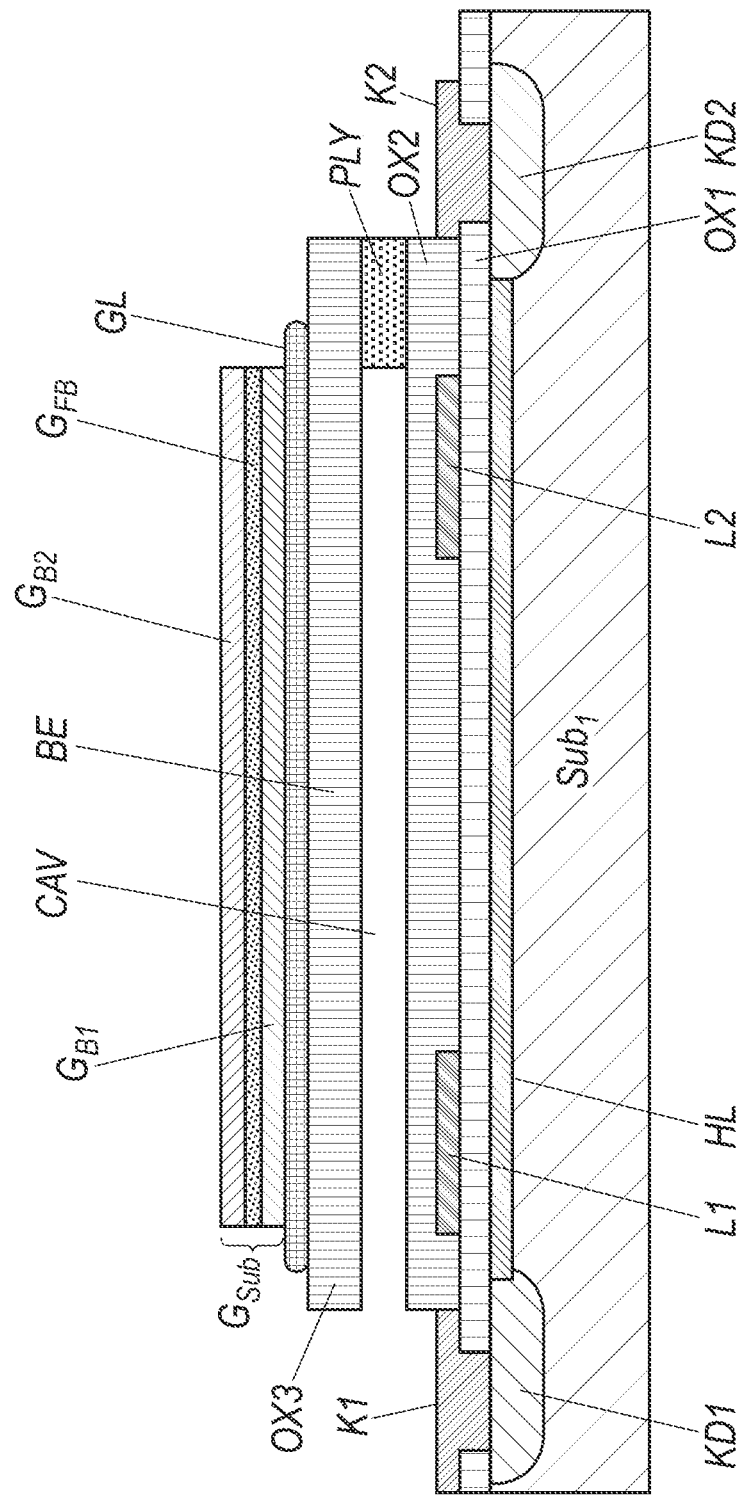

FIG. 17 schematically shows an exemplary combined microfluidic/micromechanical device with a (eg semiconductor) substrate as carrier (Sub$_1$). The metallization stack of FIG. 15 is made more complex in order to carry out the micromechanical and microfluidic subdevices in the metallization stack in this example. It is known from the prior art that the implementation of micromechanical/microfluidic components can also take place in the substrate of the carrier (Sub$_1$). For example, the metallization stack can include layers of metals (such as titanium, tungsten, gold, platinum, aluminum, iron, niobium, vanadium, manganese, etc.), insulators (such as siliconnitide, silicon oxide, etc.), amorphous or polycrystalline semiconductor layers (such as polycrystalline silicon—also called poly—or amorphous silicon or monocrystalline silicon or other corresponding semiconductor materials, in particular III/V materials and II/VI materials). This layer stack may therefore be generated at least in part by bonding different substrates to one another. In the example of FIG. 17, a first insulator layer (OX1), a second insulator layer (OX2) and a third insulator layer (OX3) and a polycrystalline silicon layer (PLY) are provided. In the example of FIG. 17, the polycrystalline silicon layer in subregions of the surface of the device below the third insulator layer (OX3) is removed by surface micromechanical methods now. This can be done for example by etching gases, as known in the art. With suitable structuring, a micromechanical beam (BE) can be generated, which can be electrostatically excited to vibrate, for example via the Hall structure (HL) or the exemplary conduction lines (L1, L2). It is known from the prior art that such a beam has a vibration quality which depends on the pressure of the residual gas in its surroundings. The vibration behavior also depends on the interaction between the room temperature superconducting substrate ($G_{sub}$) and the other electrically conductive subdevices (L1, L2, HL, Sub$_1$). The beam is thus also a microfluidic element which interacts with the gaseous fluid of its environment. Its efficiency is indeed reduced in liquids, but also works in principle. The use in conjunction with a pressure cell in a pressure sensor, in particular an absolute pressure sensor, is therefore also conceivable. For this purpose, the cavity (CAV) of FIG. 17 only needs to be completely closed by the exemplary poly-silicon. This is shown in FIG. 18.

Figure 18:
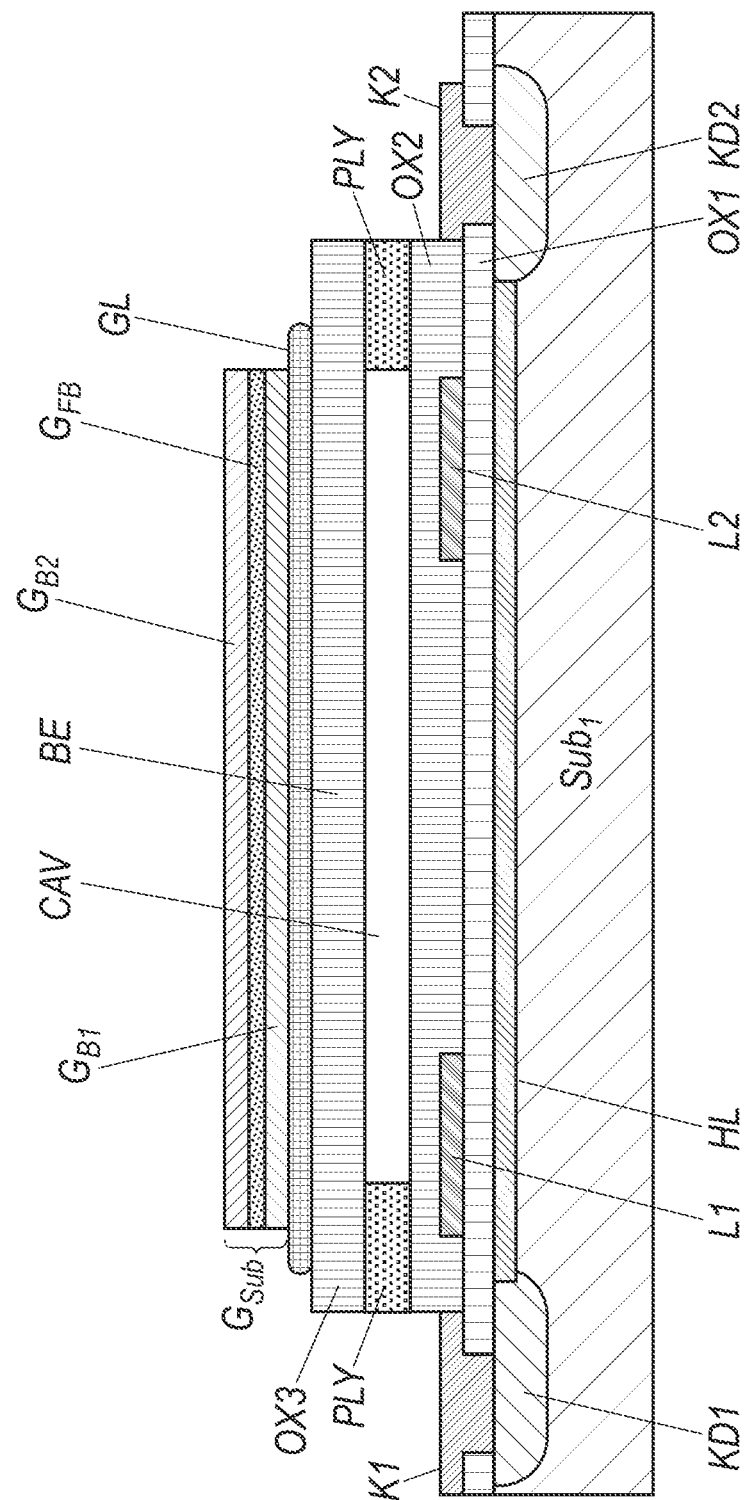

FIG. 18 corresponds to FIG. 17 with a closed cavity (CAV), for example for an absolute pressure sensor or a microfluidic component.

Figure 19:
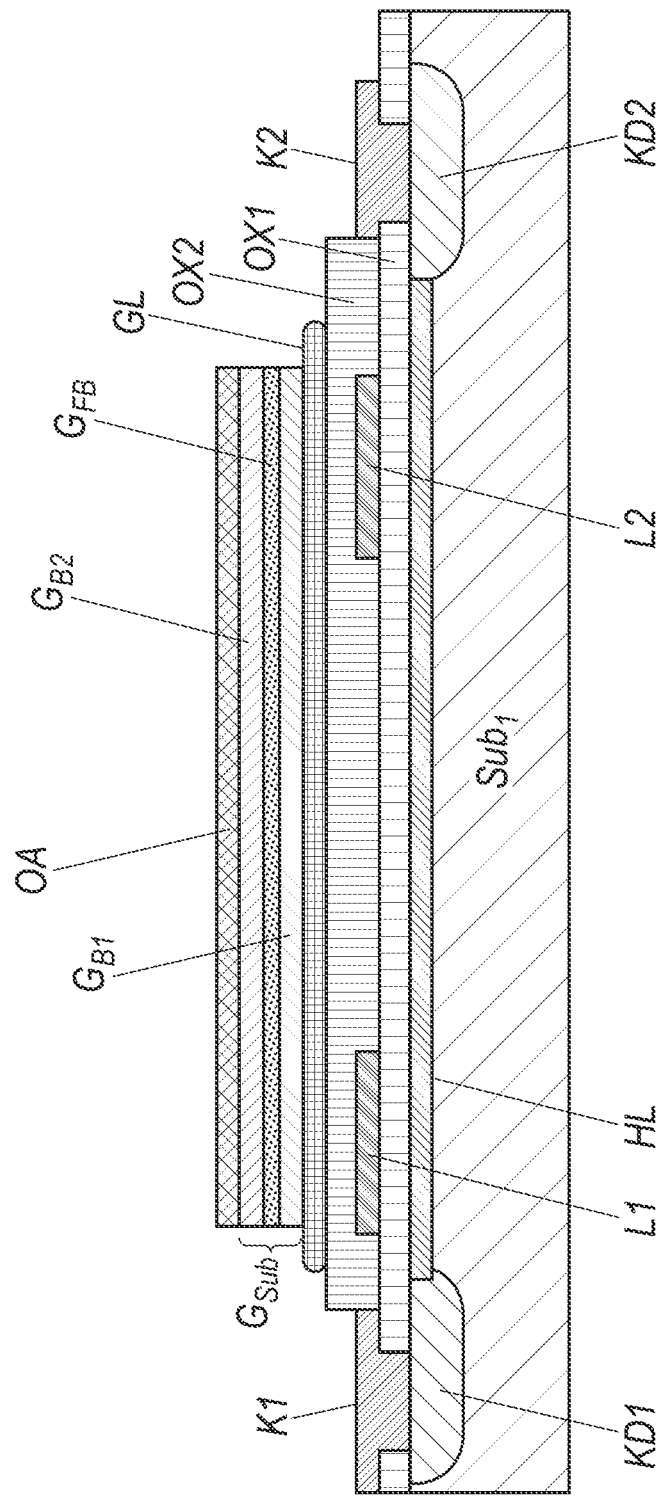

FIG. 19 corresponds to FIG. 15, with the difference that an optically active layer (OA) is applied which exhibits an electro-optical effect which interacts with the magnetic field of the room-temperature superconducting substrate ($G_{sub}$). This interaction can be observed optically or used for the modification of optical radiation which falls on the optically active layer (OA) and is reflected there. In the latter case, it is expedient to insert a reflection layer between optically active layer (OA) and the substrate ($G_{sub}$) superconducting at room temperature.

Figure 20:
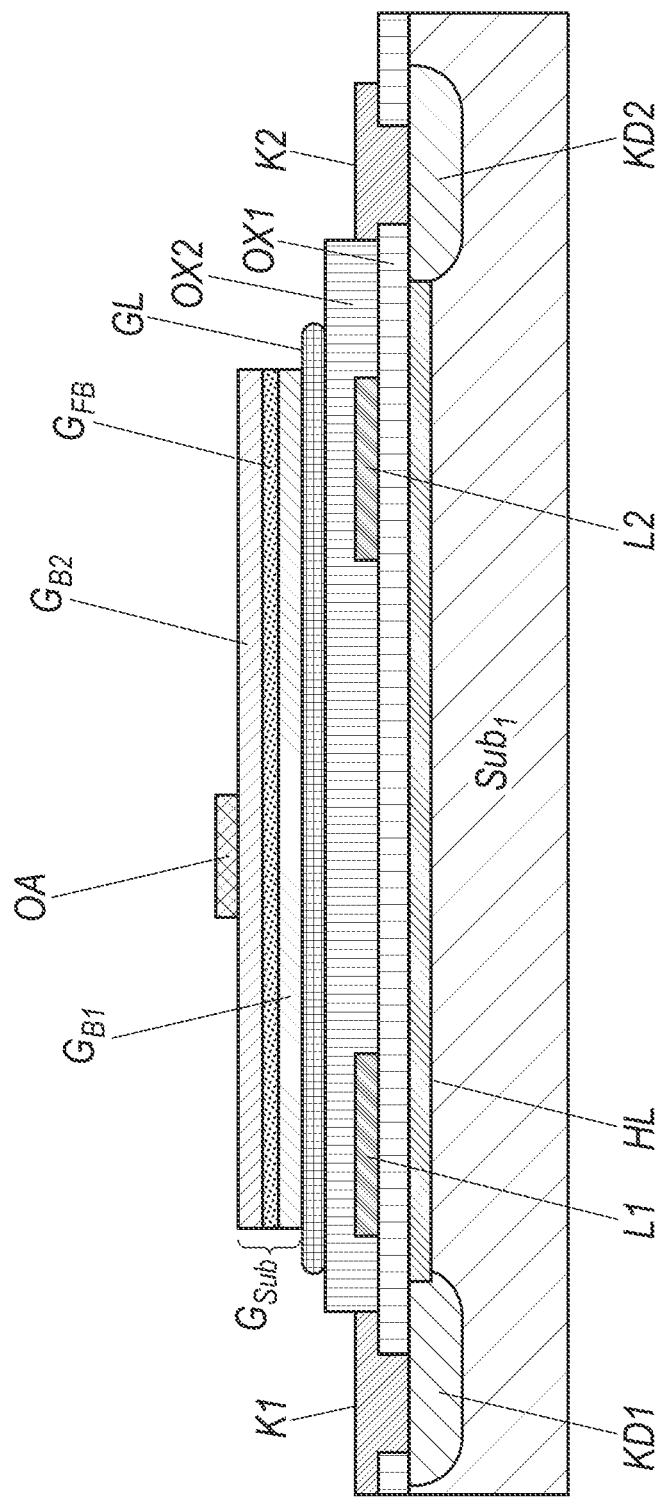

FIG. 20 corresponds to FIG. 19 with the difference that the optically active layer (OA) is now designed as an electro-optically active section of an optical waveguide (OA). The figure shows this section schematically as a schematic diagram in cross section. The light is guided perpendicular to the image plane in the optical waveguide. In this way, it is possible to construct a magneto-optical switch which, by means of the Kerr effect in an optical waveguide section which is embodied in the form of an electro-optically active section, modulates the phase of the light in the optical waveguide or the transit time of the light through this section of the optical waveguide. The special feature is that the substrate superconducting at room temperature ($G_{sub}$) can generate a magnetic field that can affect this portion of the optical waveguide. As a result, light switches can be built, which only need a short-term control for switching.

Figure 21A:
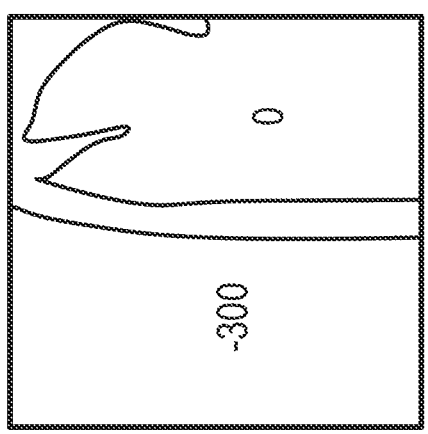
Figure 21B:
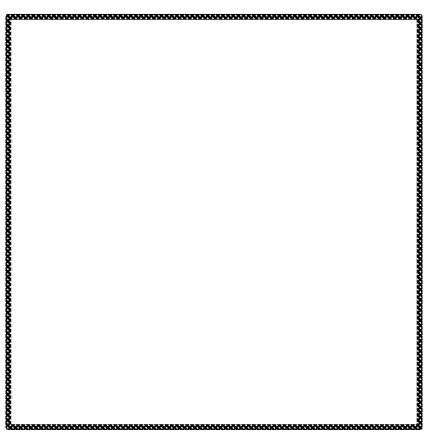
Figure 21C:
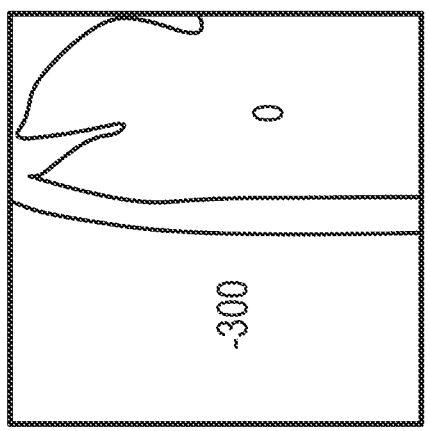
Figure 21D:
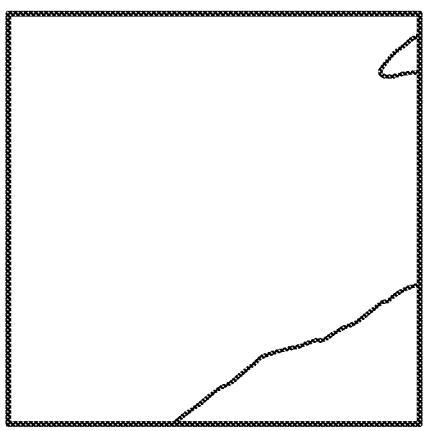
Figure 21E:
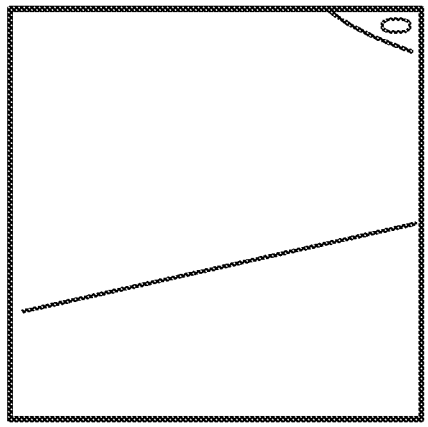
Figure 21F:
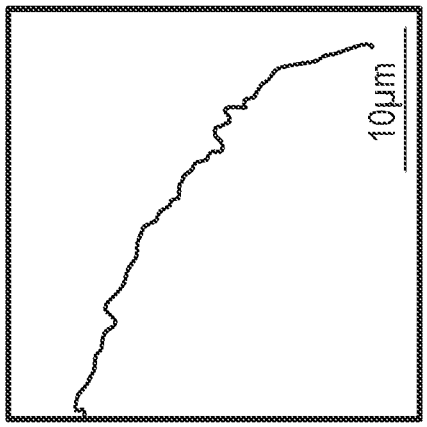
Figure 22:
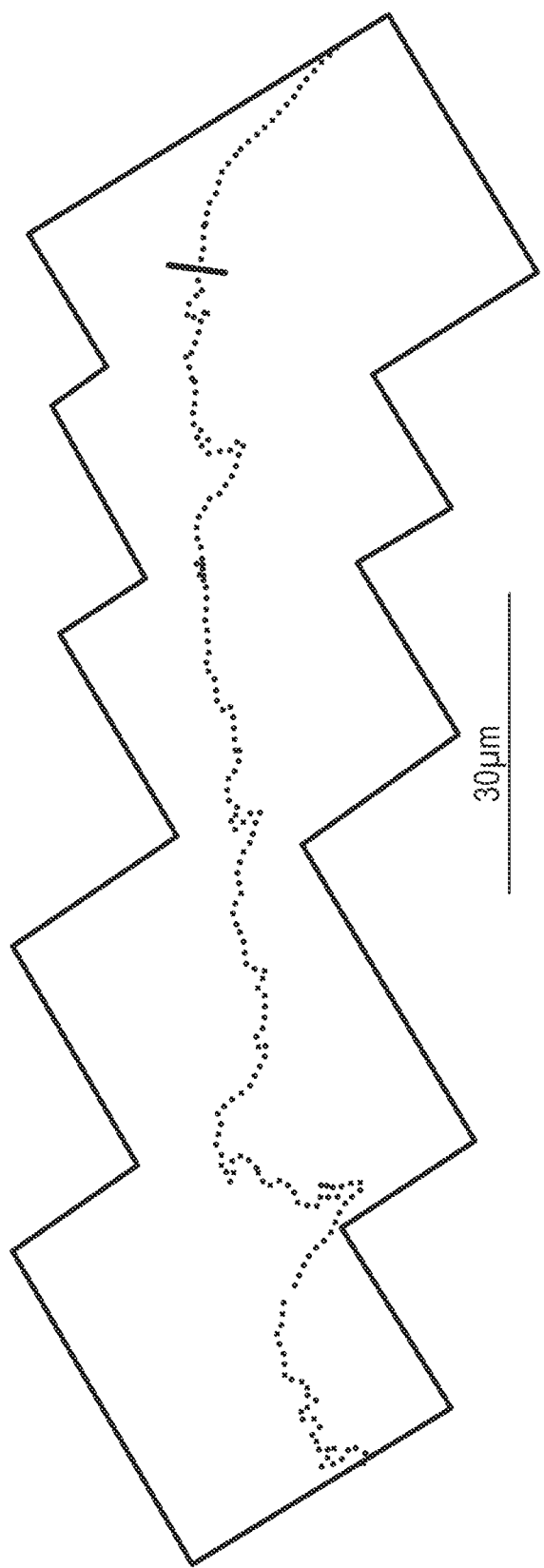
Figure 23:
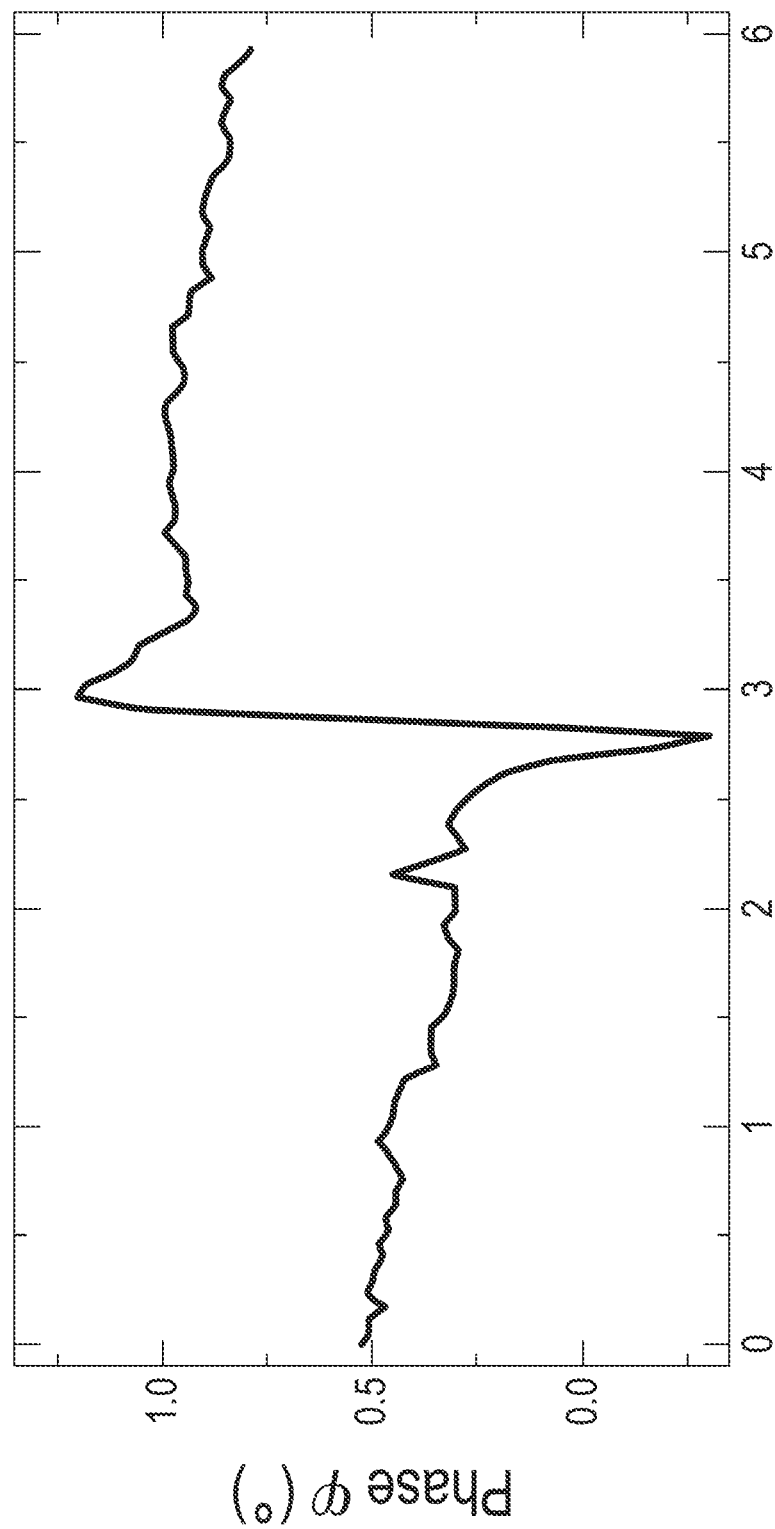

FIGS. 21 to 23 show schematic diagrams for material measurement.

Figure 1:
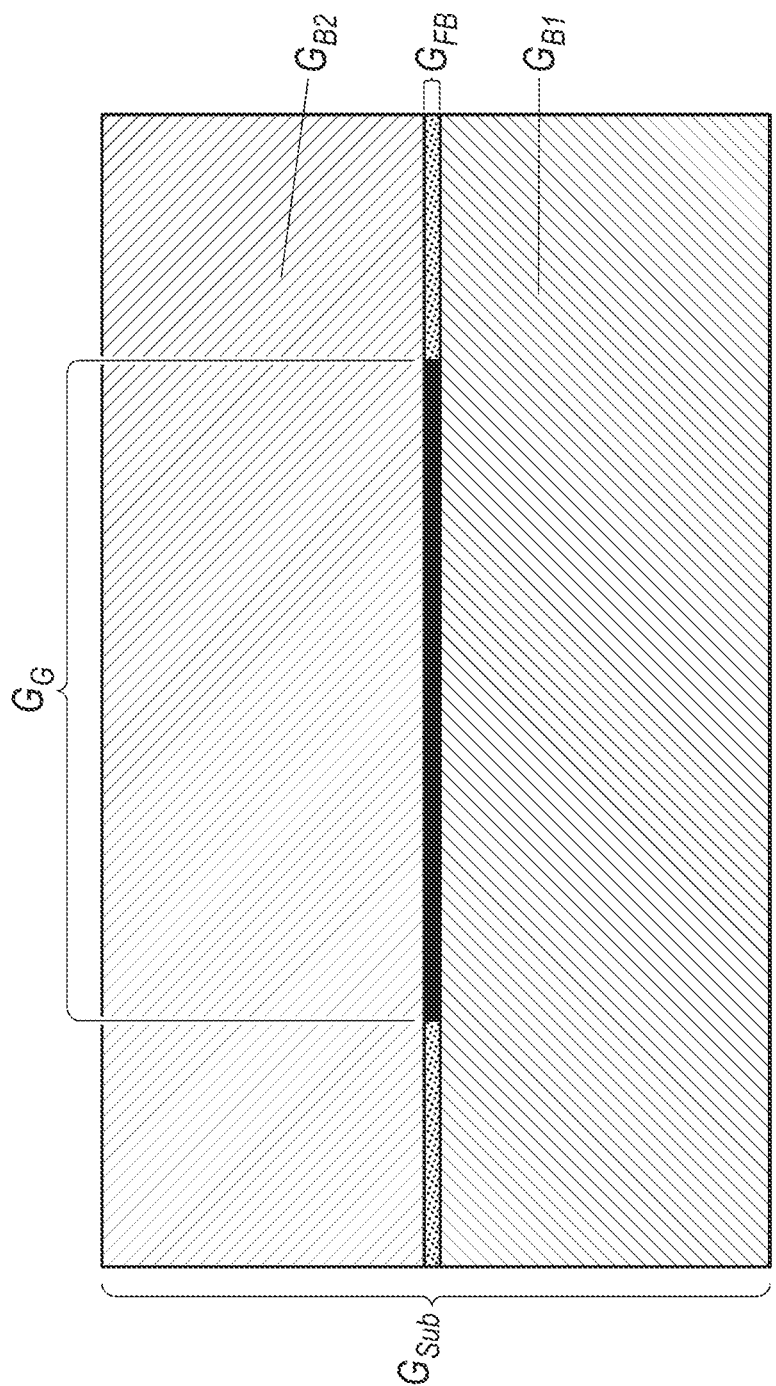
FIG. 1 shows the first step of providing (1) a substrate ($G_{sub}$) with a first layer region ($G_{B1}$) and a second layer region ($G_{B2}$) and an interface ($G_{FB}$). In a preferred embodiment, for example, the first layer region ($G_{B1}$) consist of bernal graphite and the second layer region ($G_{B2}$) consist of rhombohedral graphite.
Figure 2:
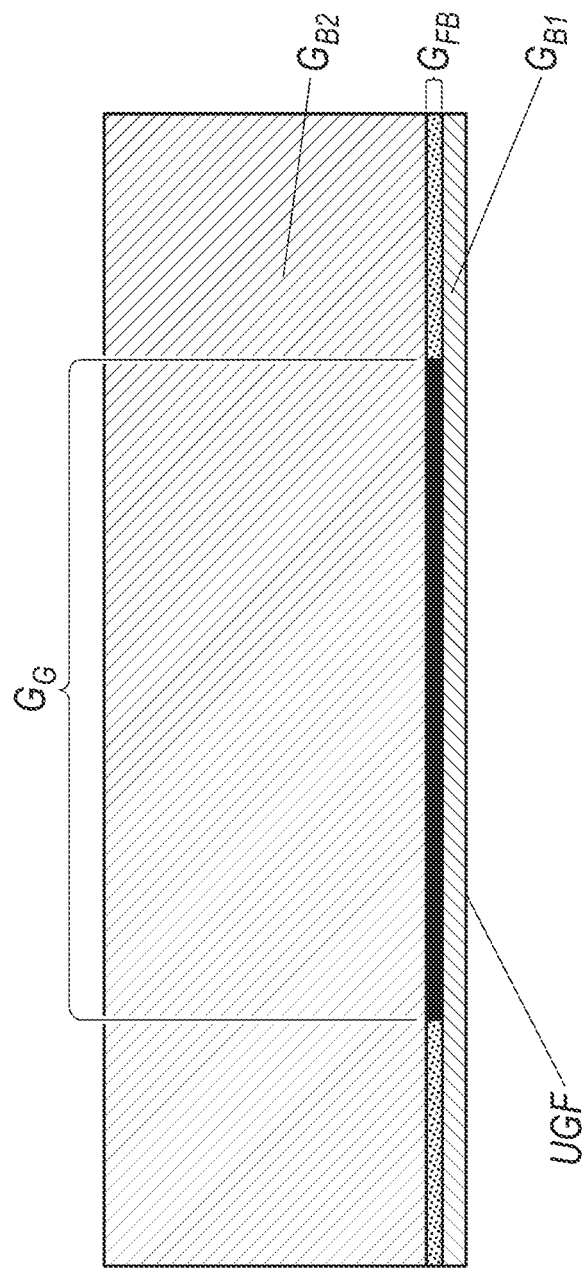
FIG. 2 shows a first preferred step of processing the substrate ($G_{sub}$) of FIG. 1 with the third step of thinning (3) of a "relevant" layer area ($G_{B1}$, $G_{B2}$), here the first layer area ($G_{B1}$) and the creation of a lower boundary surface ($U_{GF}$) parallel to the border region ($G_{FB}$) after completing the determination (2) of the orientation of the surface normal of the graphene layers of the boundary region ($G_{FB}$) within the substrate ($G_{sub}$) as a second process step.
Figure 3:
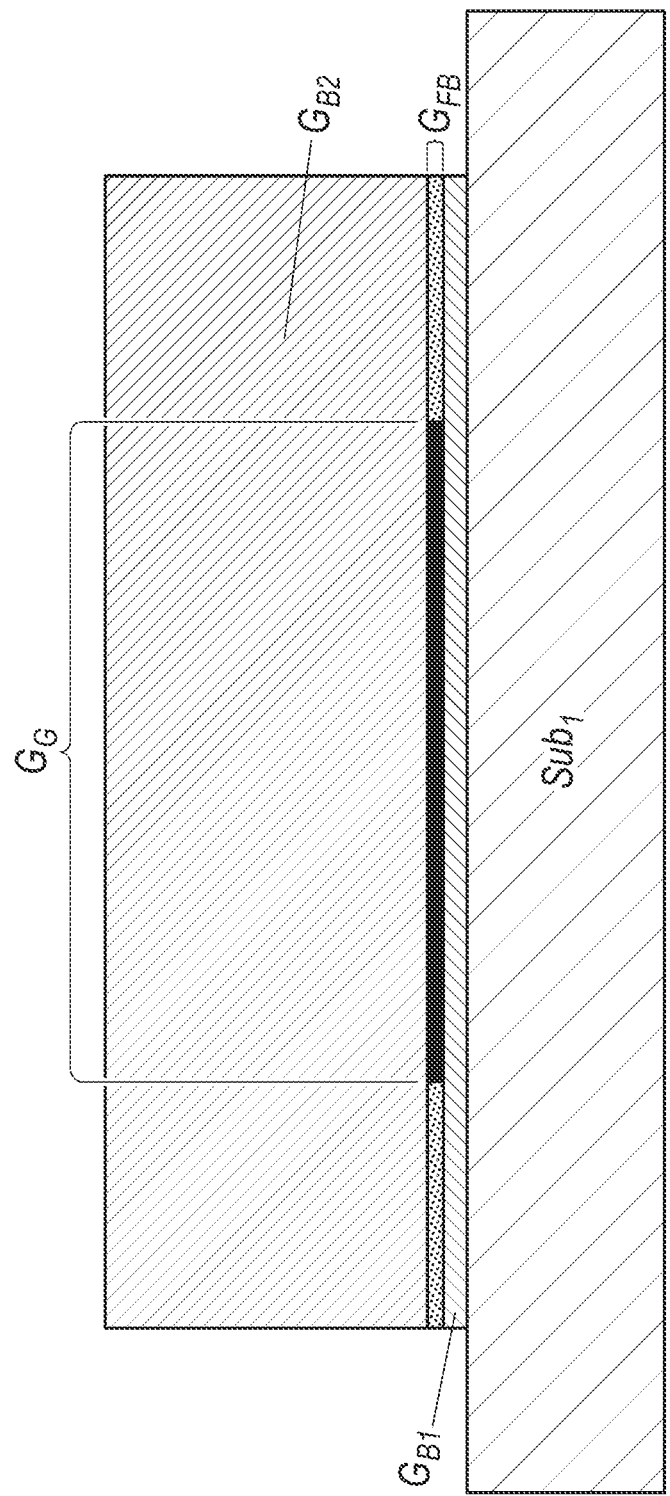
FIG. 3 shows the preferred step of attaching (5) the preferably thinned substrate ($G_{sub}$) of FIG. 2 to the surface (OF) of the carrier ($Sub_1$) by applying (4) and fixing the preferably thinned substrate ($G_{sub}$) to the surface (OF) of a carrier ($Sub_1$). This application can be done for example by glueing by means of a not shown here adhesive (GL). The assembly can be done for example by a temperature treatment the adhesive for fixing. Possibly, both steps can also be carried out in one step, if the temperature treatment of the exemplary adhesive is not necessary due to its properties.

FIGS. 21 to 23 are taken from the text by Markus Stiller, Pablo D. Esquinazi, Christian Precker, and Jose Barzola-Quiquia "Local magnetic measurements of permanent current paths in a natural graphite crystal", J. Low Temp. Phys. 191, 105-121 (2018) and are schematized vs. the original artwork. FIG. 21 corresponds to the colored FIG. 1, figure. 22 corresponds to the colored FIG. 2*b*, and FIG. 23 corresponds to FIG. 2*c* of the publication The content of this document is more complete with respect to the methods and materials used part of the invention.

FIG. 21 shows the properties of a natural graphite suitable for use in such devices and methods as described herein. The use of this type of graphite for the described devices and methods is expressly within the scope of the present invention. In particular, the use of graphite from Sri Lanka is claimed. FIG. 21 shows the topography of a suitable graphite sample in the subFIGS. 21*a*, 21*c*, 21*e* measured by means of a MFM. It further shows the measured phase in the subFIGS. 21*b*, 21*d*, 21*f*. The pair of sub-FIGS. 21*a*, 21*b* shows topography and phase for the original sample in the original state. The sub-pair of FIGS. 21*c*, 21*d*; 21*e*, 21*f* showed the topography and the phase after the application of a magnetic field. The phase shows a signal after the sample has been exposed to a magnetic field. Therefore, the method for finding suitable substrates with the following steps is part of the invention:

Providing a substrate for room temperature superconductivity testing, in particular for convenience at a temperature higher than −40° C.;

Exposing the substrate to a magnetic field, with more than 0.5 better more than 1 T, better more than 2 T, better more than 4 T, better more than 8 T.

Measuring a region with an MFM to locate a line current;

Particularly preferably, the region is measured before the application of the magnetic field in order to be able to measure the changes.

A re-measurement of a region with a line current is recommended after a rest time of more than 5 minutes and/or more than an hour and/or more than a day and/or more than a week better one month to re-confirm the superconductivity.

The subFIGS. 21*d* and 21*f* show the jump of the magnetic field in the form of a jagged step across the image.

FIG. 22 shows a sequence of several images of the phase measured with the MFM. It can be clearly seen that these are large-scale structures.

FIG. 23 shows the jump of the phase measured transversely to one of the lines to be recognized in FIGS. 21*d*, 21*f* and 22 (line currents). The 1/r dependence in the vicinity of the edge and the freezing of the magnetic flux on one side of the line current can be seen (r stands for the distance from the respective line, which can be seen in said figures).

Hereinafter, figures for material construction according to various embodiments of the invention will be described.

Figure 24:
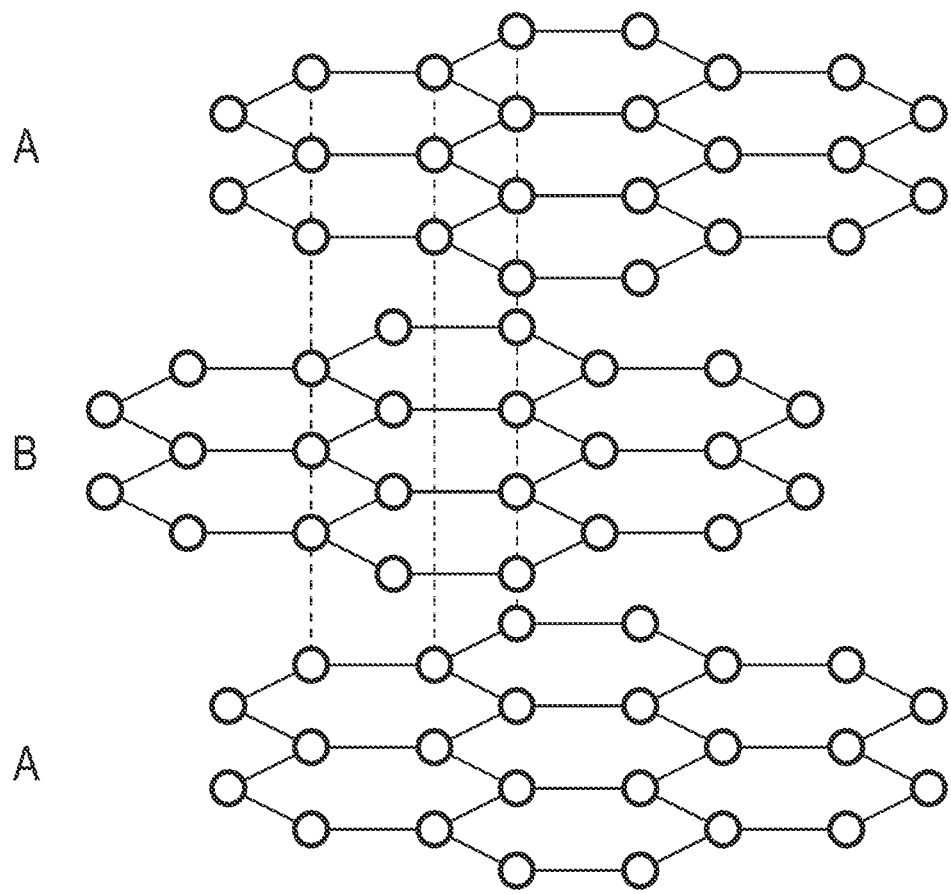

FIG. 24 schematically shows a bernal crystal structure of graphite according to the prior art.

Figure 25:
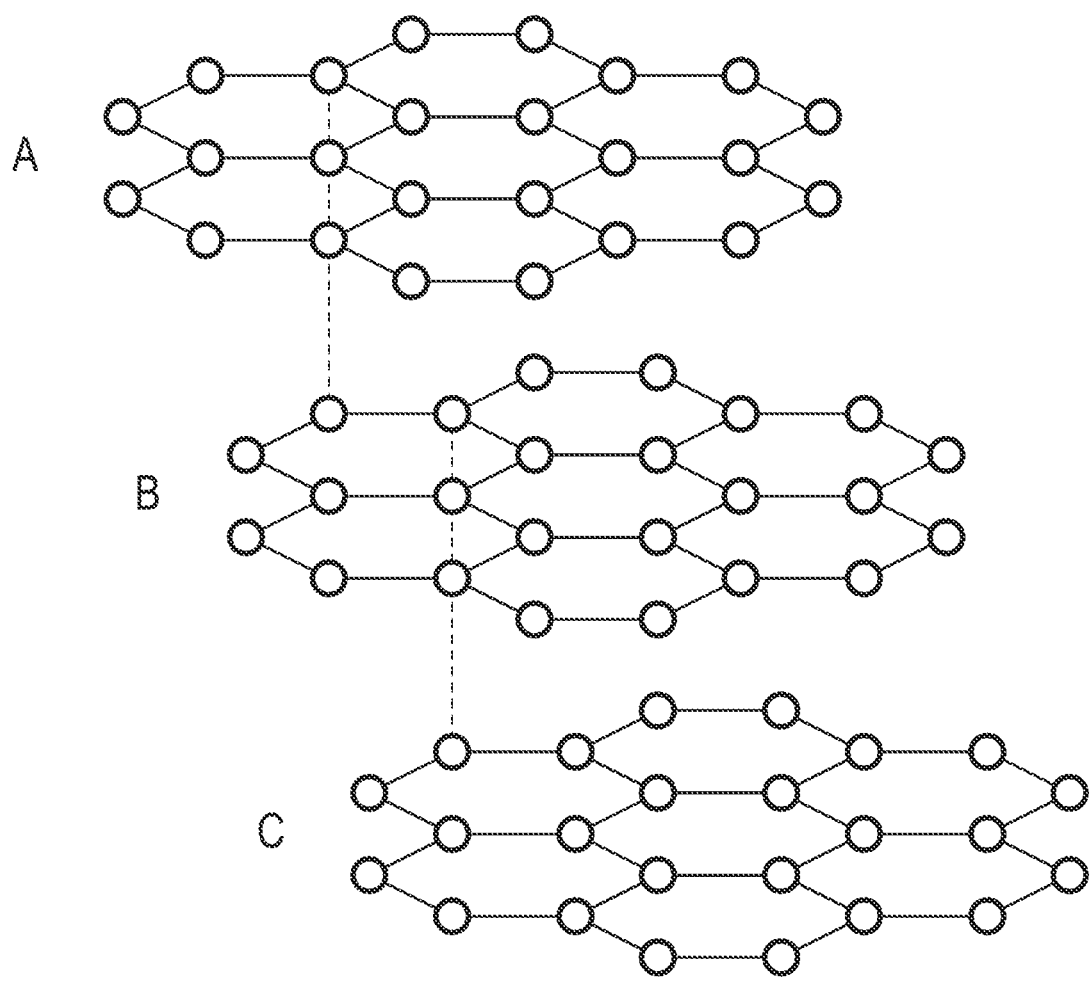

FIG. 25 schematically shows a rhombohedral crystal structure of graphite according to the prior art.

Figure 26:
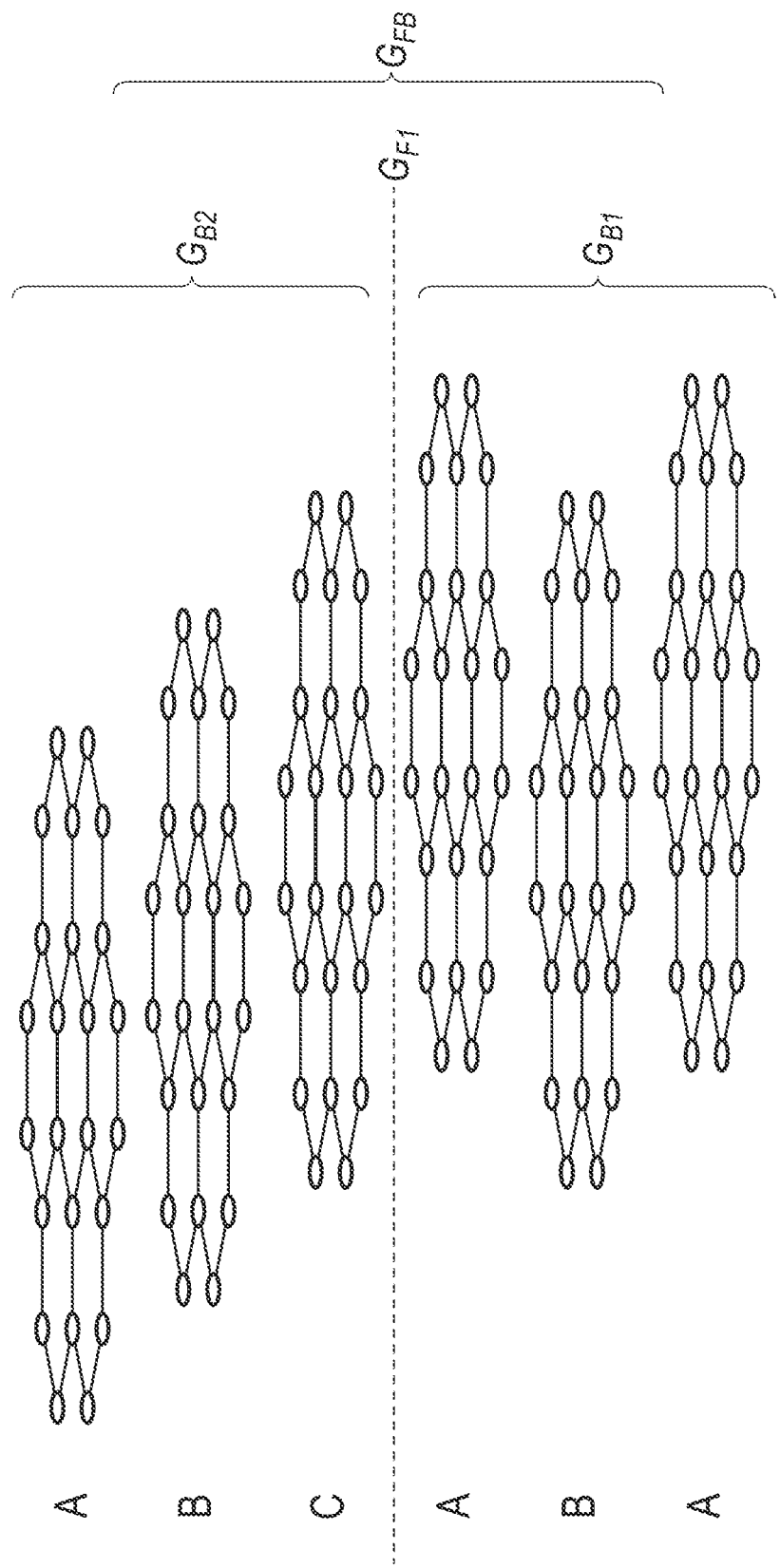

FIG. 26 shows schematically the contact between a rhombohedral crystal structure of graphite in the upper three graphene planes as second layer region ($G_{B2}$) and a bernal graphene structure in the lower three graphene planes as first layer region ($G_{B1}$). Other graph layers are conceivable as a continuation up and down. FIG. 26 corresponds to the structure of the graphene planes of FIG. 1, which shows a combination of a rhombohedral layer region and a bernal layer region.

Figure 27:
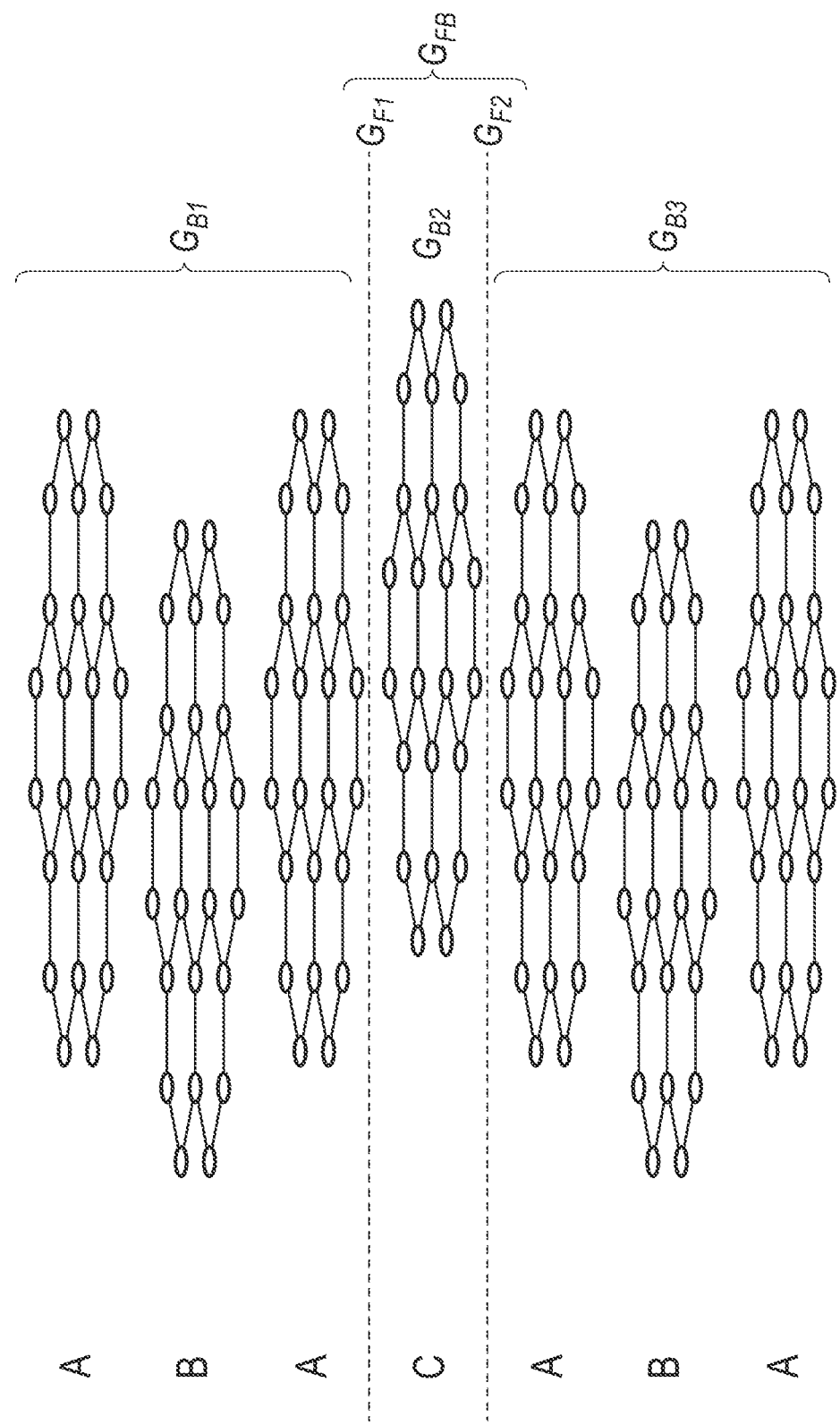

FIG. 27 shows another example of the generation of an overall stacking sequence by inserting a single graphene layer as the second layer region ($G_{B2}$) into a bernal graphite crystal having a first layer region ($G_{B1}$) and a third layer region ($G_{B3}$). In the example, a single rhombohedral graphene layer is placed as a second layer region ($G_{B2}$) between two bernal graphene layer regions (the first layer region ($G_{B1}$) and the third layer region ($G_{B3}$)). In this sense, the structure of FIG. 27 has two interfaces ($G_{F1}$, $G_{F2}$) or border regions within a boundary region ($G_{FB}$).

Figure 28:
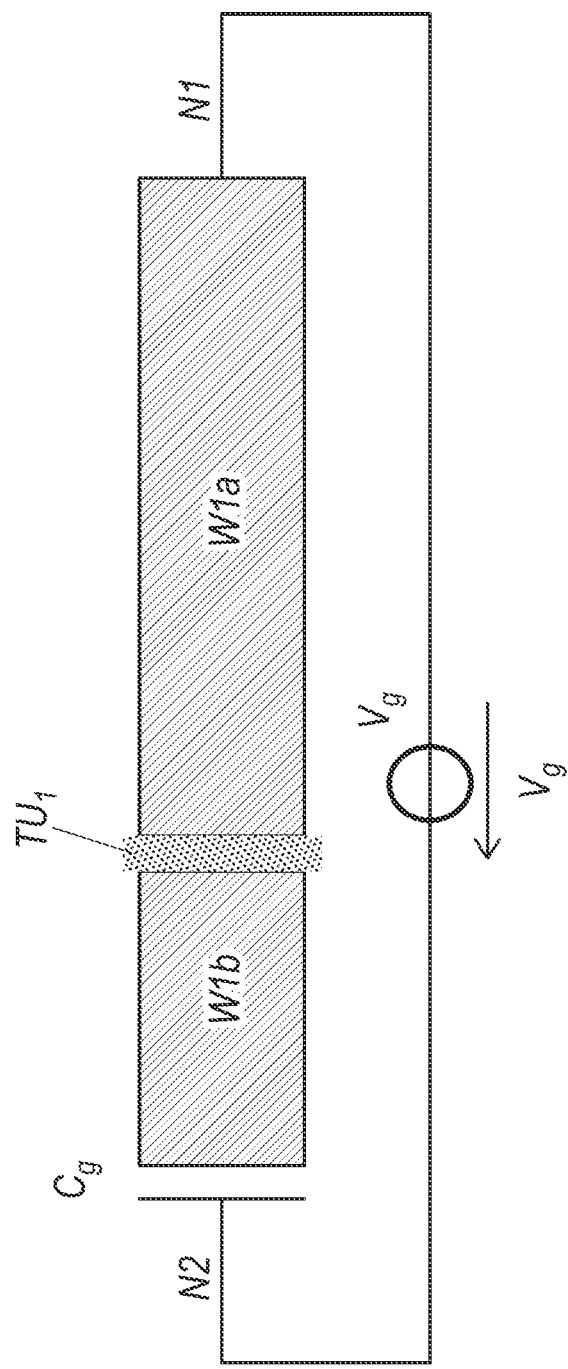

FIG. 28 schematically shows a simple arrangement for a Cooper pair box for a single Cooper pair, as already known, for example, from V. Bouchiat "Quantum Coherence with a Single Cooperable Pair", Physica Scripta, Vol. T76, 165-170, FIG. 1, 1998 for normal superconductors. The conductor (W) is divided by a first phase-introducing weak point ($TU_1$) (English Josephson Juction) in a first conduction line section (W1*a*) and a second conduction line section (W1*b*) of an electrical line. The first conduction line section (W1*b*) is contacted via a first electrical node (N1). The second line section is capacitively contacted via a coupling capacitor ($C_g$). The other pole of the coupling capacity ($C_g$) is preferably electrically contacted via a second electrical node (N2). By means of a control voltage ($V_g$), the occupation of the energy states in the Cooper pair box formed by the second line section (W1*b*) can be controlled. In contrast to the prior art, it is proposed that the material of the first and second line sections (W1*a*, W1*b*) is formed by a material having superconducting properties at least in subregions, the border regions ($G_G$), in accordance with the invention. The component proposed here is a charge Q-bit. In this context, reference should be made to Xiu Gua "Microwave photonics with superconducting quantum circuits" arXiv: 1707.02046v2 [quant-ph] 19 Oct. 2017.

Figure 29:
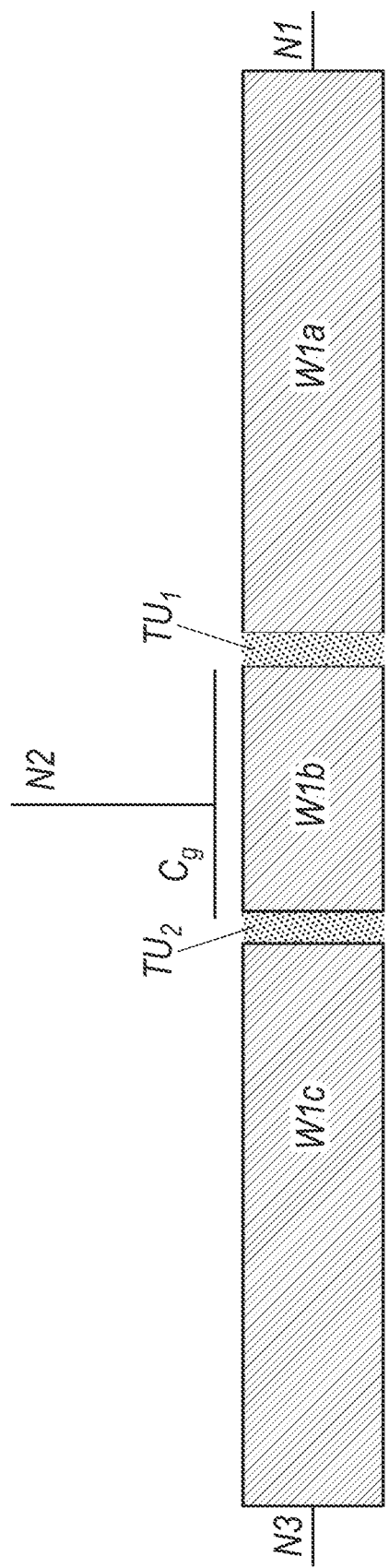

FIG. 29 illustrates an extension of the basic principle of a Cooper pair box illustrated in FIG. 28. The Cooper pair box is again formed by the second conduction line section (W1*b*). However, this Cooper pair box has three ports instead of two. The conductor (W) is again divided in contrast to the prior art by a first phase shift introductory weak point ($TU_1$) and a second phase shift introductory weak point ($TU_2$) into a first conduction line section (W1*a*), a second conduction line section (W1*b*) and a third divided conduction line section (W1*c*). Such a phase-shifting vulnerability is typically a Josephson junction. The first conduction line section (W1*a*) is contacted via a first electrical node (N1). The third conduction line section (W1*c*) is contacted via a third electrical node (N3). The Cooper pair box in the form of the second conduction line section (W1*b*) is capacitively connected via a coupling capacitor ($C_g$)

For example, from Caspar H. van der Wal et al. "Quantum Superposition of Macroscopic Persistent Current States" Science Vol. 290, 27 Oct. 2000, pages 773-777 is known for superconductors of the prior art that the previously in FIGS. 13, 28 and 29 and in the following FIG. 33 described quantum interference components can be interconnected to form more complex circuits. Such interconnections based on conventional superconductors are also known, for example, from U.S. Pat. No. 6,838,694 B2. In contrast to the prior art, however, it is proposed here to produce such interconnections from quantum interference components which have at least one sub-device which has superconducting properties in the sense of the invention.

The individual use of such superconducting quantum interference components from the prior art is known, for example, from V. Bouchiat "Single Cooper Pair Electronics "Applied Superconductivity Vol. 6, Nos 10±12, pp. 491-494, 1998 and AB Zorin," Cooper-pair qubit and Cooper-pair electrometer in one device", arXiv: cond-mat/0112351 [cond-mat.supr-con], 19 Dec. 2001 and Michel H. Devoret and Robert J. Schoelkopf "Amplifying quantum signals with the single-electron transistor" Nature, Vol. 406, 31 Aug. 2000.

In contrast to the prior art, it is proposed according to the invention that the material of the first, second and third conduction line sections (W1a, W1b, W1c) is formed by a material that exhibits, at least in subregions, the border regions ($G_G$), superconducting properties in the sense of the invention.

Figure 30A:
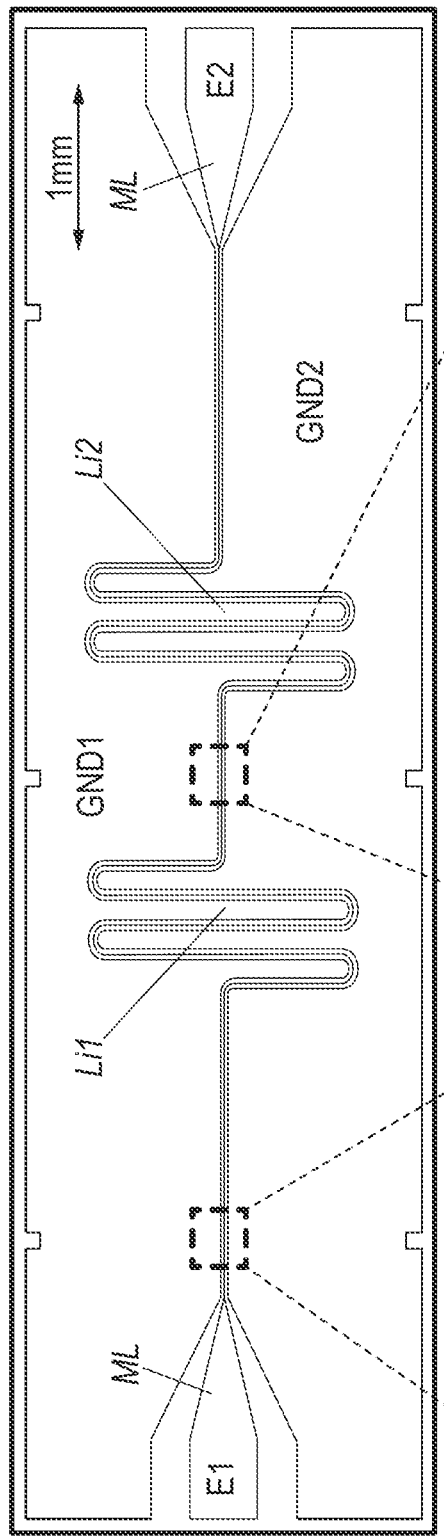
Figure 30C:
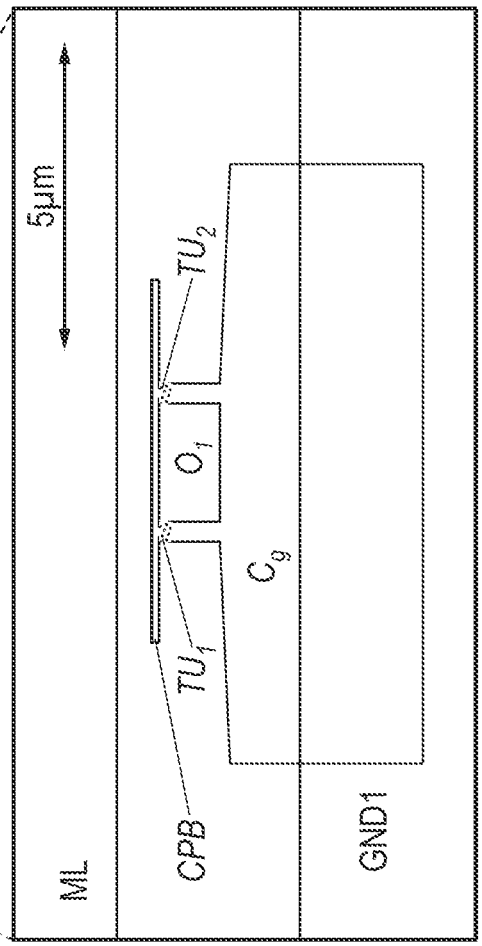

FIG. 30 shows a flux Q-bit (English flux qbit).

FIG. 30 shows another useful technical application. It is known for superconductors of the prior art, for example, from the following documents: Robert J Schoelkopf, Steven M. Girvin "Experiments in Quantum Coherence and Computation with Single Cooper-Pair Electronics" US Army Report 2006, A. Wallraff et al. "Circuit Quantum Electrodynamics: Coherent Coupling of a Single Photon to a Cooper Pair Box" arXiv: cond-mat/0407325v1 [cond.mes-hall] 13 Jul. 2004, M. Goppl et al., "Coplanar Waveguide Resonators for Circuit Quantum Electrodynamics" arXiv: 0807.4094v1 [cond-mat.supr-con] 25 Jul. 2008, Luigi Frunzio et al. "Fabrication and characterization of superconducting circuit QED devices for quantum computation" arXiv: cond-mat/0411708v1 [cond-mat.supr-con] 28 Nov. 2004, and Alexandre Blais et al., "Cavity quantum electrodynamics for superconducting electrical circuits: an architecture for quantum computation", arXiv: cond-mat/0402216v1 [cond.mes-hall] 7 Feb. 2004. These are a flux Q-bit (English flux qbit). In this context, reference should also be made to Xiu Gua "Microwave Photonics with Superconducting Quantum Circuits" arXiv: 1707.02046v2 [quant-ph] 19 Oct. 2017.

Instead of a conventional superconductor, a graphene stack with a suitably selected stacking sequence of the graphene layers, according to one of the previously described variants with superconducting properties within a boundary region or an interface according to the invention, is used. The graphene stack preferably exhibits superconducting properties at room temperature, at least in a partial region, the border region ($G_G$).

Figure 30B:
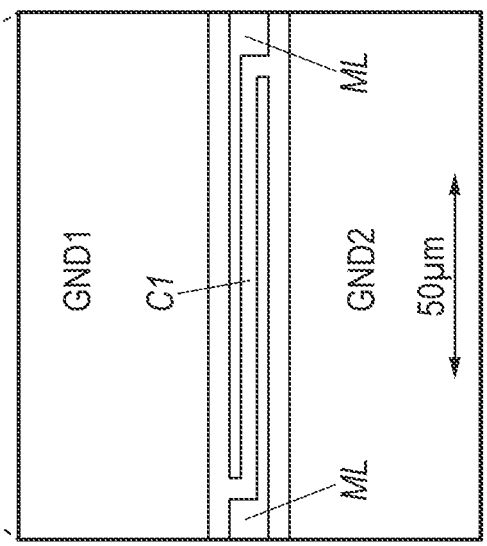

The graphene layer package is applied electrically insulated to a carrier ($Sub_1$). The graphene layer package is preferably structured by photolithography. The layer packet is divided by the structuring by a structured triplate microstrip line into a first ground plate (GND1) and a second ground plate (GND2). These ground plates (GND1, GND2) represent two of the three conductors of the triplate microstrip line. Between them there is a structured center conductor (ML) separate from them. At the input and output points (E1, E2) for the microwave signal, the center conductor is widened for adaptation to a coaxial connection cable. The center conductor (ML) consists of the material of the graphene layer package. The center conductor (ML) is preferably produced during the structuring of the graphene layer package. In the example of FIG. 30, the center conductor is interrupted at one point by a capacitor (C1). This is shown in detail in FIG. 30b. By turns of the triplate line, two inductors (Li1, Li2) are incorporated into the conduction line in the example. At one point between these inductors (Li1, Li2), a Cooper pair box is installed in one of the two slots between the center conductor (ML) and the two ground plates (GND1, GND2). In this example, the Cooper pair box is built into the space between the center conductor (ML) and the first ground plane (GND1). The Cooper Pair Box (CPB) is formed by a single conduction line. It corresponds to the second conduction line section (W1b) of the two preceding figures. The Cooper-pair-box (CPB) is connected via two conduction lines, each having a phase shift introducing weak point (TU1, TU2), with the coupling area of a coupling capacitor ($C_g$). In addition, this device part has an opening (O1), via which an inductive coupling to the B field of the electromagnetic wave in the waveguide can take place. The Cooper Pair Box is also capacitively coupled to the center conductor. It is also conceivable to realize only these parts of the device using the proposed graphene stack. The material of the Cooper pair box and around the opening (O1) is superconducting in the sense of the invention.

Figure 31:
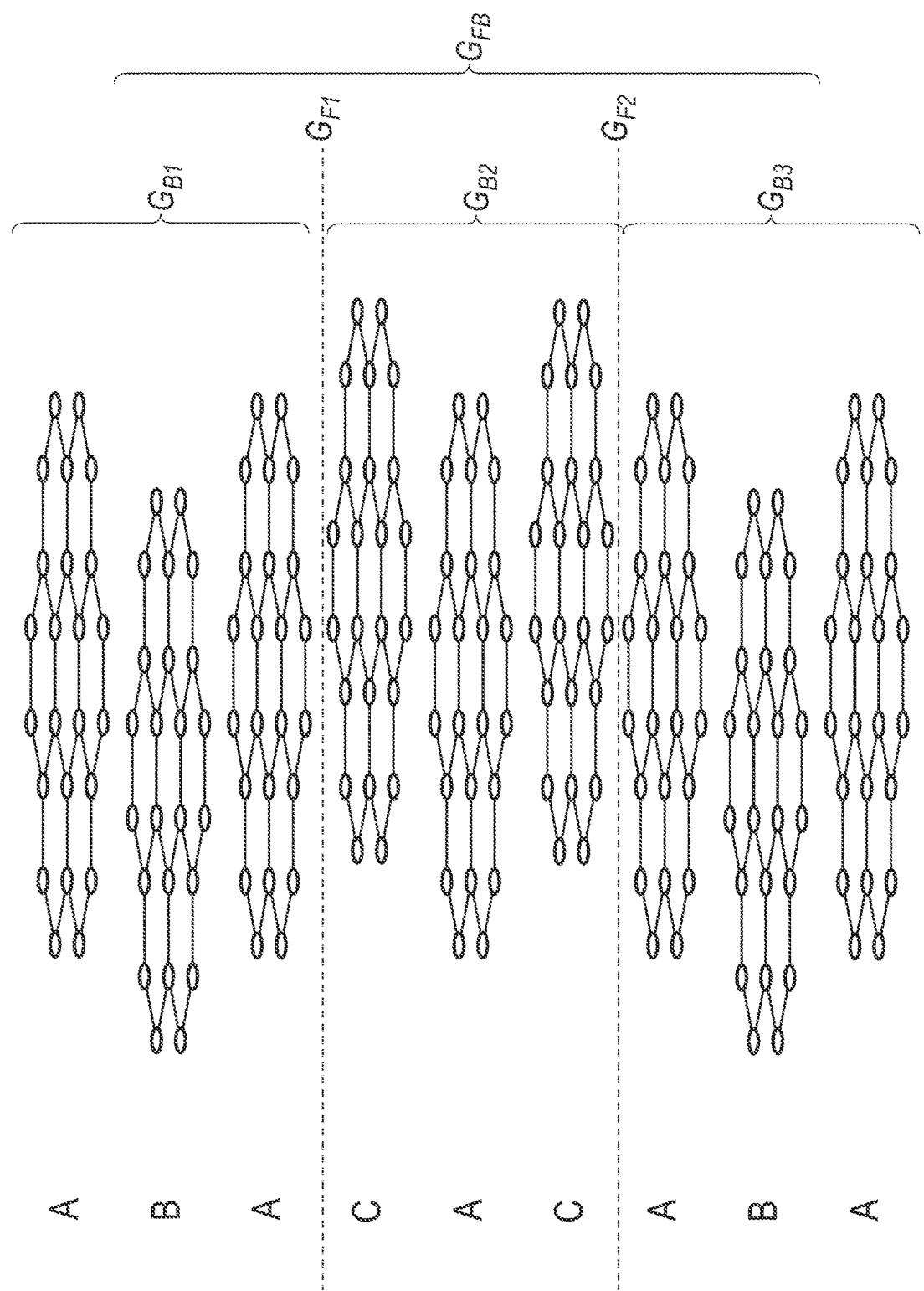

FIG. 31 shows another example. In the example, a third, here by way of example a bernal graphene layer packet ($G_{B2}$), is placed between two also exemplary bernale graphene layer packets ($G_{B1}$, $G_{B3}$). In this sense, the structure of FIG. 31 has two interfaces ($G_{F1}$, $G_{F2}$) or, in general, border regions within the boundary region ($G_{FB}$).

Figure 32:
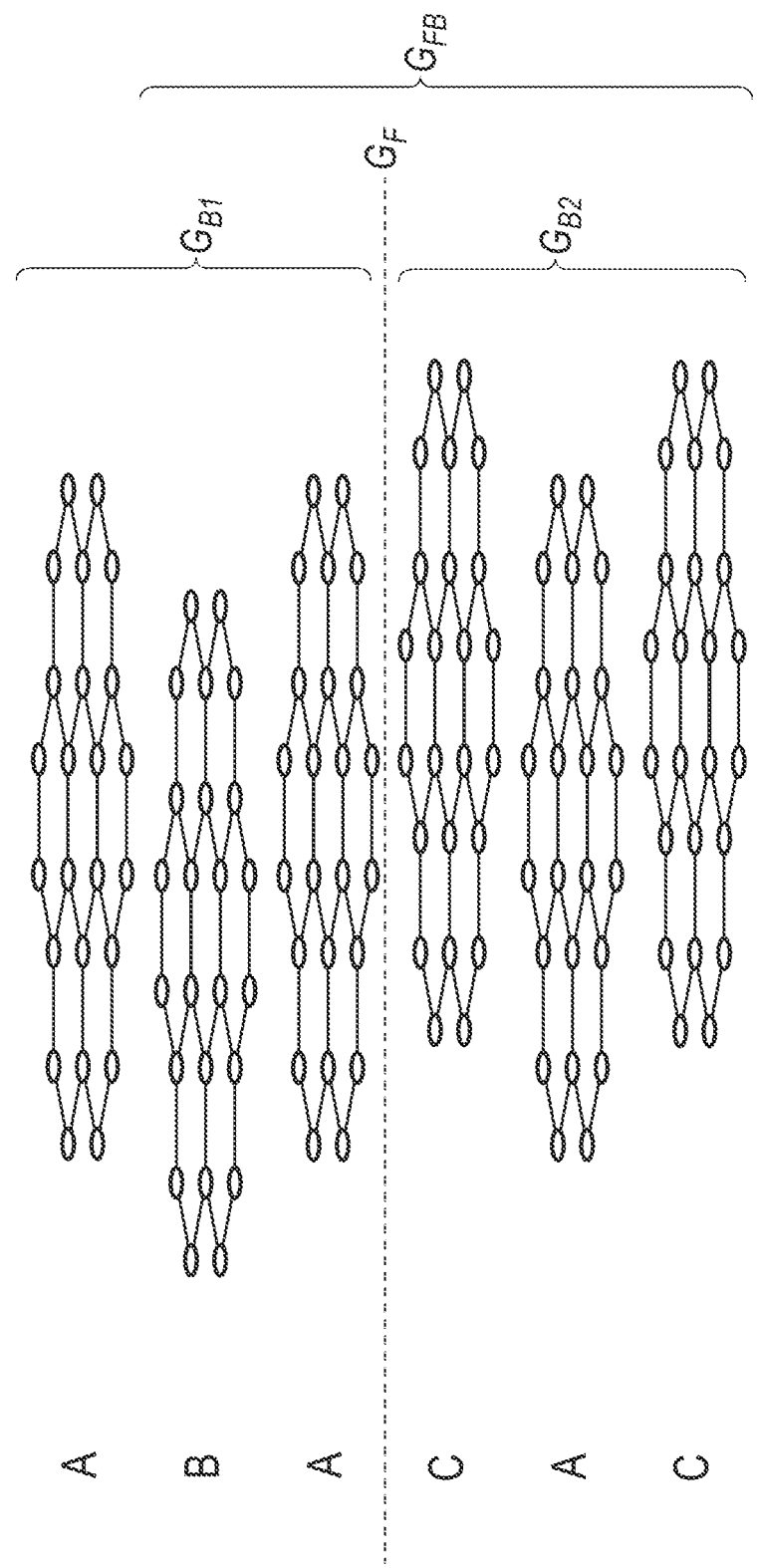

FIG. 32 shows another example. In the example, two exemplary bernal graphene layer packages ($G_{B1}$, $G_{B2}$) are placed in translatory and/or rotational offset from one another. In this sense, the structure of FIG. 32 has an interface ($G_F$).

Figure 33:
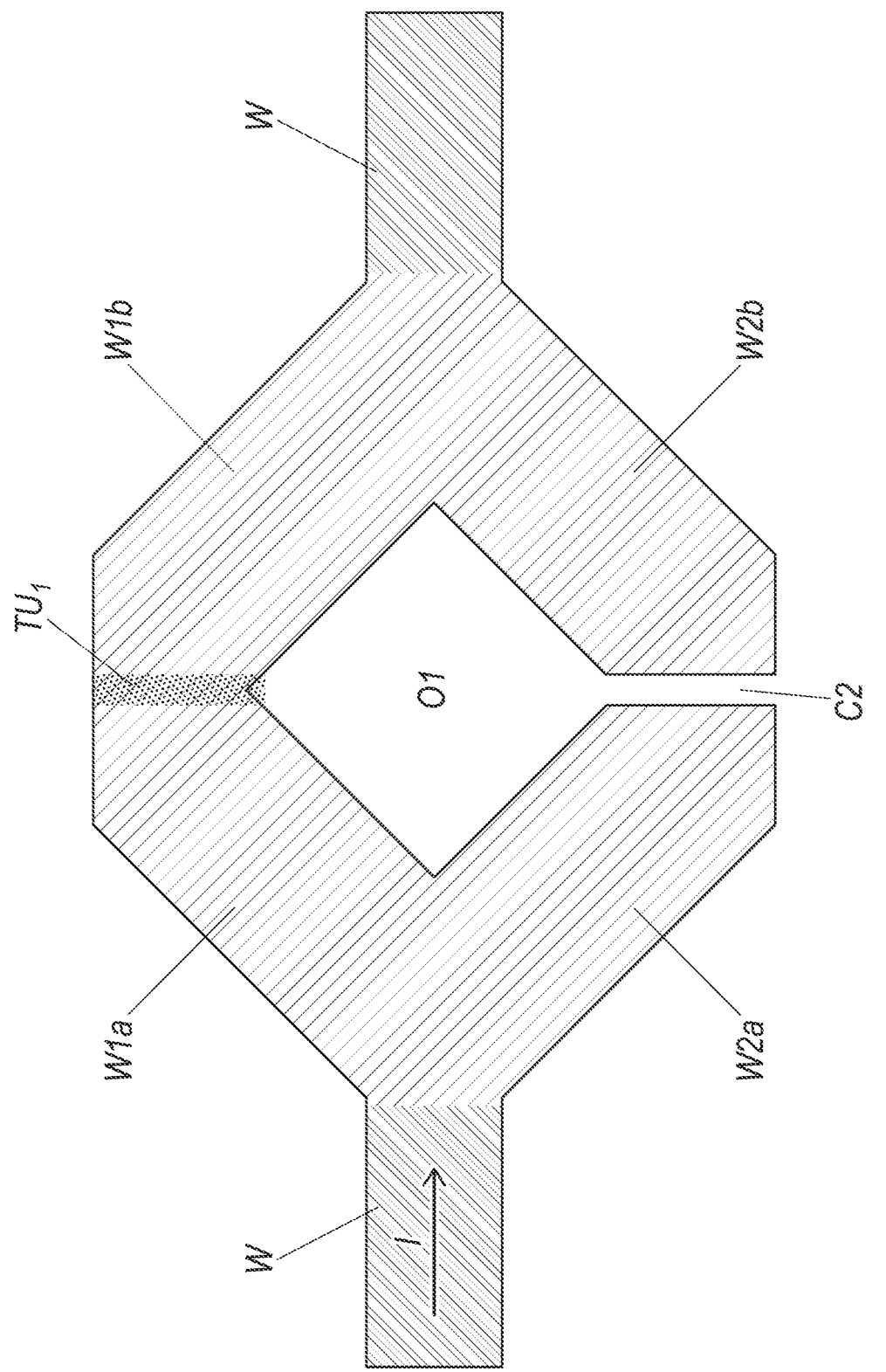

FIG. 33 shows the exemplary electrical component (SQUID) based on the Josephson contact of FIG. 12 in plan view. The first substrate ($G_{sub}$) is structured such that an annular structure results, wherein the ring is not completely closed in contrast to FIG. 13. Of the two branches, the first branch (W1a, W1b) is interrupted by a Josephson diode in the form of a first phase-modulating tunnel element ($TU_1$). With current flow (I), the voltage drop also depends on the magnetic field perpendicular to the drawing plane. The second branch (W2a, W2b) is interrupted by a gap in the second branch (W2a, W2b), so that a second capacitance (C2) results, which causes a further phase shift.

FIG. 34 shows in plan view an exemplary metamaterial, i. e. a material whose the propagation of electrical, magnetic, electromagnetic fields and waves as well as acoustic waves and plasma waves describing parameters differ from that normally found in nature. The metamaterial is applied to a non-subscribed carrier ($Sub_1$) and structured. The metamaterial consists of an exemplary two-dimensional arrangement of n"m metamaterial substructures ($MTS_{i,j}$) with n and m as the whole positive number and $1 \leq i \leq n$ and $1 \leq j \leq n$. Three-dimensional arrangements of $l*n*m$ metamaterial substructures ($MTS_{i,j,k}$) with l and n and m as a positive integer number and $1 \leq k \leq l$ and $1 \leq i \leq n$ and $1 \leq j \leq m$ are conceivable. As such, FIG. 34 is just one example of a proposed metamaterial. Each metamaterial structural part comprises a conductor structure ($W_{i,j}$) where the indices i and j are the x and y position within the two-dimensional arrangement of n*m metamaterial substructures ($MTS_{i,j}$), i.e. represent the position in a first and in a second direction. Analogously, in a three-dimensional arrangement of $l*n*m$ metamaterial substructures ($MTS_{i,j,k}$), the additional index k would indicate the position in the z direction, i.e. in the direction of the third coordinate. Such a metamaterial with a two-dimensional arrangement of n"m metamaterial substructures ($MTS_{i,j}$) is characterized in that it preferably has a two-dimensional periodicity, i.e. it represents a two-dimensional lattice. Analogously, a three-dimensional arrangement of $l*n*m$ metamaterial substructures ($MTS_{i,j,k}$) has a three-dimensional periodicity and thus represents a three-dimensional grid. In the example of FIG. 34, a sheet-like metamaterial is shown with, by exemplaric 4×4 metamaterial substructures ($MTS_{i,j}$). This means that the indices of j and i are in the range between 1 and 4, whereas the interval limits for these two intervals are included.

Preferably, each of the metamaterial substructures ($MTS_{i,j}$) exhibits at least one associated conductor ($W_{i,j}$). This is preferably a superconductor in the context of the invention. Particularly preferably, adjacent metamaterial substructures ($MTS_{i,j}$) are ohmically coupled to one another by direct contact, magnetically via coupling magnetic fields and/or capacitively via capacitances. The metamaterial substructures ($MTS_{i,j}$) can have openings, in particular for magnetic coupling. The topological genus of its shape in supervision can therefore deviate from 0. However, the coupling can also be achieved, as in the example of FIG. 34, by a weak point ($TU_{i,j}$) per metamaterial substructure ($MTS_{i,j}$) which introduces a phase shift. In the example of FIG. 34, two weak points ($TU_{l,i,j}$, $TU_{o,i,j}$) are provided per metamaterial substructure ($MTS_{i,j}$). Hereby, within the exemplary metamaterial, each metamaterial substructure ($MTS_{i,j}$) is connected with four other metamaterial substructures ($MTS_{(i+1),j}$, $MTS_{(i-1),j}$, $MTS_{(i,j+1)}$, $MTS_{i,(j-1)}$) via four respective phase shift introducing weak points ($TU_{l,i,j}$, $TU_{o,i,j}$, $TU_{l,i,(j-1)}$, $TU_{o(i+1),j}$). It is conceivable to preferably spatially periodically replace individual or all phase shift introducing weak points ($TU_{l,i,j}$, $TU_{o,i,j}$, $TU_{l,i,(j-1)}$, $TU_{o(i+1),j}$) by means of said ohmic connections, coupling capacitances, etc.

In the example of FIG. 34, the four metamaterial substructures each ($MTS_{i,j}$, $MTS_{(i+1),j}$, $MTS_{i,(j+1)}$, $MTS_{(i+1),(j+1)}$) form a structure leaving open an opening ($O_{i+1,j+1}$).

Ultimately, such a metamaterial is an electrical interconnection of electrical components to an overall circuit. If at least a part of the connections between the metamaterial substructures ($MTS_{i,j}$, $MTS_{(i+1),j}$, $MTS_{i,(j+1)}$, $MTS_{(i+1),(j+1)}$) are carried out as a phase shift introducing weak points ($TU_{l,i,j}$, $TU_{o,i,j}$, $TU_{l,i,(j-1)}$, $TU_{o,(i+1),j}$) as in the exemplary FIG. 34, it is an interconnection of quantum interference devices. Therefore, a metamaterial is proposed that consists of a spatially periodic three-dimensional interconnection of quantum interference components or quantum interference sub-devices, here the metamaterial substructures ($MTS_{i,j,k}$), or of a two-dimensional periodic two-dimensional interconnection of quantum interference components or quantum interference subdevices, here the metamaterial substructures ($MTS_{i,j}$). The spatial, e.g. three-dimensional or two-dimensional periodicity may in each case relate to a translational shift or a rotational rotation.

Figures 34A, 34B:
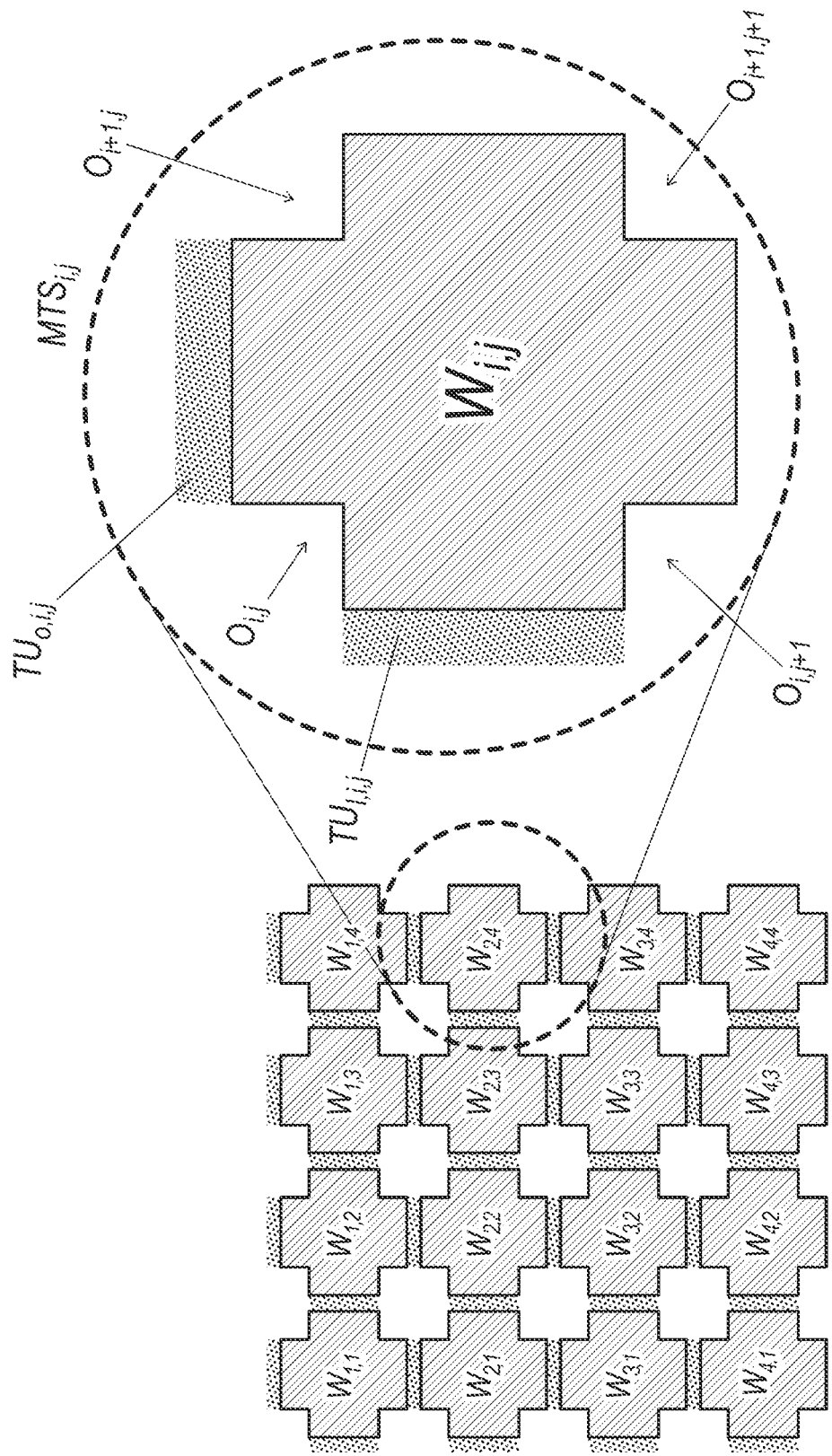

For the sake of completeness, the sub-FIG. 34a represents the exemplary two-dimensional arrangement of the metamaterial substructures ($MTS_{i,j}$). For a better overview, no reference numbers are entered for the respective weak points and the openings as well as the metamaterial substructures ($MTS_{i,j}$) which introduce a phase shift. Only the reference symbols of the conductors ($W_{i,j}$) are entered for overview. An exemplary meta-material substructures ($MTS_{i,j}$) has been singled out and enlarged in subFIG. 34b. This should represent all metamaterial substructures ($MTS_{i,j}$) within the metamaterial. Metamaterial substructures ($MTS_{i,j}$) on the edge (i=1 or i=n or j=1 or j=m) may differ in their structure depending on the definition of the metamaterial substructure ($MTS_{i,j}$). With sufficient size of the metamaterial, the resulting edge effects might be neglected as usual for metamaterials.

Figure 35:
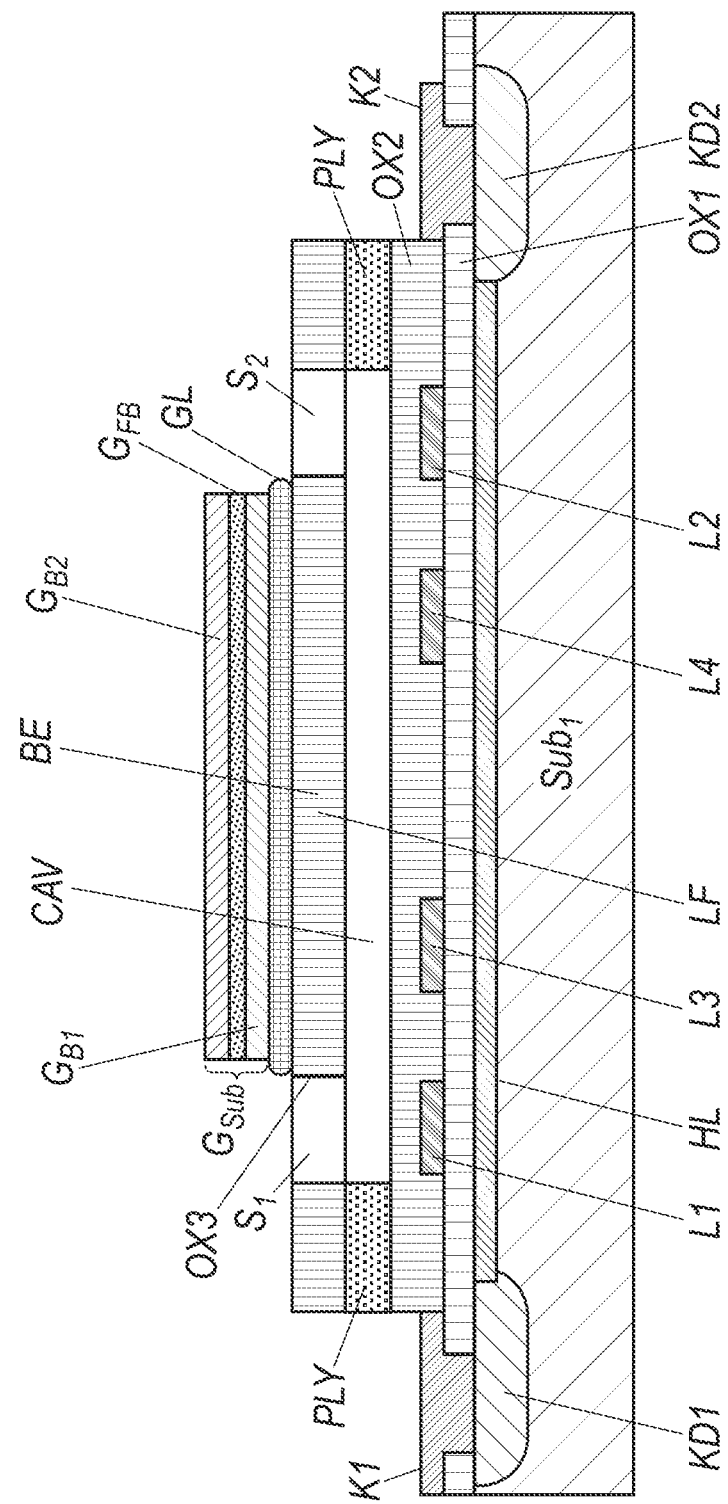

FIG. 35 schematically shows an exemplary combined micromechanical machine with an exemplary semiconductor substrate as carrier ($Sub_1$).

FIG. 35 schematically shows a simplified principle cross-section through an integrated microelectronic circuit which is manufactured in the carrier ($Sub_1$), which may be, for example, a piece of silicon wafer. For simplicity, this circuit is not further elaborated here. The micro-integrated circuit is protected by a metallization stack with typically several layers of insulator layers (OX1, OX2, OX3) and conductor layers (PLY, K1, K2). Other isolators than silicon oxide are conceivable. Also, whole metal/oxide stacks are conceivable as an insulator (OX).

As semiconducting structures, two contacts (K1, K2) are shown. It is known from the prior art that and how more complex semiconductor structures can be manufactured. The metallization stack is made more complex in order to carry out the micromechanical subsystems in the metallization stack in this example. It is known from the prior art that the implementation of micromechanical components can also take place in the substrate of the carrier ($Sub_1$). For example, the metallization stack may comprise layers of metals (such as titanium, tungsten, gold, platinum, aluminum, iron, niobium, vanadium, manganese, etc.), insulators (such as silicon nitride, silicon oxide, etc.). and/or of amorphous or polycrystalline semiconductor layers (such as polycrystalline silicon—also called poly) or amorphous silicon or monocrystalline silicon or other corresponding semiconductor materials, in particular VI-materials and/or III/V materials and/or II/VI materials). This layer stack can therefore, as known from the prior art, at least partially be generated by bonding different substrates to each other, in particular by bonding of glass and semiconductor substrates. In the example of FIG. 35, as in FIG. 17, a first insulator layer (OX1), a second insulator layer (OX2) and a third insulator layer (OX3) and a polycrystalline silicon layer (PLY) are provided. In the example of FIG. 35, the polycrystalline silicon layer in subregions of the surface of the device below the third insulator layer (OX3) is now removed by surface micromechanical methods. This may happen, as described above, for example, by etching gases, as known in the art. With suitable structuring, a micromechanical rotor (LF) of the proposed micromechanical machine can be generated, which is electrostatically excited to vibrate, for example via the exemplary conductor tracks (L1, L2, L3, L4). Instead of the electrostatic excitation, a parallel or substitutional magnetic excitation comes into question. The excitation of the micromechanical electric machine can also be effected by means of a mixing method between electrostatic and magnetic excitation. Subdevices of this exemplary electric machine may also be caused to oscillate by an external electromagnetic field and thus interact with other electronic and electrical subdevices. For example, it is conceivable to place a Hall sensor in its stator. In that case, a Hall plate (HL) placed in the carrier ($Sub_1$) below the rotor (LF) can help. This Hall plate can act as an electrostatic counter electrode to an electrode in the rotor.

For example, for an example current excitation, the first conductor line (L1) can be supplied with an electrical current of a first current amount in a first current direction and the third conductor line (L3) can be supplied with an electric current of the first current amount in a second current direction. The second current direction is opposite to the first current direction. The first conductor line (L1) is then the power supply line and the third trace (L3) is the power return line. The first conductor line (L1) and the third conductor line (L3) may then be considered as a first coil and generate a first magnetic flux ($B_1$).

The second conductor line (L2) can be supplied for example with an electrical current having a second current amount in the first current direction and the fourth conductor line (L4) can be supplied with an electrical current having a second current amount in the second current direction. In this case, the second current direction is opposite to the first current direction. The second conductor line (L2) is then again the power supply line and the fourth conductor line (L4) is the power return line. The second conductor line (L2) and the fourth conductor line (L4) may then be considered as a second coil and generate a second magnetic flux ($B_2$).

The first magnetic flux ($B_1$) generated by the first coil (L1, L3) and the second magnetic flux ($B_2$) generated by the second coil (L2, L4) are modified by the invention conform superconducting border region ($G_G$) within the boundary region ($G_{FB}$). This changes the energy content of the fields. As a result, the magnetic fields of the first coil (L1, L3) and the second coil (L2, L4) exert a force on the rotor (LF). The rotor (LF) is suspended for the purpose of mobility on the one hand via a first spring element (S1) and a second spring element (S2) and possibly in the cross section of FIG. 35 not visible further spring elements movable relative to the stator, which is formed by the first coil (L1, L3) and the second coil (L2, L4). The mobility is ensured by a cavity (CAV), that separates the rotor (LF) in its entire circumference and the spring elements (S1, S2) mechanically from the carrier ($Sub_1$). It is immediately apparent to the person skilled in the art that the superconducting subcomponent, ie the substrate ($G_{sub}$) can also be arranged in the stator with the superconducting border region ($G_G$) and the first coil (L1, L3) and the second coil (L2, L4) can be arranged on the rotor. Combinations of these two variants of the arrangement of superconducting device parts on rotor (LF) and/or stator ($Sub_1$) are possible.

By suitable implementation of the coils and of the rotor (LF) and/or of the at least partially superconducting substrate ($G_{sub}$) with the border regions ($G_G$) or interfaces ($G_F$), it is possible to impress rotational momentums about the three axes of rotation of the rotor and/or translatory forces along the horizontal axes of translation. These forces can be mediated magnetically and/or electrostatically. Conversely, irradiating electromagnetic waves can interact with the rotor. This has the advantage that mechanical oscillators achieve a high resonator quality with suitable encapsulation in a housing in a high vacuum.

It is conceivable to provide permanent magnets, e.g. in the form of structured ferromagnetic layers, in the rotor (LF) and/or the stator (the substrate $Sub_1$) in order to provide a bias flux without an electrical energy source.

For incorporation of the invention conform room temperature superconducting device parts by means of an adhesive (GL), the superconducting layer package, means the first substrate ($G_{sub}$) with the actual superconducting border region ($G_G$) in the boundary region ($G_{FB}$), is attached on the rotor (LF) and thus indirectly on the carrier ($Sub_1$) with the integrated microelectronic circuit. On this partial device, that is, for example, the rotor LF, which is elastically attached by spring elements (S1, S2) above said support ($Sub_1$) with said exemplary Hall structure (HL), the superconducting room temperature first Substrate ($G_{sub}$ consisting of $GB_1$, $G_{B2}$, $G_{FB}$, $G_G$) is applied. This can be done, for example (and not be limitation) by gluing or clamping with a non-magnetic material, here the adhesive (GL). As a result, the micromechanical electrical machine in the form of the micromotor presented here with the rotor (LF) and the stator ($Sub_1$) has at least one subdevice, the border region ($G_G$), which is an electrical superconductor in the sense of this invention.

In the example, the Hall structure (HL) of FIG. 35 is electrically contacted via the first contact (K1) and the second contact (K2) by means of a first contact doping (KD1) and a second contact doping (KD2). The Hall structure in the example of FIG. 35 serves as an exemplary electrostatic counter electrode to electrically conductive structures of the rotor. In the example of FIG. 35, for example, this can be the first substrate ($G_{sub}$). It will be apparent to those skilled in the art that prior to application of the substrate ($G_{sub}$) the substrate ($Sub_1$) may have been subjected to a microstructuring process on the substrate ($Sub_1$), wherein on or in the substrate ($Sub_1$) nano- or microelectronic circuits and/or nano- or micromechanical devices and/or micro-optical devices and/or or microfluidic devices may have been made. For example, this may be the product of a CMOS process.

The metallization stack of FIG. 35 consists of a first insulation layer, preferably a first oxide (OX1), which is preferably a gate oxide, and a second insulation layer (OX2), preferably a second oxide. Between the first insulating layer (OX1) and the second insulating layer (OX2), two exemplary conductor lines (L1, L2) are placed. This can preferably be produced by means of photolithography in a micromechanical photolithographic production process. An interaction now occurs between the current flow in the conductor lines (L1, L2) and the room temperature superconducting border region ($G_G$) or the room temperature superconducting interface ($G_F$) within the boundary region ($G_{FB}$) of the substrate ($G_{sub}$). The inductance per unit length of the conductor lines (L1, L2) is changed by the proximity of the room temperature superconducting substrate ($G_{sub}$). More complex metallization stacks and doping structures within the carrier ($Sub_1$) are possible. It can be seen from the prior art that the mechanical structure of such micromechanical devices can be made more complex.

Figure 36:
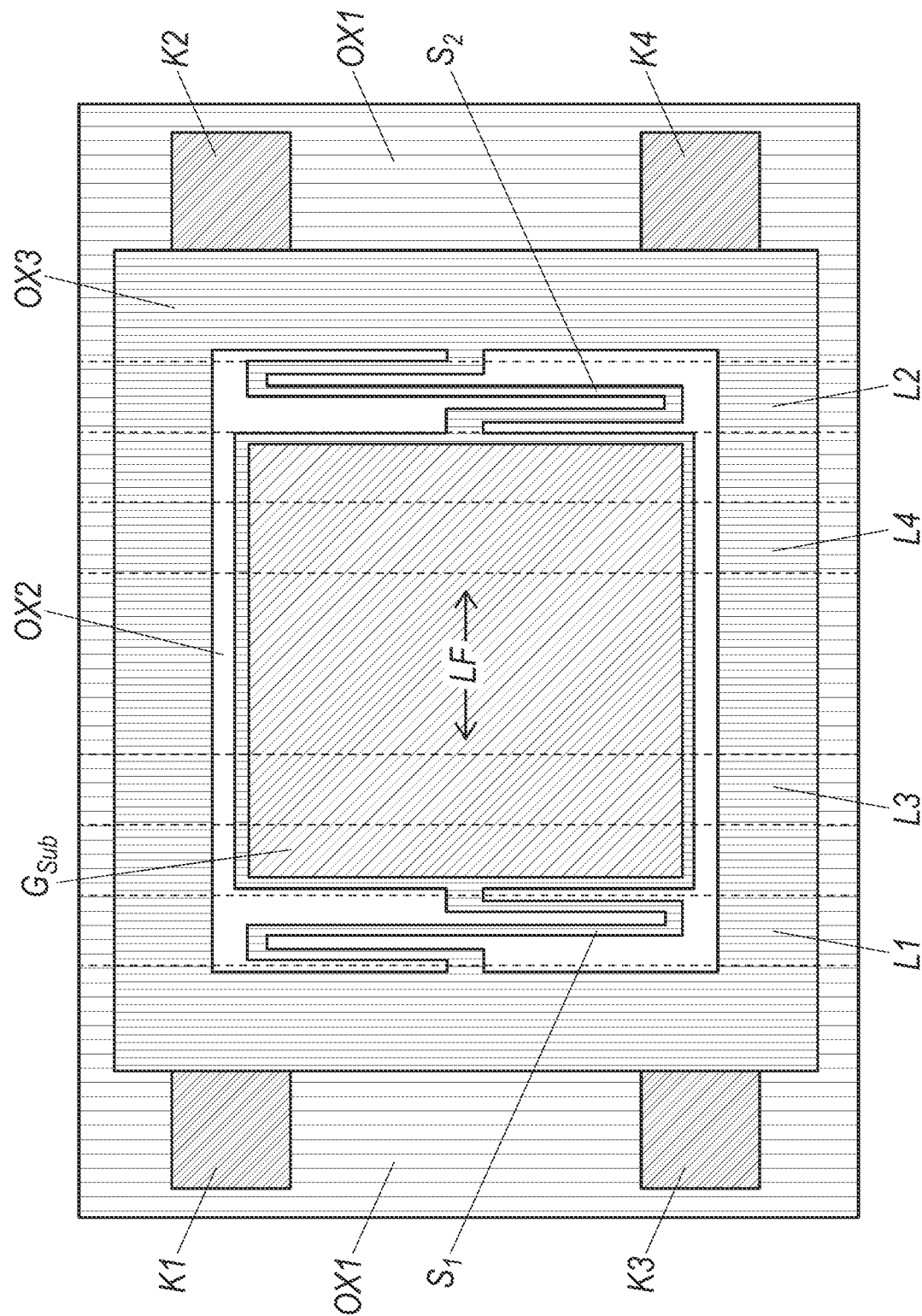

FIG. 36 shows the exemplary micromechanical electrical machine of FIG. 35 in an exemplary plan view. The reference numerals of the exemplary visible surfaces are entered. The first conductor line (L1), the second conductor line (L2), the third conductor line (L3) and the fourth conductor line (L4) are indicated by dashed lines. It is assumed that the carrier ($Sub_1$) still continues up and down and so can form the conductor lines for the first coil (L1, L3) and second coil (L2, L4) described above in FIG. 35. This is not shown for better clarity. By way of example, a first contact (K1), a second contact (K2), a third contact (K3) and a fourth contact (K4) are plotted for the van der-Pauw structure of the Hall structure (HL). The Hall structure (HL) can possibly be used as a sensor for determining the position of the rotor (LF). It is not absolutely necessary for the purely mechanical function.

Figure 37:
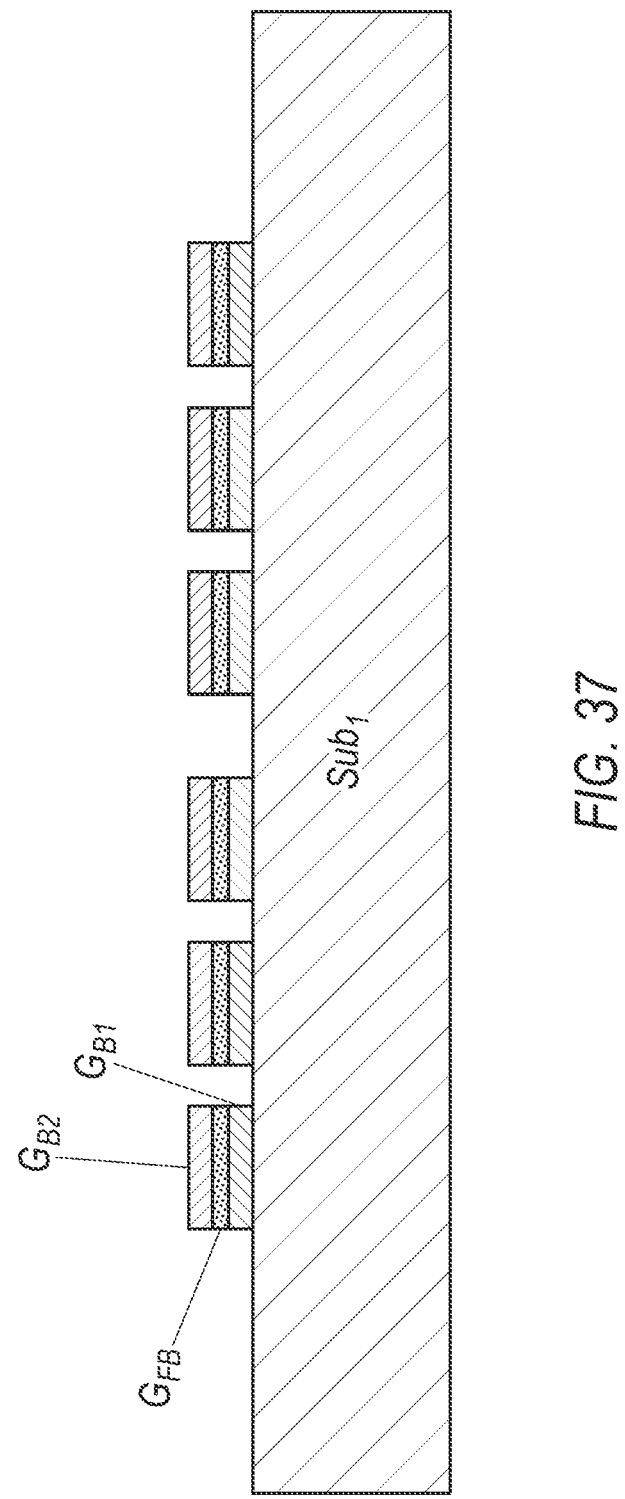

FIG. 37 shows an exemplary flat coil with three turns schematically simplified in cross section.

Figure 38:
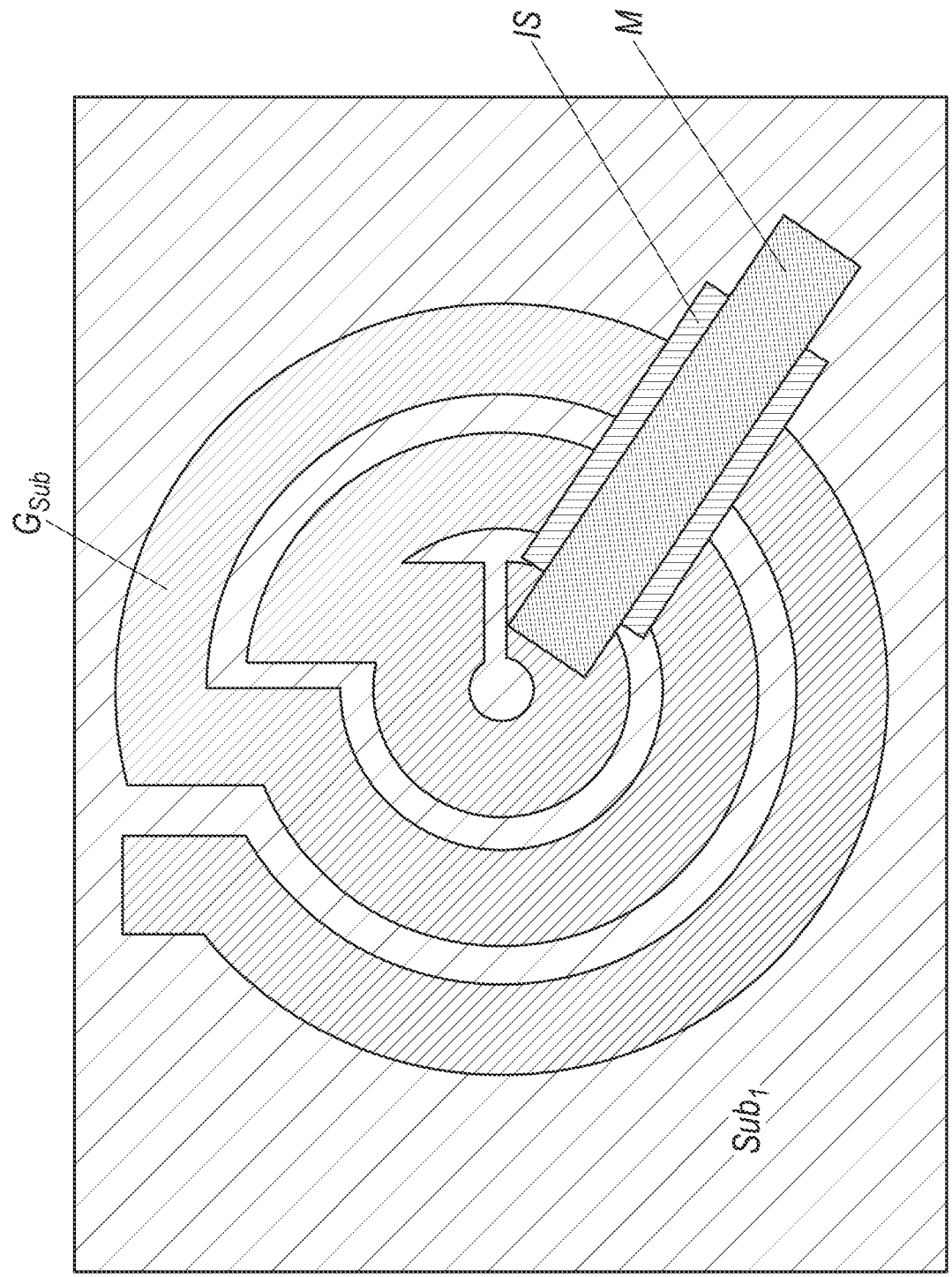

FIG. 38 shows the same flat coil in plan view. The manufacturing process corresponds to one of the preceding manufacturing processes. The coil winding is made of one of the above-described materials with superconducting properties according to the invention. For example, by one of the structuring methods described above, the coil turns are then carved out from the first substrate ($G_{sub}$). For the connection of the center contact, an insulator (IS) (insulating layer) is preveably applied to the first substrate ($G_{sub}$). The connection is then made by a suitable metallization (M). This may include, for example, aluminum, gold, platinum, iridium, iron, copper, magnesium, tin, zinc, lead, etc. Possibly. the turns in the connection area must be bevelled at their outer edge.

Figure 39:
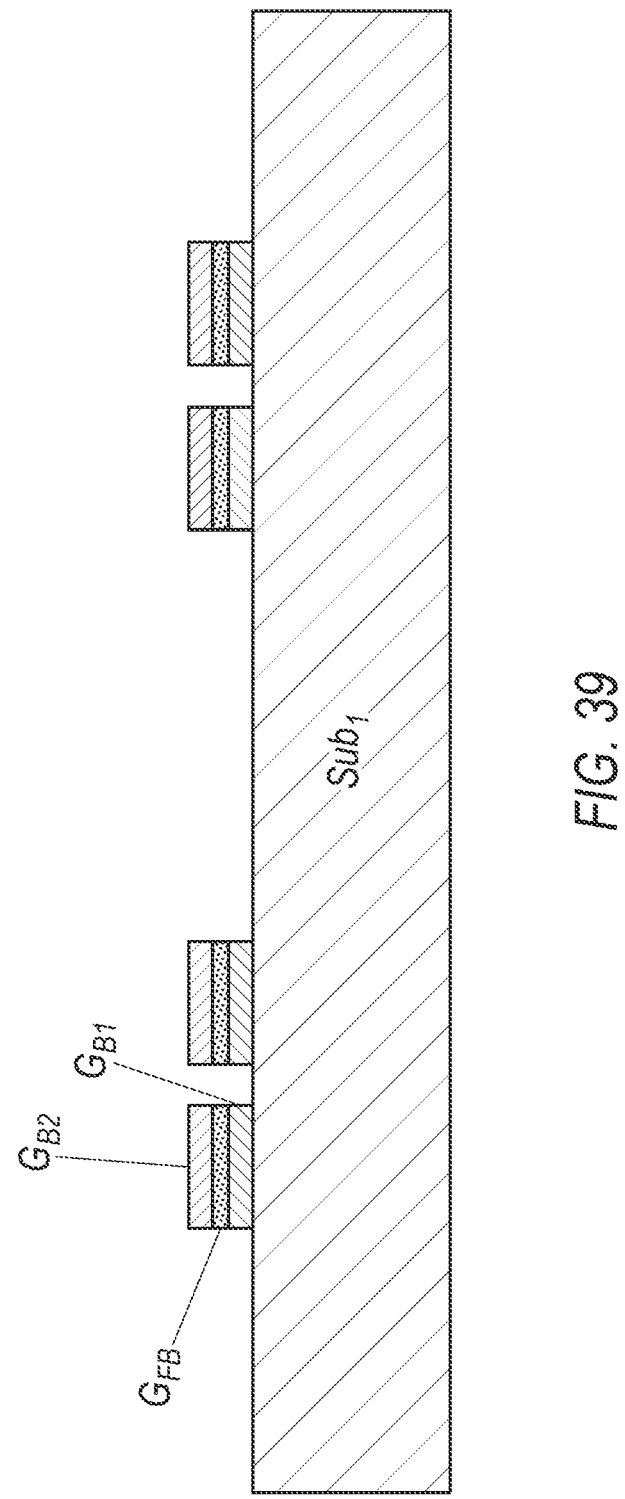
Figure 40:
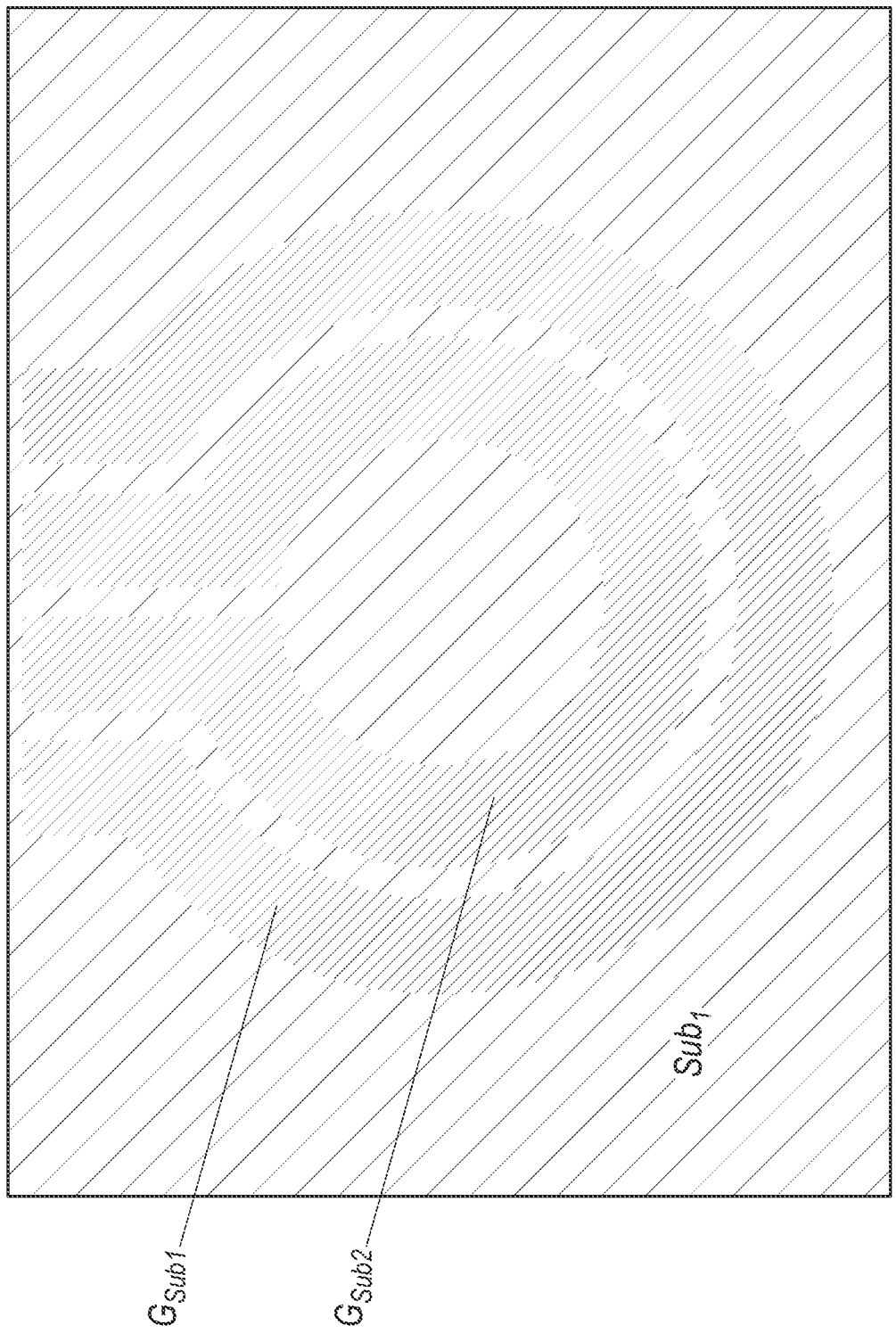

The FIGS. 39 and 40 show two magnetically and/or electrostatically coupled conductor loops in cross-section and in plan view. The manufacturing process corresponds to one of the preceding manufacturing processes. The coil windings are manufactured from one of the above-described superconducting materials according to the invention. In the simplest case, a suitable substrate ($G_{sub}$) is selected and applied to the carrier ($Sub_1$). For example, by one of the structuring methods described above, the coil turns are then carved out from the first substrate ($G_{sub}$). As a result, a first substrate ($G_{sub1}$) and another substrate ($G_{sub2}$) come into being. These figures represent a schematic simplified application example of the above technical teaching to a multi-port device—here a two-ported device—with at least two magnetically and/or electrostatically coupled to each other conductor lines.

Figure 41:
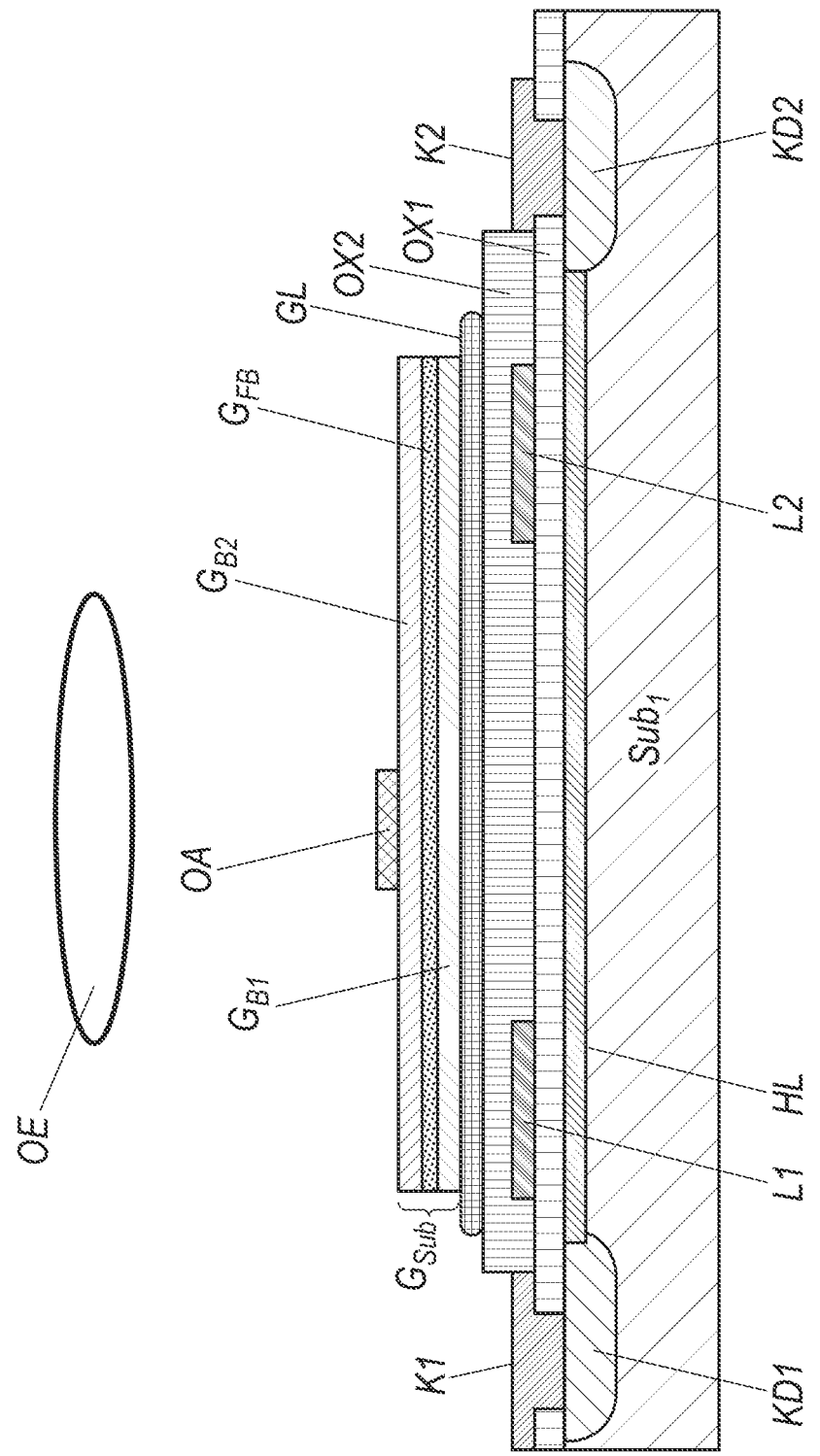

FIG. 41 corresponds to FIG. 20 wherein an optical functional element, here an exemplary lens (OE), couples electromagnetic radiation with the first substrate ($G_{sub}$). Furthermore, a coupling with an optically active optical waveguide (OA) takes place here. By suitable design of the shape of the first substrate ($G_{sub}$) and of the optical waveguide (OA) and by filtering the electromagnetic radiation, the strength of the interaction on the first substrate ($G_{sub}$) and/or the optically active optical waveguide (OA) are predetermined individually constructively. For example, it is conceivable that the first substrate ($G_{sub}$)) is heated by radiation above its critical temperature ($T_c$) and thus the interaction with the optical fiber (OA) is changed, which can be detected.

FEATURES OF THE INVENTION

The invention can also be described alternatively by one of the following feature groups, wherein the feature groups can be combined with each other as desired and also individual features of a feature group can be combined with one or more features of one or more other feature groups and/or one or more of the previously described embodiments. It is true that by "layer region" is meant "layer" and "interface" is to be understood as a special case of the border region within the boundary region between two layers with different graphite crystal structure.

Feature 1.0

Method of making an electrical or optical or magnetic or electronic device using the steps Providing (1) a first substrate ($G_{sub}$) having at least two layer regions ($G_{B1}$, $G_{B2}$), wherein the first layer region ($G_{B1}$) and the second layer region ($G_{B2}$) are arranged one above the other and have a common interface ($G_F$) and wherein the first layer region ($G_{B1}$) consists of graphite with Bernal crystal structure (graphite-2H) with at least 3 atom layers with a respective thickness of exactly one atom per atomic layer, and wherein the second layer region ($G_{B2}$) consists of graphite with rhombohedral crystal structure (English rhombohedral, graphite-3R) with at least 3 atom layers with a respective thickness of exactly one atom per atomic layer, and where the interface ($G_F$) exhibits an orientation of its surface normal parallel to the hexagonal axis of symmetry (c) of the crystal lattice of the first layer region ($G_{B1}$) and wherein the interface ($G_F$) exhibits an orientation of their surface normal parallel to the hexagonal symmetry axis (d) of the crystal lattice of the second layer region ($G_{B2}$) and wherein the interface ($G_F$) exhibits at least partially, in border regions ($G_G$), superconducting properties and wherein the interface ($G_F$) at least partially exhibits a critical temperature ($T_c$) which is higher than −195° C. and/or higher than −100° C. and/or higher than −50° C. and/or higher than 360K and/or a critical magnetic flux density ($B_k$) at e.g. 77K, which is higher than 1 T and/or 50 T;

Structuring (8) of the substrate ($G_{sub}$), in particular by wet-chemical etching, ion or particle beam etching, focussed ion beam, plasma etching, electrochemical etching, shape cutting chipping technology, pressing, sintering, spark erosion, amorphization;

Providing (13) contacts of the interface ($G_F$).

Feature 1.1

Method according to feature 1.0 comprising the additional step

Structuring of the superconducting portion of the interface ($G_F$), the border region ($G_G$), which has superconducting properties and wherein the border region ($G_G$) has a critical temperature ($T_c$) higher than −195° C. and/or higher than −100° C. and/or higher than −50° C. and/or higher than 360K and/or a critical magnetic flux density ($B_k$) at e.g. 77K, which is higher than 1 T and/or 50 T, by restricting the superconductivity, in particular by amorphization.

Feature 1.2

Method according to feature 1.0 comprising the additional step

Determine (2) the orientation of the surface normal ($n_F$) of the interface ($G_F$) within the substrate ($G_{sub}$).

Feature 1.3

Method according to feature 1.0 comprising the additional step of determining (2) the position of the superconducting region, the border region ($G_G$), the interface ($G_F$) within the substrate ($G_{sub}$) by means of a magnetic force microscope (MFM) or by means of another suitable measuring device for the distribution of a magnetic flux density or a magnetic field strength.

Feature 1.4

Method according to feature 1.0 or 1.2 comprising the additional step

Thinning (3) of a layer region ($G_{B1}$, $G_{B2}$), hereinafter referred to as the "respective layer region" and creation of a lower boundary surface (UGF) parallel to the interface ($G_F$), whereby the minimum thickness of the relevant layer region according to characteristic 1.0 is complied with.

Feature 1.5

Method according to features 1.3 or 1.4 comprising the additional step

Thinning (3) and/or orientation of the surface normal ($n_F$) of the interface ($G_F$) within the substrate ($G_{sub}$) by splitting off one or more graphene layers.

Feature 1.6

Method according to feature 1.2 comprising the additional step

Applying (4) the thinned substrate ($G_{sub}$) to the surface (OF) of a carrier ($Sub_1$);

Attaching (5) the thinned substrate ($G_{sub}$) to the surface (OF) of the substrate ($Sub_1$) by means of adhesion, formation of a carbide, formation of a eutectic or gluing (GL) or welding, in particular laser welding.

Feature 1.7
Method according to feature 1.2 or 1.6 comprising the additional step
Thinning (6) of the layer region ($G_{B1}$, $G_{B2}$), hereafter the "other layer region", which is not the relevant layer region, and creation of an upper boundary surface ($OG_F$) parallel to the interface ($G_F$), the minimum thickness of the other layer region according to characteristic 1.0 being complied.

Feature 1.8
Method according to one or more of the features 1.2 to 1.8 characterized in
that the thinning is made by using at least one of the following methods
shape cutting chipping technology and/or
polishing and/or
grinding and/or
electrochemical polishing and/or
chemical-mechanical polishing (CMP) and/or
wet-chemical etching and/or
ion etching and/or
particle beam etching and/or
chemical etching and/or
plasma etching.

Feature 1.9
Method for producing a component according to one or more of the preceding features 1.0 to 1.8 comprising the steps
Providing (7) a second substrate (SUB), which may be identical to the carrier ($Sub_1$),
wherein the second substrate (SUB) can be electrically insulating or electrically normal conducting or electrically semiconducting p-type or electrically semiconducting n-type or metallically electrically conductive;
Carrying out a procedure according to feature 1.0.

Feature 1.10
Method for producing a component according to the preceding feature 1.9, characterized in
that the second substrate (SUB) comprises a semiconducting electronic component, in particular, but not limited to, a diode, a PN diode, a Schottky diode, an ohmic resistance, a transistor, a PN P or PNP bipolar transistor, a diac, a triode, an n- or p-channel MOS transistor, a pip, or nin or pin diode, a solar cell, and/or
that the second substrate (SUB) comprises a fluidic and/or microfluidic (MHD generator) and/or optical and/or micro-optical sub-component, and/or
comprises an electronic or electrical component, in particular but not limited to a flat coil or a capacitor, which is manufactured in microstructure technology on the second substrate or in this second substrate (SUB).

Feature 1.11
Method for producing a component according to one or more of the preceding features 1.0 to 1.10 comprising the steps
Applying (9) at least one electrically conductive layer (M) onto the first substrate ($G_{sub}$) or second substrate (SUB),
wherein the electrically conductive layer (M) may be electrically normally conducting or electrically semiconducting of the p-type conductivity or electrically semiconducting of the n-type conductivity or electrically metallically conducting.

Feature 1.12
Method for producing a component according to the preceding feature 1.11 comprising the steps
Structuring (10) of the at least one normally conducting layer (M).

Feature 1.13
A method of manufacturing a device according to one or more of the preceding features 1.0 to 1.12 comprising the steps
Applying (11) at least one electrically insulating layer (IS) to the first substrate ($G_{sub}$) or the second substrate (SUB) or the carrier ($Sub_1$) or on an electrically, in particular normal, conductive layer (M).

Feature 1.14
A method of manufacturing a device according to the preceding features 1.0 to 1.13 comprising the steps
Structuring (12) the at least one insulating layer (IS).

Feature 1.15
Method for producing a component according to feature 1.11, characterized in
that the electrically conductive layer (M) is in direct mechanical contact with the first substrate ($G_{sub}$) at at least one point.

Feature 1.16
Method for producing a component according to feature 1.11, characterized in
that the electrically insulating layer (IS) is in direct mechanical contact to the first substrate ($G_{sub}$) at at least one point.

Feature 1.17
Method for producing a component according to one or more of the preceding features 1.0 to 1.16
Wherein the structuring (9, 11) comprises photolithographically and/or wet-chemically and/or by plasma etching and/or ion and particle beam bombardment and/or armophysation and/or e-beam irradiation and/or laser irradiation and/or mechanical cutting processes and/or forming processes, which are combined with a disruption of the interface ($G_F$) in case of a structuring, which includes the structuring of the interface ($G_F$).

Feature 1.18
Method for producing a component according to one or more of the preceding features 1.0 to 1.17
wherein at least parts of the first substrate (GSUb) with a method according to the technical teaching of AU 2015 234 343 A1, EP 2 982 646 A1 and the JP 5 697 067 B1 or another method for the production of graphite with a proportion of rhombohedral graphite of more than 1%.

Feature 2.0
Electrical or optical or magnetic or electronic component with a sub-device which has a first substrate ($G_{sub}$) comprising at least two layer regions ($G_{B1}$, $G_{B2}$)
wherein the first layer region ($G_{B1}$) and the second layer region ($G_{B2}$) are arranged one above the other and have a common interface ($G_F$) and
wherein the first layer region ($G_{B1}$) consists of graphite with Bernal crystal structure (graphite 2H) with at least 3 atom layers with a respective thickness of exactly one atom, and
wherein the second layer region (GR) consists of graphite with rhombohedral crystal structure (English rhombohedral, graphite-3R) and
wherein the interface ($G_F$) has an orientation of its surface normal ($n_F$) parallel to the hexagonal axis of symmetry (c) of the crystal lattice of the first layer region ($G_{B1}$) and wherein the interface ($G_F$) has an orientation of its surface normal ($n_F$) parallel to the hexagonal axis of symmetry (d) of the crystal lattice of the second layer region ($G_R$) and wherein the interface ($G_F$) has a border region ($G_G$) with superconducting properties and wherein the border region ($G_G$) has a critical temperature ($T_c$) higher than −195° C. and/or higher than −100° C. and/or higher than −50° C. and/or higher than 360K and/or a critical magnetic flux density ($B_k$) at e.g. 77K, which is higher than 1 T and/or 50 T and wherein the first substrate ($G_{sub}$) is structured so that the outer edge of the interface ($G_F$) in at least a portion of the first substrate ($G_{sub}$) is changed by processing and wherein the interface ($G_F$) has at least one electrical contact provided or adapted to electrically connect the interface ($G_F$) to an electrical conductor.

Feature 3.0
Method for operating an electrical or optical or magnetic or electronic component
Providing an electrical or optical or magnetic or electronic component,
wherein the device having a superconducting sub-device with a critical temperature ($T_c$) which is higher than −196° C. and/or higher than −100° C. and/or higher than −50° C. and/or higher than 360K and/or a critical magnetic flux density ($B_k$) at e.g. 77K, which is higher than 1 T and/or 50 T;
energizing the electrical component at a temperature (T), which is above −196° C. and wherein within the superconducting sub-device, a current flow occurs.

Feature 4.0
Electrical or optical or magnetic or electronic component characterized in
that it has at least one sub-device, which is an electrical superconductor with a critical temperature ($T_c$) higher than −195° C. and/or higher than −100° C. and/or higher than −50° C. and/or higher than 360K and/or the critical magnetic flux density ($B_k$) at e.g. 77K higher than 1 T and/or 50.

Feature 4.1
Component according to feature 4.0, characterized in that the electrical superconductor comprises carbon.

Feature 4.2
Component according to feature 4.1, characterized in that the electrical superconductor comprises carbon in rhombohedral crystal structure (graphite 3R).

Feature 4.3
Component according to feature 4.1 characterized in that the electric superconductor comprises carbon in Bernal crystal structure (graphite 2H).

Feature 4.4
Component according to feature 4.0 characterized in
that it is intended, to be operated in a first state of operation at a working temperature ($T_a$) above the critical temperature ($T_c$) and
that it is intended, to be operated in a second state of operation at a working temperature ($T_a$) below the critical temperature ($T_c$).

Feature 4.5
Component according to feature 4.0 characterized in
that it has the shape of a longer rod,
wherein the vector of the rod direction is parallel to a plane vector of the interface ($G_F$), which is parallel to this, and
wherein the rod is split in half, the first layer region ($G_{B1}$) and the second layer region ($G_{B2}$)

Feature 4.6
Component according to feature 4.5 characterized in
that the electrical contacts (K) are made by means of metal caps at the ends of the rod, which are in particular placed on the rod.

Feature 4.7
Temperature sensor characterized in
that it is an electrical component according to feature 4.4.

Feature 4.8
Component according to feature 4.0 characterized in
that its conductivity depends on an external magnetic field.

Feature 4.9
Component according to feature 4.8 characterized in
that the superconducting substructure has a topological genus higher than 0.

Feature 4.10
Component according to feature 4.0 characterized in
that it is an electrical line.

Feature 4.11
conductor line (L1) according to feature 4.10, characterized in
that it is guided with a distance to a second line (L3) according to feature 4.12, so that electrical properties of this line (L1) depend on the current flow in the second line (L3).

Feature 4.12
Conductor line according to feature 4.10, characterized in
that at least one superconducting substructure is cylindrical.

Feature 4.13
Component according to feature 4.0 characterized in
that it is an electric coil and/or
that it is a flat coil and/or
that it is a transformer and/or
that it is a cylindrical coil.

Feature 4.14
Component according to feature 4.0, characterized in
that it is a resonator or a microwave resonator or an antenna or an oscillator.

Feature 4.15
Component according to feature 4.0 characterized in
that it is part of an electrical capacitor.

Feature 4.16
Component according to feature 4.0 characterized in
that it has a bistable behavior.

Feature 4.17
Component according to feature 4.0, characterized in
that it is or comprises a Josephson diode ($TU_1$, $TU_2$).

Feature 4.18
Component according to feature 4.17, characterized in
that it is a Josephson memory (see DE2434997).

Feature 4.19
Component according to feature 4.0 characterized in that it is part of an antenna.

Feature 4.20
Component according to feature 4.11 characterized in that it is a quantum register bit.

Feature 5.0
Optical component characterized in
that it has at least one sub-device, which is an electrical superconductor with a critical temperature ($T_c$) higher than −195° C. and/or higher than −100° C. and/or higher than −50° C. and/or higher than 360K and/or the critical magnetic flux density ($B_k$) at e.g. 77K higher than 1 T and/or 50 T.

Feature 5.1
Optical component according to feature 5.0, characterized in
that the sub-device is intended to be used for coding data which is read out by means of the Faraday effect,
wherein it is particularly intended to use monocrystalline ferrimagnetic garnet layers based on bismuth-substituted rare earth iron garnet of stoichiometry $(Bi, SE)_3 (Fe, Ga)_5 O_{12}$ as a magnetic field sensitive optical element.

Feature 6.0
Magnetic component characterized in
that it comprises at least one subdevice having an electrical superconductor with a critical temperature $(T_c)$ higher than −195° C. and/or higher than −100° C. and/or higher than −50° C. and/or higher than 360K and/or the critical magnetic flux density $(B_k)$ at e.g. 77K higher than 1 T and/or 50 T.

Feature 6.1
Magnetic component according to feature 6.1 characterized in
that it is intended to be operated at a temperature below the critical temperature $(T_c)$ and/or at an external magnetic field below the critical magnetic flux density $(B_c)$.

Feature 6.2
Magnetic component according to feature 6.1 characterized in
that, when used as intended, it exhibits a permanent magnetic field with a magnetic flux density (B) of more than 5 μT.

Feature 6.3
Magnetic element according to feature 6.2 characterized in
that it is a flux quantum generator (see DE 28 43 647).

Feature 7.0
Electric machine, which may be a rotating machine (FIG. 35) or a linear motor, characterized in
that it comprises at least one sub-device $(G_{sub})$ having an electrical superconductor with a critical temperature $(T_c)$ higher than −195° C. and/or higher than −50° C. and/or the critical magnetic flux density $(B_k)$ at e.g. 77K is higher than 1 T and/or 50 T.

Feature 7.1
Electrical machine according to feature 7.0, characterized in
that the superconducting sub-device $(G_{sub})$ is part of a rotor and/or a rotor (LF) or a stator of the machine (FIG. 35).

Feature 8.0
Mobile device characterized in
that it comprises at least one sub-device, which is an electrical superconductor with a critical temperature $(T_c)$ higher than −195° C. and/or higher than −100° C. and/or higher than −50° C. and/or higher than 360K and/or the critical magnetic flux density $(B_k)$ at e.g. 77K is higher than 1 T and/or 50 T and
that this subdevice is an energy storage device.

Feature 9.0
Energy storage characterized in
that it comprises at least one sub-device having an electrical superconductor with a critical temperature $(T_c)$ higher than −195° C. and/or higher than −100° C. and/or higher than −50° C. and/or higher than 360K and/or the critical magnetic flux density $(B_k)$ at e.g. 77K is higher than 1 T and/or 50 T.

Feature 10.0
Medical device characterized in
that it comprises at least one sub-device, which is an electrical superconductor with a critical temperature $(T_c)$ higher than −195° C. and/or higher than −100° C. and/or higher than −50° C. and/or higher than 360K and/or the critical magnetic flux density $(B_k)$ at e.g. 77 K is higher than 1 T and/or 50 T.

Feature 11.0
Measuring device characterized in
that it comprises at least one sub-device having an electrical superconductor with a critical temperature $(T_c)$ higher than −195° C. and/or higher than −100° C. and/or higher than −50° C. and/or higher than 360K the critical magnetic flux density $(B_k)$ at e.g. 77K is higher than 1 T and/or 50 T.

Feature 12.0
Electrical or optical or magnetic or electronic component with a sub-device, having a first substrate $(G_{sub})$ comprising at least two layer regions $(G_{B1}, G_{B2})$,
wherein the first layer region $(G_{B1})$ and the second layer region $(G_{B2})$ are arranged one above the other and have a common interface $(G_F)$ and
wherein the first layer region $(G_{B1})$ comprises graphite having a Bernal crystal structure (graphite 2H) with at least 3 atomic layers with a respective thickness of exactly one atom, and
wherein the second layer region $(G_{B2})$ comprises graphite having a rhombohedral crystal structure (english rhombohedral, graphite-3R) and
wherein the interface $(G_F)$ has an orientation of its surface normal $(n_F)$ parallel to the hexagonal symmetry axis (c) of the crystal lattice of the first layer region $(G_{B1})$ and
wherein the interface $(G_F)$ has an orientation of its surface normal $(n_F)$ parallel to the hexagonal axis of symmetry (d) of the crystal lattice of the second layer region $(G_{B2})$ and
wherein the interface $(G_F)$ has a border region $(G_G)$ with superconducting properties and where the border region $(G_G)$ has a critical temperature (Tc) that is higher than −195° C. and/or higher than −100° C. and/or higher than −50° C. and/or higher than 360K and/or a critical magnetic flux density $(B_k)$ at e.g. 77K, which is higher than 1 T and/or 50 T and
wherein the first substrate $(G_{sub})$ is structured so that the outer edge of the interface $(G_F)$ in at least a portion of the first substrate $(G_{sub})$ is modified by processing and
wherein the interface $(G_F)$ has at least one electrical contact provided or adapted to electrically connect the interface $(G_F)$ to an electrical conductor.

Feature 13.0
Electronic component (FIG. 14)
with a Hall measurement structure (HL) or other electrical device, in which at least one electrical parameter depends on the magnetic flux density or the magnetic field strength that permeates this other electrical device
characterized in
that it has at least one sub-device $(G_{sub})$ having an electrical superconductor with a critical temperature $(T_c)$ higher than −195° C. and/or higher than −100° C. and/or higher than −50° C. and/or higher than 360K and/or with a critical magnetic flux density $(B_k)$ at e.g. 77K is higher than 1 T and/or 50 T.

Feature 13.1
Electronic component according to feature 13.0
wherein the first sub-device of a first substrate $(G_{sub})$ having at least two layer regions $(G_{B1}, G_{B2})$, and wherein the first layer region ($G_{B1}$) and the second layer region ($G_{B1}$) are arranged one above the other and have a common interface ($G_F$) and wherein at least the first layer region ($G_{B1}$) or the second layer region ($G_{B1}$) is arranged above the Hall measurement structure (HL), wherein the first layer region ($G_{B1}$) consists of graphite with Bernal crystal structure (graphite 2H) with at least 3 atom layers with a respective thickness of exactly one atom per atomic layer, and wherein the second layer region ($G_{B2}$) consists of graphite with rhombohedral crystal structure (English rhombohedral, graphite-3R) with at least 3 atom layers with a respective thickness of exactly one atom per atomic layer, and wherein the interface ($G_F$) has an orientation of its surface normal ($n_F$) parallel to the hexagonal axis of symmetry (c) of the crystal lattice of the first layer region ($G_{B1}$) and wherein the interface ($G_F$) has an orientation of its surface normal ($n_F$) parallel to the hexagonal axis of symmetry (d) of the crystal lattice of the second layer region ($G_{B2}$)

wherein the interface ($G_F$) has a border region ($G_G$) with at least partially superconducting properties, and wherein the border region ($G_G$) has at least partially a critical temperature ($T_c$) higher than −195° C. and/or higher than −100° C. and/or higher than −50° C. and/or higher than 360K and/or a critical magnetic flux density ($B_k$) at e.g. 77K, which is higher than 1 T and/or 50 T.

Feature 14.0
Electronic component
with at least one sub-device ($G_{sub}$), which is an electrical superconductor with a critical temperature ($T_c$) higher than −195° C. and/or higher than −100° C. and/or higher than −50° C. and/or higher than 360K and/or with a critical magnetic flux density ($B_k$) at e.g. 77K is higher than 1 T and/or 50 T, wherein said first sub-device is a first substrate ($G_{sub}$) having at least two layer regions ($G_{B1}$, $G_{B2}$), wherein the first layer region ($G_{B1}$) and the second layer region ($G_{B2}$) are arranged one above the other and have a common interface ($G_F$) and wherein the first layer region ($G_{B1}$) is a crystal of carbon with a first crystal structure, and wherein the second layer region ($G_{B2}$) is a second carbon crystal having a first or second crystal structure, and wherein between the first crystal and the second crystal, an interface ($G_F$) is formed, and wherein the interface ($G_F$) has a border region ($G_G$) with at least partially superconducting properties and wherein the border region ($G_G$) has at least partially a critical temperature ($T_c$), which is higher than −195° C. and/or higher than −100° C. and/or higher than −50° C. and/or higher than 360K and/or a critical magnetic flux density ($B_k$) at e.g. 77K, which is higher than 1 T and/or 50 T.

Feature 14.1
Device according to feature 14.0
wherein at least the first layer region ($G_{B1}$) or the second layer region ($G_{B2}$) is arranged above or in the vicinity of a Hall measurement structure (HL) or another magnetic sensitive sensor or sensor element, wherein in the vicinity means that a magnetic field in that is generated by a current in the interface ($G_F$) or the first layer region ($G_{B1}$) or the second layer region ($G_{B2}$), can change a parameter, in particular a measurement signal, of the Hall measurement structure (HL) or of the other magnetic sensitive sensor or sensor element.

Feature 15.0
Electronic component
with an electronic sub-device (HL, FIG. 13), in particular a Hall measurement structure (HL), which changes an electrical parameter as a function of a magnetic field magnitude or of another parameter of the electromagnetic field, characterized in
that there is at least one sub-device ($G_{sub}$) having an electrical superconductor with a critical temperature ($T_c$) higher than −195° C. and/or higher than −100° C. and/or higher than −50° C. and/or higher than 360K and/or an electrical superconductor having a critical magnetic flux density ($B_k$) at e.g. 77K is higher than 1 T and/or 50 T.

Feature 15.1
Electronic component according to feature 15.0
wherein the first sub-device of a first substrate ($G_{sub}$) comprising at least two layer regions ($G_{B1}$, $G_{B2}$), wherein the first layer region ($G_{B1}$) and the second layer region ($G_{B2}$) are arranged one above the other and have a common interface ($G_F$) and wherein at least the first layer region ($G_{B1}$) or the second layer region ($G_{B2}$) is aranged on the Hall measurement structure (HL).

wherein the first layer region ($G_{B1}$) consists of graphite with Bernal crystal structure (graphite 2H) with at least 3 atom layers with a respective thickness of one atom per atomic layer and wherein the second layer region ($G_{B2}$) consists of graphite with rhombohedral crystal structure (English rhombohedral, graphite-3R) with at least 3 atom layers with a respective thickness of exactly one atom per atomic layer and wherein the interface ($G_F$) has an orientation of its surface normal ($n_F$) parallel to the hexagonal symmetry axis (c) of the crystal lattice of the first layer region ($G_{B1}$) and wherein the interface ($G_F$) has an orientation of its surface normal ($n_F$) parallel to the hexagonal symmetry axis (d) of the crystal lattice of the second layer region ($G_{B2}$)

wherein the interface ($G_F$) has a border region ($G_G$) with at least partially superconducting properties, and wherein the border region ($G_G$) has at least partially a critical temperature ($T_c$) higher than −195° C. and/or higher than −100° C. and/or higher than −50° C. and/or higher than 360K and/or wherein the interface ($G_F$) exhibits at least partially a critical magnetic flux density ($B_k$) at e.g. 77K, which is higher than 1 T and/or 50 T.

Feature 16.0
Microelectronic circuit, in particular an integrated circuit, characterized in
that it comprises at least one sub-device ($G_{sub}$) having an electrical superconductor with a critical temperature ($T_c$) higher than −195° C. and/or higher than −100° C. and/or higher than −50° C. and/or higher than 360K and/or an electrical superconductor having a critical magnetic flux density ($B_k$) at e.g. 77K higher than 1 T and/or 50 T.

Feature 18.0
Micromechanical device, characterized in
that it comprises at least one sub-device ($G_{sub}$) having an electrical superconductor with a critical temperature ($T_c$) higher than −195° C. and/or higher than −100° C. and/or higher than −50° C. and/or higher than 360K and/or an electrical superconductor having a critical magnetic flux density ($B_k$) at e.g. 77K higher than 1 T and/or 50 T.

Feature 19.0

Microoptical device, characterized in
that they have at least one sub-device ($G_{sub}$) having an electrical superconductor with a critical temperature ($T_c$) higher than −195° C. and/or higher than −100° C. and/or higher than −50° C. and/or higher than 360K and/or an electrical superconductor having a critical magnetic flux density ($B_k$) at e.g. 77K higher than 1 T and/or 50 T.

Feature 19.1

Microoptical device according to feature 19.0, characterized in
that it comprises at least one optical waveguide section which is suitable or provided such that its optical properties depend at least at times on a magnetic field generated by said sub-device.

Feature 20.0

Optical waveguide characterized in
that it is combined with a sub-device ($G_{sub}$) to obtain an overall device comprising an electrical superconductor having a critical temperature ($T_c$) higher than −195° C. and/or higher than −100° C. and/or higher than −50° C. and/or higher than 360K and/or an electrical superconductor having a critical magnetic flux density ($B_k$) at e.g. 77 K higher than 1 T and/or 50 T and
that at least one interaction between the sub-device ($G_{sub}$) and the optical waveguide is measurable.

Feature 21.0

Microfluidic device, characterized
that it comprises at least one sub-device ($G_{sub}$) having an electrical superconductor with a critical temperature ($T_c$) higher than −195° C. and/or higher than −100° C. and/or higher than −50° C. and/or higher than 360K and/or an electrical superconductor having a critical magnetic flux density ($B_k$) at e.g. 77K higher than 1 T and/or 50 T.

Feature 22.0

A method of making an electrical or electronic or optical or magnetic device comprising the steps
Providing a carrier ($Sub_1$);
Applying a first substrate ($G_{sub}$) on the carrier ($Sub_1$),
wherein the substrate ($G_{sub}$) has at least one subregion, which is an electrical superconductor with a critical temperature ($T_c$) higher than −195° C. and/or higher than −100° C. and/or higher than 360K and/or a critical magnetic flux density ($B_k$) at e.g. 77K higher than 1 T and/or 50 T.

Feature 23.0

A method of making an electrical or electronic or optical or magnetic device comprising the steps
Providing a first substrate ($G_{sub}$)
wherein the first substrate ($G_{sub}$) has at least a partial region, which is an electrical superconductor with a critical temperature ($T_c$) higher than −195° C. and/or higher than −100° C. and/or higher than 360K and/or a critical magnetic flux density ($B_k$) at e.g. 77K higher than 1 T and/or 50 T;
Electrically contacting the first substrate ($G_{sub}$).

Feature 24.0

Method for selecting natural room temperature superconductors for industrial use comprising the steps
Providing a substrate for room temperature superconductivity testing, in particular for convenience at a temperature higher than −40° C.;
Exposing the substrate to a magnetic field, with more than 0.5, better more than 1 T, better more than 2 T, better more than 4 T, better more than 8 T.
Measurement of a region of the substrate with an MFM for localization of a line current.

Feature 24.1

Method according to feature 24.0 characterized by
Storage of the substrate at more than 200 K and
Re-measuring a region with a line current after a rest time of more than 5 minutes and/or more than one hour and/or more than one day and/or more than a week better one month to reconfirm superconductivity.

Feature 25.0

Electrical or electronic device characterized in
that it comprises at least one sub-device ($G_{sub}$) having an electrical superconductor with a critical temperature ($T_c$) higher than −195° C. and/or higher than −100° C. and/or higher than 360K and/or a critical magnetic flux density ($B_k$) at e.g. 77 K higher than 1 T and/or 50 T.

Feature 27.0

Magnetic device characterized in
that they have at least one sub-device ($G_{sub}$) having an electrical superconductor with a critical temperature ($T_c$) higher than −195° C. and/or higher than −100° C. and/or higher than 360K and/or a critical magnetic flux density ($B_k$) at e.g. 77K higher than 1 T and/or 50 T.

Feature 28.0

Optical device characterized in
that they have at least one sub-device ($G_{sub}$) having an electrical superconductor with a critical temperature ($T_c$) higher than −195° C. and/or higher than −100° C. and/or higher than 360K and/or the critical magnetic flux density ($B_k$) at e.g. 77K higher than 1 T and/or 50 T.

Feature 29.0

Electrical component and/or quantum interference component (FIG. 13)
having at least one conductor (W, W1a, W1b, W2a, W2b),
wherein in the at least one conductor (W) at least a first phase difference introducing weak point ($TU_1$) is inserted and
wherein the at least one conductor (W) is made at least partially and at least in the region of the first phase difference-introducing weak point ($TU_1$) from a material which has an electrical superconductor with a critical temperature ($T_c$) higher than −195° C. and/or higher than −100° C. and/or higher than −50° C. and/or higher than 360K and/or with a critical magnetic flux density
($B_k$) at e.g. 77K higher than 1 T and/or 50 T.

Feature 30.0

Electrical component and/or quantum interference component (FIG. 13) with a conductor (W, W1a, W1b, W2a, W2b),
wherein the conductor (W) is divided in a first conductor branch (W1a, W1b) and a second conductor branch (W2a, W2b) and
wherein the first conductor branch (W1a, W1b) and the second conductor branch (W2a, W2b) are arranged so that they at least partially enclose an area such that an opening (O1) is formed between the conductor branches and
wherein the conductor (W) is at least partially made of a material having an electrical superconductor with a critical temperature ($T_c$) higher than −195° C. and/or higher than −100° C. and/or higher than −50° C. and/or higher than −100° C. and/or higher than −50° C. and/or higher than 360K and/or with a critical magnetic flux density ($B_k$) at e.g. 77K higher than 1 T and/or 50 T.

Feature 30.1

Electrical component and/or quantum interference component according to feature 30.0
wherein at least in the first conductor branch (W1a, W1b) a first phase difference-introducing weak point (TU1) is inserted.

Feature 30.2

Electrical component and/or quantum interference component according to feature 30.1
wherein also in the second conductor branch (W2a, W2b) a second phase difference inducing weak point (TU2) is inserted.

Feature 30.3

Electrical component and/or quantum interference component according to one or more of the features 30.0 to 30.2,
where a phase difference-introducing weak point is formed by an insulator or
wherein a phase difference-introducing weak point is formed by a local modification of the graphene layer stack sequence or
wherein a phase difference-introducing weak point is formed by a region normally conducting at room temperature or
wherein a phase difference-introducing weak point is formed by metal or
wherein a phase difference-introducing weak point is formed by non-superconducting graphite regions within the conductor (W) at temperatures higher than −195° C.

Feature 30.4

Electrical component and/or quantum interference component according to one or more of the features 30.0 to 30.3,
wherein a phase difference-introducing weak point is formed by a reduction of at least one cross-sectional dimension, in particular the width and/or thickness, of the conductor (W).

Feature 30.5

Electrical component and/or quantum interference component according to one or more of the features 30.0 to 30.4,
wherein a phase difference-introducing weak point ($TU_1$, $TU_2$) is covered with a control electrode ($G_1$, $G_2$) which is electrically insulated from the conductor (W).

Feature 30.6

Electrical component and/or quantum interference component according to one or more of the preceding features 30.0 to 30.5,
wherein a portion of a conductor branch (W1a, W1b) of the conductor (W) is covered with a control electrode ($G_1$), which is electrically insulated vs. the conductor (W).

Feature 30.7

Electrical component and/or quantum interference component according to one or more of the preceding features 30.0 to 30.6,
wherein the conductor (W) is manufactured on an at temperatures higher than −195° C. non-superconducting electrically conductive carrier ($Sub_1$) or an electrically semiconducting carrier ($Sub_1$) or an electrically insulating carrier ($Sub_1$),
wherein the surface of the carrier ($Sub_1$) might comprise in particular
graphite or
doped or undoped silicon or doped or non-doped III/V semiconductors or doped or non-doped II/VI semiconductors or doped or non-doped diamond or
SiN or $SiO_2$ or $Al_2O_3$ or a ceramic or polymers or carbon compounds or
Aluminum or chromium or tungsten or copper or iron or gold or platinum or other metals or compounds thereof.

Feature 30.8

Electrical component and/or quantum interference component according to feature 30.7,
wherein the conductor (W) is electrically insulated from the electrically normally conducting or semiconducting carrier ($Sub_1$)

Feature 31

Electrical circuit
wherein the electrical circuit comprises at least one electrical component and/or quantum interference component according to one of the preceding features.

Feature 32

Electrical circuit (FIG. 34) according to feature 31,
wherein it comprises an electrical component and/or quantum interference component according to feature 30.6, and
wherein the voltage (v1) between a conductor branch (W1b, W2b) of the conductor (W) and at least one control electrode ($G_1$) is controlled by a control voltage source (V1).

Electrical component and/or quantum interference component (FIG. 34) with a conductor (W, W1a, W1b) according to feature 30.0,
wherein the electrical component and/or quantum interference component has a sub-device, which has the function of a Cooper pair box (English: Cooper Pair Box) and
wherein the conductor (W) is subdivided into a first conductor section (W1a) and a second conductor section (W1b) by the at least one first phase difference-introducing weak point ($TU_1$) and
wherein the first conductor section (W1a) can be ohmically or capacitively or inductively electrically contacted by means of a first node (N1), and
wherein the second conductor section (W1b) can be contacted capacitively by means of a coupling capacitor ($C_g$) via a second node (N2),
so that the second conductor section (W1b) represents the Cooper pair box.

Feature 33

Electrical component and/or quantum interference component (FIG. 35) with a conductor (W, W1a, W1b, Wie) according to feature 30.0,
wherein the electrical component and/or quantum interference component has a sub-device, which has the function of a Cooper pair box (English: Cooper Pair Box), and
wherein the conductor (W) is divided into a first conductor section (W1a) and a second conductor section (W1b) and a third conductor section (W1c) by the first phase-difference-introducing weak point ($TU_1$) and a second phase-difference-introducing weak point ($TU_2$) and
wherein the first conductor section (W1a) can be ohmically or capacitively or inductively contacted electrically by means of a first node (N1), and
wherein the second conductor section (W1b) can be contacted capacitively by means of a coupling capacitor ($C_g$) via a second node (N2), and
wherein the third conductor section (W1c) can be ohmically or capacitively or inductively electrically contacted by means of a third node (N3), so that the second conductor section (W1b) represents the Cooper pair box.

Feature 34

Metamaterial
with a one or two-dimensional periodic arrangement of (n−1)*(m−1) quantum interference devices with (n−1) and (m−1) as positive integer numbers.

Feature 35.0

Metamaterial
with a two-dimensionally periodic arrangement of n"m metamaterial substructures ($MTS_{i,j}$) with n and m as positive integer numbers and $1<i\le n$ and $1<j\le m$,
wherein each of the metamaterial substructures ($MTS_{i,j}$), which is not at the edge of the metamaterial, together with the metamaterial substructures ($MTS_{(i+1),j}$, $MTS_{(i-1),j}$, $MTS_{i,(j+1)}$, $MTS_{i,(j-1)}$) represents at least one sub-device of a quantum interference component.

Feature 36.0

Metamaterial
with a two-dimensionally periodic arrangement of n*m metamaterial substructures ($MTS_{i,j}$) with n and m as positive integer numbers and $1<i\le n$ and $1<j\le m$,
wherein each of the metamaterial substructures ($MTS_{i,j}$) has at least one associated conductor ($W_{i,j}$), and
wherein said conductor ($W_{i,j}$) is at least partially made of a material having an electrical superconductor with a critical temperature ($T_c$) higher than −195° C. and/or higher than −100° C. and/or higher than −50° C. and/or higher than 360K and/or with a critical magnetic flux density ($B_k$) at e.g. 77K higher than 1 T and/or 50 T.

Feature 36.1

Metamaterial according to characteristic 36.0
wherein conductors ($W_{i,j}$) of metamaterial substructures ($MTS_{i,j}$) are connected ohmically, in particular by conductive or superconducting connections between the conductors ($W_{i,j}$, $W_{(i+1),j}$, $W_{(i-1),j}$, $W_{i,(j+1)}$, $W_{(i,j-1)}$), and/or inductively, through openings in the conductors ($W_{i,j}$, $W_{(i+1),j}$, $W_{(i-1),j}$, $W_{i,(j+1)}$, $W_{i,(j-1)}$), and/or capacitively, by coupling surfaces of the conductors ($W_{i,j}$, $W_{(i+1),j}$, $W_{(i-1),j}$, $W_{i,(j+1)}$, $W_{i,(j-1)}$), with conductors ($W_{(i+1),j}$, $W_{(i-1),j}$, $W_{i,(j+1)}$, $W_{i,(j-1)}$) of adjacent metamaterial substructures ($MTS_{(i+1),j}$, $MTS_{(i-1),j}$, $MTS_{i,(j+1)}$, $MTS_{i,(j-1)}$)

Feature 36.2

Metamaterial according to features 35.0 and/or 36.0 and/or 36.1
wherein conductors ($W_{i,j}$) of metamaterial substructures ($MTS_{i,j}$) are connected with conductors ($W_{(i+1),j}$, $W_{(i-1),j}$, $W_{i,(j+1)}$, $W_{i,(j-1)}$) of adjacent metamaterial substructures ($MTS_{(i+1),j}$, $MTS_{(i-1),j}$, $MTS_{i,(j+1)}$, $MTS_{i,(j-1)}$) via phase-shifting weak points ($TU_{l,j,j}$, $TU_{o,i,j}$, $TU_{o,i,(j-1)}$, $TU_{o,(i+1),j}$), in particular Josephson junctions.

Feature 37.0

Digital optical element for electromagnetic radiation
having at least one partial structure which is at least partially made of a material which is an electrical superconductor having a critical temperature ($T_c$) higher than −195° C. and/or higher than −100° C. and/or higher than −50° C. and/or higher than 360K and/or with a critical magnetic flux density ($B_k$) at e.g. 77K higher than 1 T and/or 50 T.

Feature 38.0

Electrical or optical or magnetic or electronic device with a sub-device comprising a first substrate ($G_{sub}$) comprising at least a first layer region ($G_{B1}$) and a second layer region ($G_{B2}$),
wherein the first layer region ($G_{B1}$) and the second layer region ($G_{B2}$) are arranged one above the other and have a common first interface ($G_{F1}$) between the first layer region ($G_{B1}$) and the second layer region ($G_{B2}$) and
wherein the first layer region ($G_{B1}$) consists of graphite with a first stacking sequence of at least 3 graphene layers, and
wherein the second layer region ($G_{B2}$) consists of graphite with a second stacking sequence of graphene layers, and
wherein the over all stacking sequence with the first stacking sequence of the first layer region ($G_{B1}$) and with the second stacking sequence of the second layer region ($G_{B2}$) and the common interface ($G_F$) together does not correspond to the first stacking sequence of the first layer region ($G_{B1}$)
wherein a portion of the over all stacking sequence, the border region ($G_G$), exhibits superconducting properties with a critical temperature ($T_c$) or a critical magnetic flux density (Bk) at e.g. 77K.

Feature 38.1

Electrical or optical or magnetic or electronic component according to characteristic 38.0
where the critical temperature ($T_c$) or the critical magnetic flux density ($B_k$) at e.g. 77K depends on the over all stacking sequence.

Feature 38.2

Electrical or optical or magnetic or electronic component according to feature 38.0 and/or 38.1
wherein the critical temperature ($T_c$) is higher than −195° C. and/or higher than −100° C. and/or higher than −50° C. and/or higher than 360K and/or
wherein the critical magnetic flux density ($B_k$) at e.g. 77K is higher than 1 T and/or 50 T.

Feature 38.3

An electrical or optical or magnetic or electronic device according to one or more of features 38.0 to 38.2
wherein the first interface ($G_{F1}$) has an orientation of its first surface normal ($n_{F1}$) parallel to the hexagonal symmetry axis (c) of the crystal lattice of the graphene layers of the first layer region ($G_{B1}$) and
wherein the first interface ($G_{F1}$) has an orientation of its first surface normal ($n_{F1}$) parallel to the hexagonal symmetry axis (d) of the crystal lattice of the graphene layers of the second layer region ($G_{B2}$).

Feature 38.4

Electrical or optical or magnetic or electronic device according to one or more of features 38.0 to 38.3
wherein the first substrate ($G_{sub}$) is structured so that the outer edge of the first interface ($G_{F1}$) in at least a portion of the first substrate ($G_{sub}$) has changed as a result of processing.

Feature 38.5

An electrical or optical or magnetic or electronic device according to one or more of features 38.0 to 38.5
wherein the first interface ($G_{F1}$) or a boundary region ($G_{FB}$) of which part is the first interface ($G_{F1}$) comprises at least one electrical contact (K), which is provided or suitable to electrically connect the first interface ($G_{F1}$) or the boundary region ($G_{FB}$), part of which is the first interface ($G_{F1}$), to an electrical conductor.

Feature 38.6

An electrical or optical or magnetic or electronic device according to one or more of the features 38.0 to 38.5
wherein the first interface ($G_{F1}$) or a boundary region ($G_{FB}$), of which the first interface ($G_{F1}$) is part, comprises at least one electrical contact (K), which is provided or adapted to electrically connect the first interface ($G_{F1}$) or the boundary region ($G_{FB}$), of which the first interface ($G_{F1}$) is part, to an electrical conductor.

Feature 38.7

An electrical or optical or magnetic or electronic device according to one or more of features 38.0 to 38.6
- wherein the first stacking sequence of the first layer region ($G_{B1}$) and/or the second stacking sequence of the second layer region ($G_{B2}$) is the stacking sequence of bernal graphite or the stacking sequence of rhombohedral graphite.

Feature 38.8

An electrical or optical or magnetic or electronic device according to one or more of features 38.0 to 38.7
- wherein the first stacking sequence of the first layer region ($G_{B1}$) is equal to the second stacking sequence of the second layer region ($G_{B2}$), but the second stacking sequence is offset from the first stacking sequence by a translational displacement vector along the first interface ($G_{F1}$) and/or is rotated with respect to the first stack sequence by a non-zero angle around a surface normal of the first interface ($G_{F1}$).

Feature 38.9

An electrical or optical or magnetic or electronic device according to one or more of features 38.0 to 38.8
- wherein the first stacking sequence of the first layer region ($G_{B1}$) is not equal to the second stacking sequence of the second layer region ($G_{B2}$)

Feature 38.10

Electrical or optical or magnetic or electronic component according to one or more of features 38.0 to 38.9
- having a sub-device, comprising a first substrate ($G_{sub}$) having at least a first layer region ($G_{B1}$) and a second layer region ($G_{B2}$) and additionally a third layer region ($G_{B3}$),
- wherein the second layer region ($G_{B2}$) and the third layer region ($G_{B3}$) are arranged one above the other and exhibit a common second interface ($G_F2$) between the second layer region ($G_{B2}$) and the third layer region ($G_{B3}$), and
- wherein the third layer region ($G_{B3}$) consists of graphite with a third stacking sequence of at least 3 graphene layers, and
- wherein the second layer region ($G_{B2}$) can also comprise only one graphene layer or only two graphene layers or at least three graphene layers, and
- wherein the second overall stacking sequence with the second stacking sequence of the second layer region ($G_{B2}$) and the third stacking sequence of the third layer region ($G_{B3}$) and the second interface ($G_F2$) together does not correspond to the second stacking sequence of the second layer region ($G_{B2}$)

Feature 38.11

An electrical or optical or magnetic or electronic device according to one or more of features 38.0 to 38.10
- wherein the second interface ($G_F2$) has an orientation of its second surface normal ($n_F2$) parallel to the hexagonal symmetry axis (c) of the crystal lattice of the graphene layers of the third layer region ($G_{B3}$) and
- wherein the second interface ($G_F2$) has an orientation of its surface normals ($n_{F2}$) parallel to the hexagonal symmetry axis (d) of the crystal lattice of the graphene layers of the second layer region ($G_{B2}$).

Feature 38.12

An electrical or optical or magnetic or electronic device according to one or more of features 38.0 to 38.11
- wherein the third stacking sequence of the third layer region ($G_{B3}$) is the stacking sequence of rhombohedral graphite or
- wherein the third stacking sequence of the third layer region ($G_{B3}$) is the stacking sequence of bernal graphite.

Feature 38.13

Electrical or optical or magnetic or electronic component according to one or more of features 38.0 to 38.12
- wherein the first stacking sequence of the first layer region ($G_{B1}$) is equal to the third stacking sequence of the third layer region ($G_{B3}$), but the stacking sequence is translationally offset from the first stacking sequence along the first interface ($G_{F1}$) and/or
- wherein the first stacking sequence of the first layer region ($G_{B1}$) is equal to the third stacking sequence of the third layer region ($G_{B3}$), but the third stacking sequence is rotated with respect to the first stacking sequence by a non-zero angle around the surface normal of the first interface ($G_{F1}$).

Feature 38.14

An electrical or optical or magnetic or electronic device according to one or more of features 38.0 to 38.13
- wherein the second stacking sequence of the second layer region ($G_{B2}$) is equal to the third stacking sequence of the third layer region ($G_{B3}$), but the third stacking sequence is translationally offset from the second stacking sequence along the second interface ($G_{F2}$) and/or
- wherein the second stacking sequence of the second layer region ($G_{B2}$) is equal to the third stacking sequence of the third layer region ($G_{B3}$), but the third stacking sequence is rotated relative to the second stacking sequence by a non-zero angle about the surface normal of the second interface ($G_F2$).

Feature 38.15

An electrical or optical or magnetic or electronic device according to one or more of features 38.0 to 38.13,
- wherein the third stacking sequence of the third layer region ($G_{B3}$) is not equal to the second stacking sequence of the second layer region ($G_{B2}$).

Feature 38.16

An electrical or optical or magnetic or electronic device according to one or more of features 38.0 to 38.15
- wherein the third stacking sequence of the third layer region ($G_{B3}$) is not equal to the first stacking sequence of the first layer region ($G_{B1}$).

Feature 38.17

An electrical or optical or magnetic or electronic device according to one or more of features 38.0 to 38.16
- wherein the first layer region ($G_{B1}$) arranged in the first stacking sequence ($G_{B1}$) comprises at least three and/or at least six and/or at least 10 and/or at least 20 and/or at least 50 and/or at least 100 graphene layers and/or
- wherein the second layer region ($G_{B2}$) arranged in the second stacking sequence ($G_{B2}$) comprises at least one graphene layer and/or at least two and/or three and/or at least six and/or at least 10 and/or at least 20 and/or at least 50 and/or at least 100 graphene layers.
- wherein the third layer region ($G_{B3}$), which is arranged in the third stacking sequence ($G_{B3}$), contains at least three and/or at least six and/or at least 10 and/or at least 20 and/or at least 50 and/or at least 100 graphene Includes layers.

Feature 38.18

An electrical or optical or magnetic or electronic device according to one or more of features 38.0 to 38.17
wherein at least one graphene layer of the first substrate ($G_{sub}$) is doped with impurity atoms, in particular oxygen atoms and/or hydrogen atoms.

Feature 38.19

An electrical or optical or magnetic or electronic device according to one or more of features 38.0 to 38.18
wherein at least one graphene layer of the first substrate ($G_{sub}$) is isotope-pure and/or
wherein at least one graphene layer of the first substrate ($G_{sub}$) comprises an at least 10% better 50%, better 100% different concentration of $C^{13}$ isotopes compared to living organic biological material of the earth's surface.

Feature 38.20

A method of transporting electrical charge carriers through a device according to one or more of the preceding features 38.0 to 38.19
Providing the device according to one or more of the preceding features 38.0 to 38.19;
Injecting of first charge carriers into the superconducting subregion and/or the boundary region ($G_{FB}$) at a first location and simultaneously extracting second charge carriers of the same polarity as the first charge carriers at a second location, which differs from the first location, except for the quantum mechanical uncertainty.

Feature 39.0

Electric machine, which may be a rotary machine, a linear motor, characterized in
that it has at least one sub-device, which is at least partially made of a material having an electrical superconductor with a critical temperature ($T_c$) higher than −195° C. and/or higher than −100° C. and/or higher than −50° C. and/or higher than 360K and/or with a critical magnetic flux density ($B_k$) at e.g. 77K higher than 1 T and/or 50 T.

Feature 39.1

Electric machine according to feature 39.0, characterized in
that the superconducting sub device ($G_{sub}$) is part of a rotor and/or a rotor (LF) and/or a stator of the machine.

Feature 39.2

Electric machine according to one or more of the preceding features 39.0 to 39.1
wherein the sub-device comprises a first substrate ($G_{sub}$) having at least two layer regions ($G_{B1}$, $G_{B2}$),
wherein the first layer region ($G_{B1}$) and the second layer region ($G_{B2}$) are arranged one above the other and have a common boundary region ($G_{FB}$) and
wherein the first layer region ($G_{B1}$) consists of graphite with Bernal crystal structure (graphite 2H) with at least 3 atom layers with a respective thickness of exactly one atom, and
wherein the second layer region ($G_{B2}$) consists of graphite with rhombohedral crystal structure (English rhombohedral, graphite-3R) and
wherein the boundary region ($G_{FB}$) has an orientation of its surface normal ($n_F$) parallel to the hexagonal axis of symmetry (c) of the crystal lattice of the first layer region ($G_{B1}$) and
wherein the boundary region ($G_{FB}$) has an orientation of its surface normal ($n_F$) parallel to the hexagonal symmetry axis (d) of the crystal lattice of the second layer region ($G_{B2}$) and wherein at least a portion of the boundary region ($G_{FB}$), the border region ($G_G$), has superconducting properties and wherein this subregion, the border region ($G_G$), has a critical temperature ($T_c$) higher than −195° C. and/or higher as −100° C. and/or higher than −50° C. and/or higher than 360K and/or a critical magnetic flux density ($B_k$) at e.g. 77K, which is higher than 1 T and/or 50 T.

Feature 39.3

Electric machine according to one or more of the preceding features 39.0 to 39.2, characterized in
that the electrical superconductor comprises carbon.

Feature 39.4

Electric machine according to one or more of the preceding features 39.0 to 39.3, characterized in
that the electrical superconductor comprises carbon in a rhombohedral crystal structure (graphite 3R).

Feature 39.5

Electric machine according to one or more of the preceding features 39.0 to 39.4, characterized in
that the electric superconductor has carbon in Bernal crystal structure (graphite 2H).

Feature 39.6

Electric machine according to one or more of the preceding features 39.0 to 39.5
wherein the dividing device comprises a first substrate ($G_{sub}$) comprising at least a first layer region ($G_{B1}$) and a second layer region ($G_{B2}$),
wherein the first layer region ($G_{B1}$) and the second layer region ($G_{B2}$) are arranged one above the other and have a common first interface ($G_{F1}$) between the first layer region ($G_{B1}$) and the second layer region ($G_{B2}$), and
wherein the first layer region ($G_{B1}$) consists of graphite with a first stacking sequence of at least 3 graphene layers, and
wherein the second layer region ($G_{B2}$) consists of graphite with a second stacking sequence of graphene layers, and
wherein the total stacking sequence with the first stacking sequence of the first layer region ($G_{B1}$) and the second stacking sequence of the second layer region ($G_{B2}$) and the common interface ($G_F$) together does not correspond to the first stacking sequence of the first layer region ($G_{B1}$)
wherein a portion of the overall stacking sequence, the border region ($G_G$), exhibits superconducting properties with a critical temperature ($T_c$) or a critical magnetic flux density ($B_k$) at e.g. 77K.

Feature 39.7

Electric machine according to characteristic 39.6
wherein the critical temperature ($T_c$) or the critical magnetic flux density ($B_k$) at e.g. 77K depends on the overall stacking sequence.

Feature 39.8

Electric machine according to one or more of the features 39.6 to 39.7
wherein the first stacking sequence of the first layer region ($G_{B1}$) and/or the second stacking sequence of the second layer region ($G_{B2}$) is the stacking sequence of bernal graphite or the stacking sequence of rhombohedral graphite.

Feature 39.9

Electric machine according to one or more of the features 39.0 to 39.5
wherein the subdevice comprises a first substrate ($G_{sub}$) comprising at least a first layer region ($G_{B1}$) and a second layer region ($G_{B2}$) and additionally a third layer region ($G_{B3}$), wherein the second layer region ($G_{B2}$) and the third layer region ($G_{B3}$) are arranged one above the other and have a common second interface ($G_{F2}$) between the second layer region ($G_{B2}$) and the third layer region ($G_{B3}$), and wherein the third layer region ($G_{B3}$) consists of graphite with a third stacking sequence of at least 3 graphene layers, and wherein the second layer region ($G_{B2}$) can also comprise only one graphene layer or only two graphene layers or at least three graphene layers, and wherein the second overall stacking sequence with the second stacking sequence of the second layer region ($G_{B2}$) and the third stacking sequence of the third layer region ($G_{B3}$) and the second interface ($G_{F2}$) together does not correspond to the second stacking sequence of the second layer region ($G_{B2}$).

Feature 39.10

Electric machine according to characteristic 39.9 wherein the third stacking sequence of the third layer region ($G_{B3}$) is the stacking sequence of rhombohedral graphite or wherein the third stacking sequence of the third layer region ($G_{B3}$) is the stacking sequence of bernal graphite.

Feature 39.11

Electric machine according to one or more of the preceding features 39.0 to 39.10 wherein the machine has a rotor (LF) and wherein the machine has a stator ($Sub_1$) and wherein the stator ($Sub_1$) and/or the rotor (LF) comprise a sub-device which is at least partially made of a material having an electrical superconductor with a critical temperature ($T_c$) higher than −195° C. and/or higher than −100° C. and/or higher than −50° C. and/or higher than 360K and/or with a critical magnetic flux density ($B_k$) at e.g. 77K higher than 1 T and/or 50 T and wherein the stator ($Sub_1$) and the rotor (LF) exert a force that is magnetic or electrostatic origin to each other by means of this sub-device.

Feature 39.12

Electrical machine, in particular according to one or more of the preceding features 39.0 to 39.11 where the machine has a rotor (LF) and where the machine has a stator ($Sub_1$) and the rotor (LF) being provided to interact mechanically with an electromagnetic wave outside of the electrical machine, which radiates into the electric machine or is emitted by it.

Glossary

Graphene

Graphite layer, benzene rings, etc. Graphene is the common name for a modification of carbon with a two-dimensional structure, in which each carbon atom is surrounded by three others at an angle of 120°, so that a honeycomb-shaped pattern is formed. Graphite is typically composed of graphene layers in rhombohedral or bernary stacking order.

Graphene Layer or Graphene Layer

For the purposes of this invention, a graphene layer has, at least at one point, at least one benzene ring, better the concatenation of at least two or more than two benzene rings. For a better understanding, here is an excerpt from Wikipedia: "Graphene is the term for a modification of the carbon with a two-dimensional structure in which each carbon atom is surrounded at an angle of 120° by three others, so that a honeycomb-shaped pattern is formed. Since carbon is tetravalent, two double bonds must exist for each "honeycomb", but they are not localized. It is a concatenation of benzene rings, as is often the case in aromatic compounds. Although a single benzene ring has three double bonds in the representation of the valence bar formula, contiguous benzene rings have in this representation formally only two double bonds per ring. Therefore, the structure can be better described by representing the delocalized bonds as a large circle in the benzene ring. The bonding conditions in graphene are described in the graphene structure. Graphene can be described as a polycyclic aromatic hydrocarbon. At the "edge" of the honeycomb lattice, other groups of atoms must be docked, but—depending on their size—hardly alter the properties of the graphene. In theory single-layer carbon layers, graphenes, were used to describe the structure and electronic properties of complex carbon materials for the first time. However, due to a rigorous mathematical theorem, the Mermin-Wagner theorem and its variants, infinitely extended and generally flat strictly two-dimensional structures are not possible because they are demonstrably thermodynamically unstable. Therefore, there was general astonishment among chemists and physicists when Konstantin Novoselov, Andre Geim and their coworkers in 2004 announced the appearance of free, single-layer graphene crystals. Their unexpected stability could be explained by the existence of metastable states or by the formation of an irregular crimping of the graphene layer. In 2010, Geim and Novoselov were awarded the Nobel Prize in Physics for their research, after having made a decisive contribution not only to the presentation of these systems, In essence, stacking such single-layer layers creates the three-dimensional structure of graphite, which is structurally closely related to graphene. On the other hand, if one imagines the single-layer layers rolled up, stretched carbon nanotubes are obtained. Likewise, some of the six-membered rings can be replaced by five-membered rings, whereby the flat surface bulges into a spherical surface and fullerenes result in certain numerical ratios. For example 12 out of 32 rings, the smallest fullerene (C60) is created."

For the graphene structure from Wikipedia: "All carbon atoms of graphene are sp2-hybridized, that is, each carbon atom can form three equivalent a bonds to other carbon atoms, resulting in a honeycomb structure also known from the layers of graphite The carbon-carbon bond lengths are all the same and are 142 pm ($142*10^{-12}$ m). The third unhybridized 2p orbitals are perpendicular to the graphene plane as well as in the graphite and form a delocalized π-bonding system. Graphene thus consists of two equivalent sublattices A and B, to which the carbon atoms are assigned (Note: the sublattices A and B mentioned here do not correspond to the graphene layers A, B, C of the figures and the above description). The sublattices are shifted by the bond length $a_b$ from each other. The diatomic unit cell is represented by the lattice vectors $a_1$ and $a_2$ clamped. These point to the next but one neighbors. The length of the vectors and thus the lattice constant a can be calculated as $$\alpha=|a_1|=|a_2|=\text{sqrt}(3)a_b \approx 2.46 \text{ Å}=246 \text{ pm}$$

Graphene can be understood on the one hand as a single crystal, on the other hand as a giant molecule. Likewise, smaller molecules such as benzene, hexabenzocoronene or naphthalene can be seen as a hydrogen-substituted graphene fragments." Thus, when in this application graphene layers are mentioned, it also includes graphene segments and graphene fragments.

Microstructure Technology/Microtechnology

The microtechnology (also microstructure technology) deals with processes that are used for the production of bodies and geometric structures with dimensions in the micrometer range (0.1-1000 µm). Structure sizes of less than 100 nanometers are indeed called nanotechnology. However, they are included in the terms of this disclosure by the terms microstructure technology and microtechnology.

Microelectronic Circuits

Microelectronic circuits in the sense of this disclosure are electrical circuits and devices that have been produced at least partially by microstructure/micro-technology/nanotechnology techniques.

Micromechanical Devices

Micromechanical devices in the sense of this disclosure are mechanical devices which have been produced at least partially by microstructure/microengineering/nanotechnology techniques.

Microoptical Devices

For the purposes of this disclosure, microoptical devices are optical devices which have been produced at least partially by microstructure/microengineering/nanotechnology techniques.

Microfluidic Devices

Microfluidic devices in the sense of this disclosure are in the broadest sense micromechanical devices which serve the transport, modification or other treatment of at least partially gaseous and/or at least partially liquid fluids and which have been produced at least partially by microstructure/microengineering/nanotechnology techniques.

Metamaterial

A metamaterial has a structure whose propagation-describing parameters for electric, magnetic, electromagnetic fields and waves as well as acoustic waves and plasma waves deviate from those normally found in nature. This is achieved by mostly periodic one-, two- and/or three-dimensional structures (cells, individual elements) of electrically or magnetically or electromagnetically or acoustically effective materials in their interior. Metamaterials can have a negative real part of the complex refractive index. In the transition from vacuum to such a metamaterial, waves can be broken beyond the perpendicular in the negative direction. Metamaterials can also have impurities that can be used for waveguiding.

The material used is at least partially a superconducting material in the sense of this invention as electrically or magnetically or electromagnetically or acoustically effective material.

In this sense a granular superconductor is considered to be a metamaterial,

A room temperature superconductor is a electrical conductor superconducting at room temperature (20° C.), wherein superconductivity can be detected, in particular, by any means described in the application.

LIST OF REFERENCES 1 step of providing a first substrate ($G_{sub}$) having at least two layer regions ($G_{B1}$, $G_{B2}$);
2 step of determining the orientation of the surface normals ($n_F$) of the graphene layers of the boundary region ($G_{FB}$) within the substrate ($G_{sub}$);
3 step of thinning out a "relevant" layer region ($G_{B1}$, $G_{B2}$) and creating a lower boundary surface (UGF) parallel to the graphene layers of the boundary region ($G_{FB}$);
4 step of applying the preferably thinned substrate ($G_{sub}$) to the surface (OF) of a carrier ($Sub_1$)
5 step of attaching the preferably thinned substrate ($G_{sub}$) to the surface (OF) of the carrier ($Sub_1$);
6 step of thinning the other layer region ($G_{B1}$, $G_{B2}$) which is not the relevant layer region;
7 step of providing a second substrate (SUB), for example in the form of a microelectronic circuit;
8 step of patterning the first substrate ($G_{sub}$);
9 Depositing at least one electrically conductive layer on the first substrate ($G_{sub}$) or on the second substrate (SUB), for example to produce the contacts;
10 structuring of the at least one electrically conductive layer;
11 step of applying at least one electrically insulating layer to the first substrate ($G_{sub}$) or second substrate (SUB) or the carrier ($Sub_1$) or to an electrically, in particular normal, conductive layer;
12 step of structuring the at least one insulating layer eg for opening the contacts or vias;
13 step of providing (13) the contacts to the graphene layers of the boundary region ($G_{FB}$);
A graphene layer with positioning A;
B graphene layer with positioning B;
$B_1$ first magnetic flux;
$B_2$ second magnetic flux;
$B_f$ magnetic flux density;
BE micromechanical bar (in FIGS. 35 and 36, a free-floating plate);
$B_k$ critical magnetic flux density;
c Sixfold symmetry axis of the hexagonal unit cell of the graphite 2H structure
C graphene layer with positioning C;
C1 first capacitor;
C2 second capacitor;
$C_g$ coupling capacitor;
CMP chemical-mechanical polishing;
CPB Cooper Couple Box;
CAV cavity;
d hexagonal symmetry axis (d) of the crystal lattice of the second layer region ($G_{B2}$);
$d_L$ distance between a first conductor line and a second conductor line of the proposed material, which influence each other inductively and/or capacitively;
DLC diamond like carbon (diamond-like layers);
E1 first incoupling or outcoupling point;
E2 second incoupling or output point;
ELS electrically conductive layer;
$G_A$ first graphene layer;
$G_{B1}$ first subset of graphene layers or first layer region in a first stacking sequence of graphene layers, preferably of graphite with bernal crystal structure (graphite 2H), less preferably of graphite with rhombohedral crystal structure (English rhombohedral, graphite 3R) having at least 3 atomic layers (graphene layers) each having a thickness of one atom per atomic layer. The first layer region is also referred to only briefly as the first layer;
$G_{B2}$ second subset of graphene layers or second layer region in a second stacking sequence of graphene layers, preferably of graphite with rhombohedral crystal structure (English rhombohedral, graphite-3R) less preferably of graphite with bernal crystal structure (English bernal graphite 2H) having at least 3 atomic layers (graphene layers) each having a thickness of one atom per atomic layer. The second layer region is also referred to only briefly as the second layer;
$G_{B3}$ third subset of graphene layers or third layer region in a third stacking sequence of graphene layers, preferably of graphite with bernal crystal structure (graphite 2H) with at least 3 atom layers (graphene layers) with a respective thickness of exactly one atom per atomic layer. The third layer area is also referred to only briefly as the third layer;

$G_{FB}$ Boundary region of one or more graphene layers in a more general sense;

$G_{FB1}$ first boundary region of one or more graphene layers in the more general sense;

$G_{FB2}$ second boundary region of one or more graphene layers in a more general sense;

$G_F$ boundary area and in particular interface between the first layer region ($G_{B1}$) and the second layer region ($G_{B2}$);

$G_{F1}$ first border region and in particular first interface between the first layer region ($G_{B1}$) and second layer region ($G_{B2}$);

$G_{F2}$ second border area and in particular second interface between the second layer region ($G_{B2}$) and the third layer region ($G_{B3}$);

$G_G$ the superconducting border region ($G_G$) within the boundary region ($G_{FB}$);

GL adhesive for bonding the superconductive layer package to the carrier ($Sub_1$);

GND1 first ground plane;

GND2 second ground plane;

Gs graphite substrate;

$G_{sub}$ substrate ($G_{sub}$) comprising at least two layer regions ($G_{B1}$, $G_{B2}$) and at least one interface ($G_F$ or $G_{F1}$);

HL Hall structure. Here it is an exemplary Hall structure in cross section;

$I_{e-}$ electron current;

$I_{p+}$ hole current;

IS electrically insulating layer;

K contact;

K1 first contact;

K2 second contact;

K3 third contact;

K4 fourth contact;

KD1 first contact doping;

KD2 second contact doping;

L1 first conductor line. The first conductor line is preferably produced by means of photolithographic etching processes from a first metallization layer in the course of the production process. The first metallization is deposited on the first insulator layer (OX1). In the area of the contacts (K1, K2), the first metallization is applied directly to the semiconductor substrate of the carrier ($Sub_1$);

L2 second conductor line. The second conductor line is preferably processed by means of photolithographic etching processes from a first metallization layer in the course of the production process. The first metallization layer is deposited on the first insulator layer (OX1). In the area of the contacts (K1, K2), the first metallization is applied directly to the semiconductor substrate of the carrier ($Sub_1$);

L3 third conductor line. The third conductor line is preferably produced by means of photolithographic etching processes from a second metallization layer in the course of the production process. The second metallization layer is deposited on the second insulator layer (OX2). In the area of the contacts (K1, K2) it is preferred, but not necessarily, for the second metallization to be applied directly to the first metallization;

LF micromechanical rotor (LF) of the proposed micromechanical machine;

Li1 first inductivity;

Li2 second inductivity;

M metallization;

MFM Magnetic Force Microscope;

ML center conductor;

$MTS_{i,j,k}$ metamaterial substructure in the i-th column and j-th row and k-th layer of the exemplary three-dimensional metamaterial;

$MTS_{i,j}$ metamaterial substructure in the i-th column and j-th row of the two-dimensional exemplary metamaterial;

$MTS_{i+1,j}$ metamaterial substructure in the (i+1)-th column and j-th row of the two-dimensional exemplary metamaterial;

$MTS_{i-1,j}$ metamaterial substructure in the (i-1)-th column and j-th row of the two-dimensional exemplary metamaterial;

$MTS_{i+1,j+1}$ metamaterial substructure in the (i+1)-th column and (j+1)-th row of the two-dimensional exemplary metamaterial;

$MTS_{i-1,j+1}$ Metamaterial substructure in the (i-1)-th column and (j+1l)-th row of the two-dimensional exemplary metamaterials;

$MTS_{i+1,j-1}$ Metamaterial substructure in the (i+1l)-th column and (j-1)-th row of the two-dimensional exemplary metamaterials;

$MTS_{i-1,j-1}$ metamaterial substructure in the (i-1)-th column and (j-1)-th row of the two-dimensional exemplary metamaterial;

$MTS_{i,j+1}$ metamaterial substructure in the i-th column and (j+1)-th row of the two-dimensional exemplary metamaterial;

$MTS_{i,j-1}$ metamaterial substructure in the i-th column and (j-1)-th row of the two-dimensional exemplary metamaterial;

N1 first node;

N2 second node;

N3 third node;

$n_F$ surface normal of the surface (OF);

$n_{F1}$ first surface normal of the first interface ($G_{F1}$);

$n_{F2}$ second surface normal of the second interface ($G_{F2}$);

NMR nuclear magnetic resonance;

OF surface of the carrier ($Sub_1$);

OA optically active layer (eg, layer exhibiting electro-optic effect, for example, Kerr effect);

OF surface of the carrier ($Sub_1$). If a Hall element is to be realized, it is preferred if the carrier is made of semiconducting material. The carrier may also include an integrated circuit;

OGF upper interface (OGF) of the substrate ($G_{sub}$) parallel to the graphene layers of the boundary region ($G_{FB}$) after preferential thinning;

OX insulator, typically $SiO_2$ or silicon nitrite or silicon nitride. Other insulators, such as polyimide are conceivable;

OX1 first insulator layer, typically $SiO_2$ or silicon nitride or silicon nitride. Other insulators, such as polyimide are conceivable. Particularly preferred is the use of a gate oxide as the first insulator layer;

OX2 second insulator layer, typically $SiO_2$ or silicon nitride or silicon nitride. Other insulators, such as polyimide are conceivable.

OX3 third insulator layer, typically $SiO_2$ or silicon nitride or silicon nitride. Other insulators, such as polyimide are conceivable;

PLY polycrystalline silicon layer. In the example of FIG. 17, the polycrystalline silicon layer must be selected from its material so as to be selectively etchable with respect to the second insulator layer (OX2) and the third insulator layer (OX3);

$S_1$ first spring;

$S_2$ second spring;

SC space charge zone with increased electron density (dashed line);

Sub1 carrier;

SUB second substrate, which may be a microelectronic circuit, for example. The second substrate (SUB) may be identical to the carrier ($Sub_1$);

T temperature;

$T_a$ working temperature;

$T_c$ critical temperature;

TSV through silicon via;

$TU_1$ first phase-shifting weak point, typically a Josephson junction;

$TU_2$ second phase-shifting weak point, typically a Josephson junction;

$TU_{l,i,j}$ left phase shift introducing weak point for establishing connection between the conductor ($W_{i,j}$) of the metamaterial substructure ($MTS_{i,j}$) in the i-th column and the j-th row of the metamaterial and the conductor ($W_{i-1,j}$) of the metamaterial substructure ($MTS_{i-1,j}$) in the (i−1)-th column and the j-th row of the metamaterial, typically a Josephson junction;

$TU_{l,i,j-1}$ left phase shift introducing weak point for establishing connection between the conductor ($W_{i,j-1}$) of the metamaterial substructure ($MTS_{i,j-1}$) in the i th column and the (j−1)-th line of the metamaterial and the conductor ($W_{i,j}$) the metamaterial substructure ($MTS_{i,j}$) in the i-th column and the j-th row of the metamaterial, typically a Josephson junction;

$TU_{o,i,j}$ upper phase shift introducing weak point for establishing a connection between the conductor ($W_{i,j}$) of the meta-material substructure ($MTS_{i,j}$) in the i-th column and the j-th row of the metamaterial and the conductor ($W_{i,j-1}$) of the meta-material substructure ($MTS_{i,j-1}$) in the i-th column and the (j−1)-th row of the metamaterial, typically a Josephson junction;

$TU_{o,i+1,j}$ upper phase shift introducing weak point for establishing a connection between the conductor ($W_{i+1,j}$) of the metamaterial substructure ($MTS_{i+1,j}$) in the (i+1)-th column and the j-th row of the Metamaterial and the conductor ($W_{i,j}$) of the metamaterial substructure ($MTS_{i,j}$) in the i-th column and the j-th row of the metamaterial, typically a Josephson junction;

UGF lower surface of the substrate ($G_{sub}$) parallel to the graphene layers of the boundary region ($G_{FB}$); created by thinning;

$v_g$ control voltage;

$V_g$ control voltage source;

W conductor consisting of the described graphene layer packet;

W1 first branch of the conductor (W);

W1a first conductor line section of the first branch of the conductor (W);

W1b second conductor line section of the first branch of the conductor (W);

W1c third conductor line section of the first branch of the conductor (W);

W2 second branch of the conductor (W);

W2a first conductor line section of the second branch (W2) of the conductor (W);

W2b second conductor line section of the second branch (W2) of the conductor (W);

$W_{i,j}$ conductor of the metamaterial substructure ($MTS_{i,j}$) in the i-th column and the j-th row of the metamaterial;

$W_{i+1,j}$ conductor of the metamaterial substructure ($MTS_{i+1,j}$) in the (i+1)-th column and the j-th row of the metamaterial;

$W_{i-1,j}$ conductor of the metamaterial substructure ($MTS_{i-1,j}$) in the (i−1)-th column and the j-th row of the metamaterial;

$W_{i+1,j+1}$ conductor of the metamaterial substructure ($MTS_{i+1,j+1}$) in the (i+1)-th column and the (j+1)-th row of the metamaterial;

$W_{i-1,j+1}$ conductor of the metamaterial substructure ($MTS_{i-1,j+1}$) in the (i−1)-th column and the (j+1)-th row of the metamaterial;

$W_{i+1,j-1}$ conductor of the metamaterial substructure ($MTS_{i+1,j-1}$) in the (i+1)-th column and the (j−1)-th row of the metamaterial;

$W_{i-1,j-1}$ conductor of the metamaterial substructure ($MTS_{i-1,j-1}$) in the (i−1)-th column and the (j−1)-th row of the metamaterial;

$W_{i,j+1}$ conductor of the metamaterial substructure ($MTS_{i,j+1}$) in the i-th column and the (j+1)-th row of the metamaterial;

$W_{i,j-1}$ conductor of the metamaterial substructure ($MTS_{i,j-1}$) in the i-th column and the (j−1)-th row of the metamaterial.

The invention claimed is:

1. A system comprising:
   a substrate ($G_{sub}$) comprising:
      at least a first layer ($G_{B1}$) and a second layer ($G_{B2}$),
      wherein the first layer ($G_{B1}$) and the second layer ($G_{B2}$) are positioned one above another and comprise a common boundary region ($G_{FB}$) extending from the first layer ($G_{B1}$) to the second layer ($G_{B2}$),
      wherein the first layer ($G_{B1}$) comprises graphite with Bernal-crystal structure, and
      wherein said second layer ($G_{B2}$) comprises graphite having rhombohedral-driven crystal structure, and
      wherein the substrate ($G_{sub}$) includes at least one conducting region and
      wherein the conducting region has a property wherein:
         an inductively induced electric current in the conducting region of the substrate ($G_{sub}$) remains constant over a period of at least one day after a source for inducing the electric current is removed when the substrate is maintained at a substrate temperature below a critical temperature; and
         the inductively induced electric current stops when the substrate is raised above the critical temperature;
   wherein the system further comprises at least one of:
      an ohmic contact electrically coupled to the conducting region,
      a coil inductively coupled with the conducting region,
      an electrode capacitively coupled to the conducting region, and
      an optical element, electro-magnetically coupled with the conducting region,
   and
   wherein the conducting region is coupled to an electric and/or magnetic and/or electromagnetic signal with a frequency greater than or equal 0 Hertz.

2. The system of claim 1, wherein the critical temperature is higher than −100° C.

3. A device comprising:
   a substrate ($G_{sub}$) including at least a first layer ($G_{B1}$) and a second layer ($G_{B2}$),
      wherein the first layer ($G_{B1}$) and the second layer ($G_{B2}$) are positioned one above another and comprise a common boundary region ($G_{FB}$) between the first layer ($G_{B1}$) to the second layer ($G_{B2}$) and wherein the first layer ($G_{B1}$) comprises graphite with a Bernal-crystal structure, wherein the second layer ($G_{B2}$) comprises graphite having a rhombohedral crystal structure, wherein the substrate includes a conducting region having a property wherein:

an inductively induced electric current in the conducting region of the substrate ($G_{sub}$) remains constant over a period of at least one day when the substrate is maintained at a substrate temperature below a critical temperature; and the electric current stops when the substrate is raised above the critical temperature; and wherein the critical temperature is greater than or equal to −195° C.; and wherein the conducting region is coupled to an electric and/or a magnetic and/or an electromagnetic signal with a frequency greater than or equal to 0 Hertz.

4. The device of claim 3, wherein the Bernal-crystal structure is a graphite 2H structure.

5. The device of claim 3, wherein the rhombohedral crystal structure is an English-rhombohedral, graphite 3R structure.

6. The device of claim 3, wherein the critical temperature is higher than −100° C.

7. The device of claim 3, wherein the critical temperature is higher than 360K.

8. The device of claim 3, wherein the electric current is constant over a period of at least two weeks.

9. The device of claim 3, wherein the conducting region is within the boundary region ($G_{FB}$).

10. The device of claim 3, wherein the critical temperature decreases with increasing current density.

11. The device of claim 3, wherein the induced electric current stops when a magnetic field flux increases above a magnetic field flux threshold.

12. The device of claim 11, wherein the magnetic field flux threshold is 20 Tesla.

13. The device of claim 3, wherein:

the first substrate ($G_{sub}$) comprises a plurality of first layers ($G_{B1}$) comprising graphite with the Bernal-crystal structure and/or a plurality of second layers ($G_{B2}$) comprising graphite having the rhombohedral crystal structure and the first substrate comprises a plurality of boundary regions ($G_{FB}$).

14. The device of claim 3, wherein:

the first layer ($G_{B1}$) runs substantially parallel to the second layer ($G_{B2}$) and/or base vectors of first graphene layers of the first layer ($G_{B1}$) relative to base vectors of second graphene layers of the second layer ($G_{B2}$) are rotated around a surface normal of the second graphene layers.

15. The device according to claim 3, further comprising:

an ohmic contact electrically connected to the conducting region ($G_G$) and/or a coil inductively coupled with the conducting region ($G_G$) and/or an electrode capacitively coupled to the conducting region ($G_G$) and/or an optical element, electro-magnetically coupled with the conducting region ($G_G$).

16. The device according to claim 3, further comprising:

at least one conductor including at least a portion of the conducting region ($G_G$), wherein a first phase-difference-introducing vulnerability is inserted into the at least one conductor.

17. The device according to claim 16, wherein:

the at least one conductor is divided into a first conductor branch and a second conductor branch and the first conductor branch and the second conductor branch form an area with an opening between the first conductor branch and the second conductor branch at least in part.

* * * * *